(12) United States Patent
Watanabe

(10) Patent No.: US 11,289,571 B2
(45) Date of Patent: Mar. 29, 2022

(54) SEMICONDUCTOR APPARATUS FOR REDUCING PARASITIC CAPACITANCE

(71) Applicant: ROHM CO., LTD., Kyoto (JP)

(72) Inventor: Keishi Watanabe, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 1 day.

(21) Appl. No.: 16/922,109

(22) Filed: Jul. 7, 2020

(65) Prior Publication Data
US 2021/0098572 A1    Apr. 1, 2021

(30) Foreign Application Priority Data

Sep. 30, 2019   (JP) .............................. JP2019-180821

(51) Int. Cl.
*H01L 29/06* (2006.01)
*H01L 23/00* (2006.01)
(Continued)

(52) U.S. Cl.
CPC .......... *H01L 29/0649* (2013.01); *H01L 24/05* (2013.01); *H01L 27/0814* (2013.01); *H01L 29/0607* (2013.01); *H01L 29/866* (2013.01)

(58) Field of Classification Search
CPC ............. H01L 27/0814; H01L 27/0255; H01L 29/0649; H01L 29/407; H01L 29/66825; H01L 29/788–7889; H01L 29/7813; H01L 29/7825; H01L 29/66613–66628; H01L 29/42336; H01L 29/42352; H01L 29/4236; H01L 29/66106; H01L 29/7808; H01L 29/7821; H01L 29/866; H01L 2924/12035; H01L 29/0607; H01L 27/0788; H01L 29/861; H01L 29/6609; H01L 29/66174; H01L 29/66189; H01L 29/93; H01L 27/0805; H01L 27/0676–0682; H01L 2924/12032; H01L 29/66143; H01L 29/66212; H01L 29/872–8725; H01L 27/0766; H01L 51/0579;
(Continued)

(56) References Cited

U.S. PATENT DOCUMENTS

2008/0042208 A1 * 2/2008 Hshieh ................ H01L 29/7811
257/360
2020/0051968 A1 * 2/2020 Willemen ............. H01L 29/408

FOREIGN PATENT DOCUMENTS

JP          2012-004350 A          1/2012

* cited by examiner

*Primary Examiner* — Sonya McCall-Shepard
(74) *Attorney, Agent, or Firm* — Rabin & Berdo, P.C.

(57) ABSTRACT

The present invention provides a diode chip, including: a semiconductor chip, including a p-type first semiconductor layer and an n-type second semiconductor layer formed on the first semiconductor layer; a first pad separation trench, formed on the semiconductor chip in a manner of penetrating the second semiconductor layer till reaching the first semiconductor layer, and forming a first internal parasitic capacitance between the first semiconductor layer and the second semiconductor layer by separating a portion of the semiconductor chip from other regions; an inter-insulation layer, covering the second semiconductor layer; and a first electrode layer, being opposite to the region separated by the first pad separation trench with the inter-insulation layer interposed in between, and forming, between the first electrode layer and the semiconductor chip, a first external parasitic capacitance connected in series to the first internal parasitic capacitance.

22 Claims, 47 Drawing Sheets

(51) Int. Cl.
*H01L 27/08* (2006.01)
*H01L 29/866* (2006.01)
*H01L 27/02* (2006.01)
*H01L 27/07* (2006.01)
*H01L 29/40* (2006.01)
*H01L 29/861* (2006.01)
*H01L 29/66* (2006.01)
*H01L 29/868* (2006.01)

(58) Field of Classification Search
CPC ..... H01L 2924/12036; H01L 29/66136; H01L 2924/12031; H01L 29/868
See application file for complete search history.

SEMICONDUCTOR APPARATUS FOR REDUCING PARASITIC CAPACITANCE

BACKGROUND OF THE INVENTION

Field of the Invention

The present invention relates to a semiconductor apparatus.

Description of the Prior Art

Patent document 1 discloses a semiconductor apparatus including a semiconductor substrate and a TVS (transient voltage suppressor) circuit formed in the semiconductor substrate. The TVS circuit has a plurality of diodes including a Zener diode.

PRIOR ART DOCUMENT

Patent Publication

[Patent document 1] Japan Patent Publication No. 2012-4350

SUMMARY OF THE INVENTION

Problems to be Solved by the Invention

A semiconductor apparatus achieving outstanding electrical characteristics is provided according to an embodiment of the present invention.

Technical Means for Solving the Problem

A semiconductor apparatus is provided according to an embodiment of the present invention. The semiconductor apparatus includes: a semiconductor chip, including a first conductive-type first semiconductor layer, and a second conductive-type second semiconductor layer formed on the first semiconductor layer; a separation trench, formed on the semiconductor chip in a manner of penetrating the second semiconductor layer till reaching the first semiconductor layer, and forming an internal parasitic capacitance between the first semiconductor layer and the second semiconductor layer by separating a portion of the semiconductor chip from other regions; an inter-insulation layer, covering the second semiconductor layer; and an electrode, being opposite to the region separated by the separation trench with the inter-insulation layer interposed in between, and forming, between the electrode and the semiconductor chip, an external parasitic capacitance connected in series to the internal parasitic capacitance.

The foregoing semiconductor apparatus is capable of reducing parasitic capacitances induced by the electrode by a series circuit including the internal parasitic capacitance and the external parasitic capacitance. Thus, a semiconductor apparatus achieving outstanding electrical characteristics may be provided.

A semiconductor apparatus is provided according to an embodiment of the present invention. The semiconductor apparatus includes: a semiconductor chip, including a first conductive-type first semiconductor layer, and a second conductive-type second semiconductor layer formed on the first semiconductor layer, and including a first pad region and a second pad region separated from each other; a first pad separation trench, formed in the first pad region in a manner of penetrating the second semiconductor layer till reaching the first semiconductor layer, and forming a first internal parasitic capacitance between the first semiconductor layer and the second semiconductor layer by separating a portion of the first pad region from other regions; a second pad separation trench, formed in the second pad region in a manner of penetrating the second semiconductor layer till reaching the first semiconductor layer, and forming a second internal parasitic capacitance between the first semiconductor layer and the second semiconductor layer by separating a portion of the second pad region from other regions; an inter-insulation layer, covering the second semiconductor layer; a first electrode, including a first pad portion, the first pad portion being opposite to the region separated by the first pad separation trench with the inter-insulation layer interposed in between, and the first pad portion forming, between the first pad portion and the semiconductor chip, a first external parasitic capacitance connected in series to the first internal parasitic capacitance; and a second electrode, including a second pad portion, the second pad portion being opposite to the region separated by the second pad separation trench with the inter-insulation layer interposed in between, and the second pad portion forming, between the second pad portion and the semiconductor chip, a second external parasitic capacitance connected in series to the second internal parasitic capacitance.

The foregoing semiconductor apparatus is capable of reducing parasitic capacitances induced by the first electrode by a series circuit including the first internal parasitic capacitance and the first external parasitic capacitance. Furthermore, the parasitic capacitance induced by the second electrode may be reduced by a series circuit including the second internal parasitic capacitance and the second external parasitic capacitance. Thus, a semiconductor apparatus achieving outstanding electrical characteristics may be provided.

BRIEF DESCRIPTION OF THE DRAWINGS

FIG. 28O is a cross-sectional diagram of a step after FIG. 28N;

DETAILED DESCRIPTION OF THE EMBODIMENTS

Details of the present invention are given by way of preferred embodiments with the accompanying drawings below.

Figure 1:
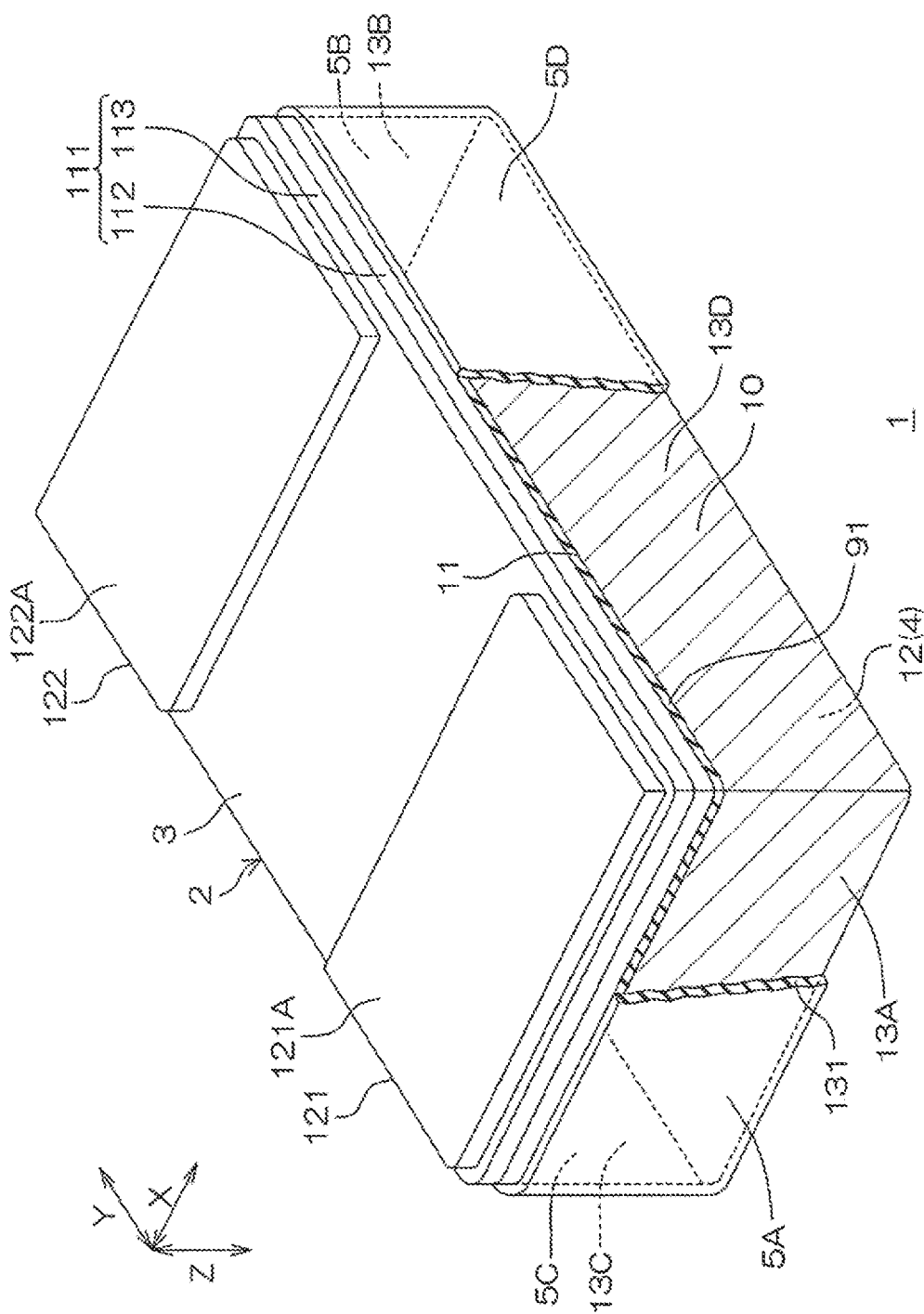
FIG. 1 is a perspective diagram of a section of a diode chip according to a first embodiment of the present invention.
Figure 2:
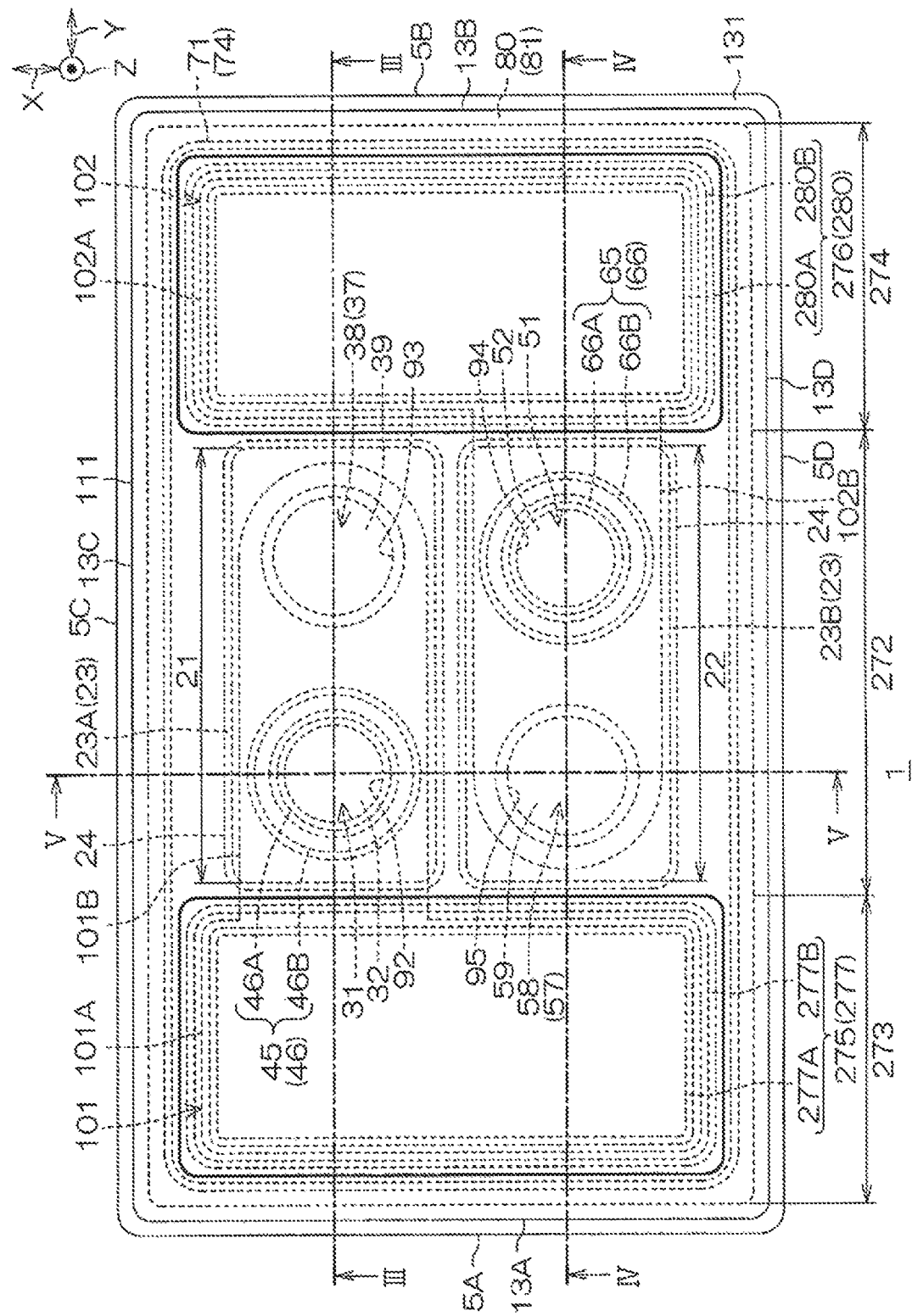
FIG. 2 is a top view of the diode chip in FIG. 1.
Figure 3:
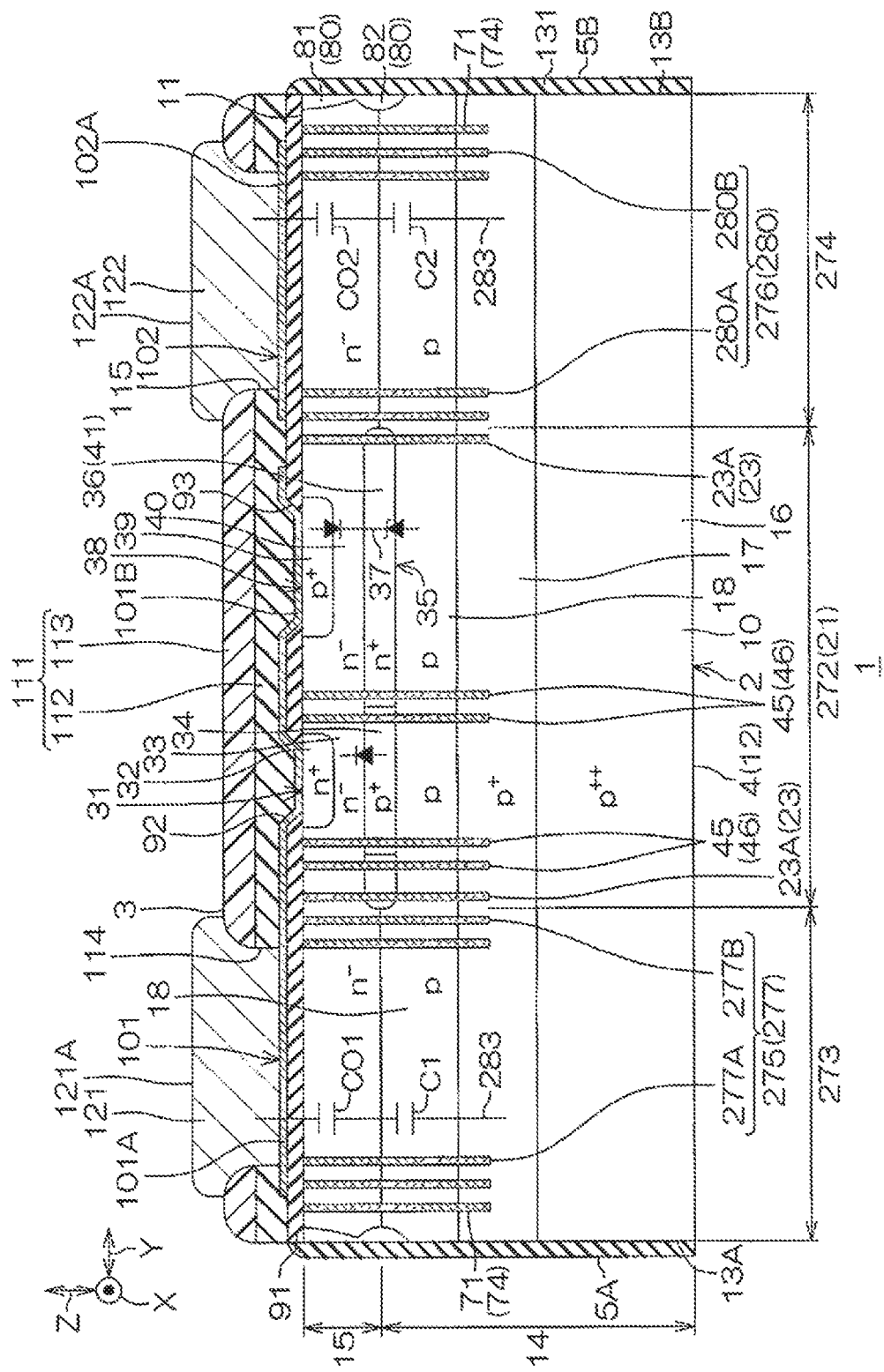
FIG. 3 is a cross-sectional diagram taken along line III-III in FIG. 2.
Figure 4:
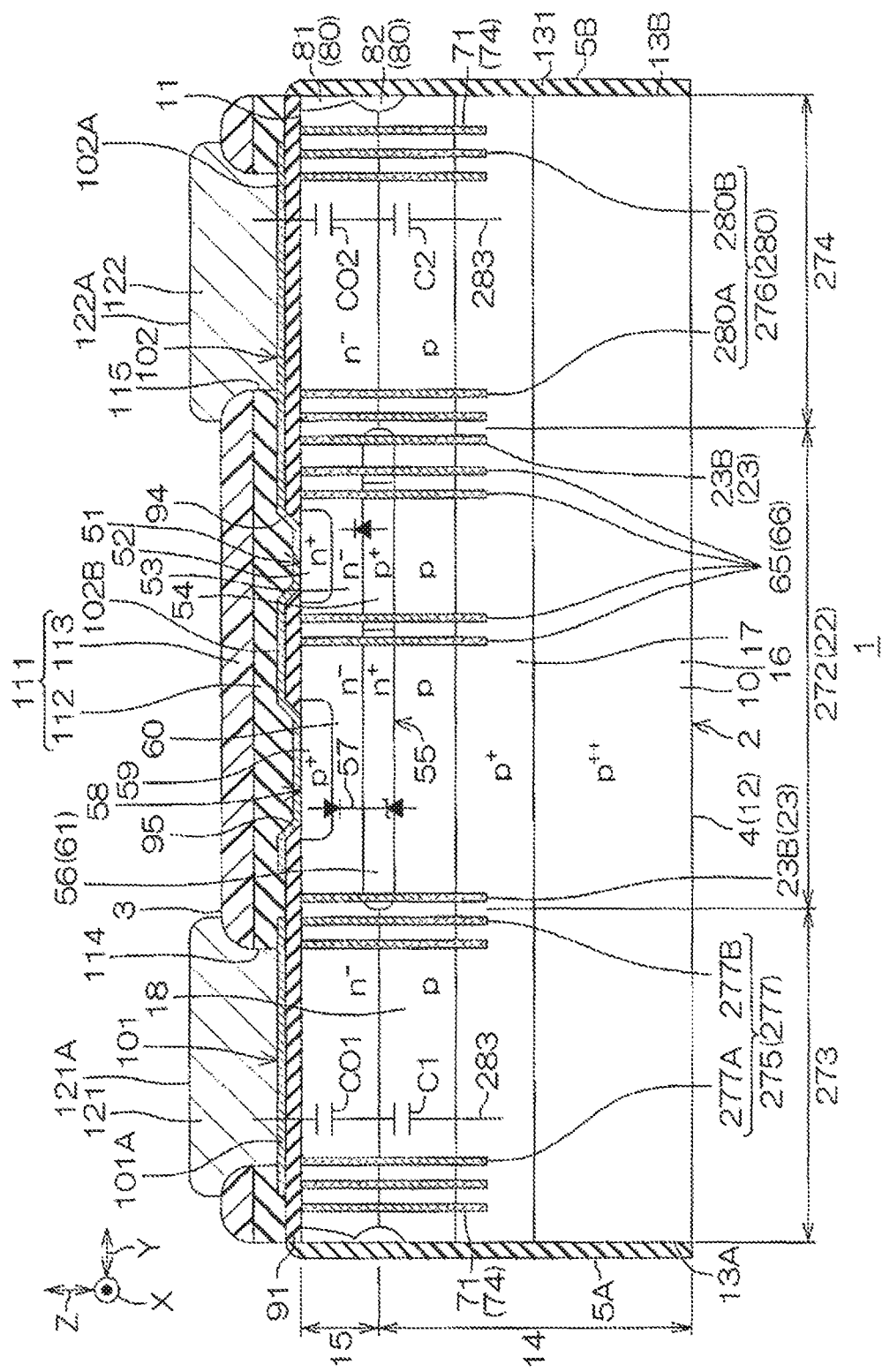
FIG. 4 is a cross-sectional diagram taken along line IV-IV in FIG. 2.
Figure 5:
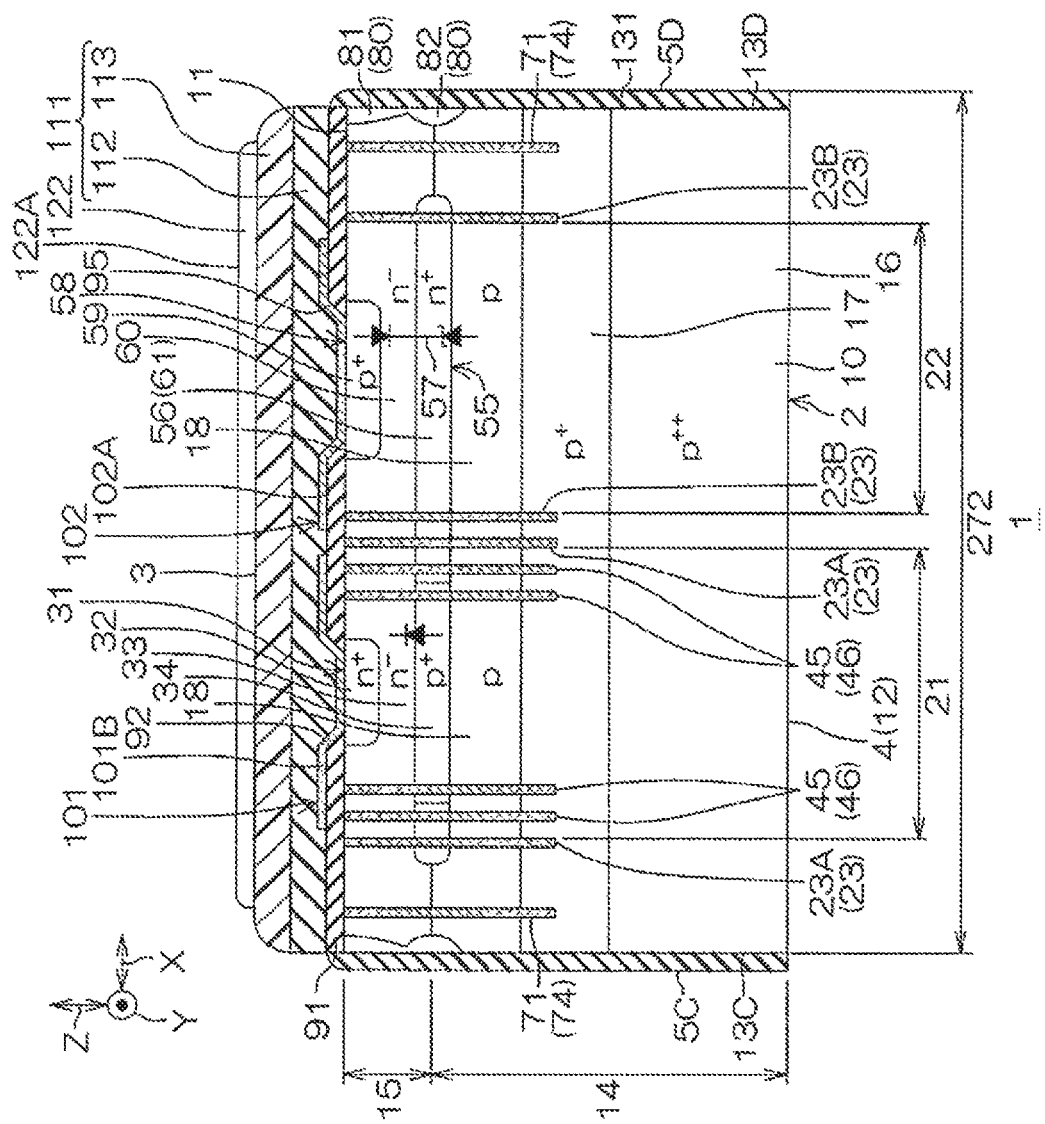
FIG. 5 is a cross-sectional diagram taken along line V-V in FIG. 2.
Figure 6:
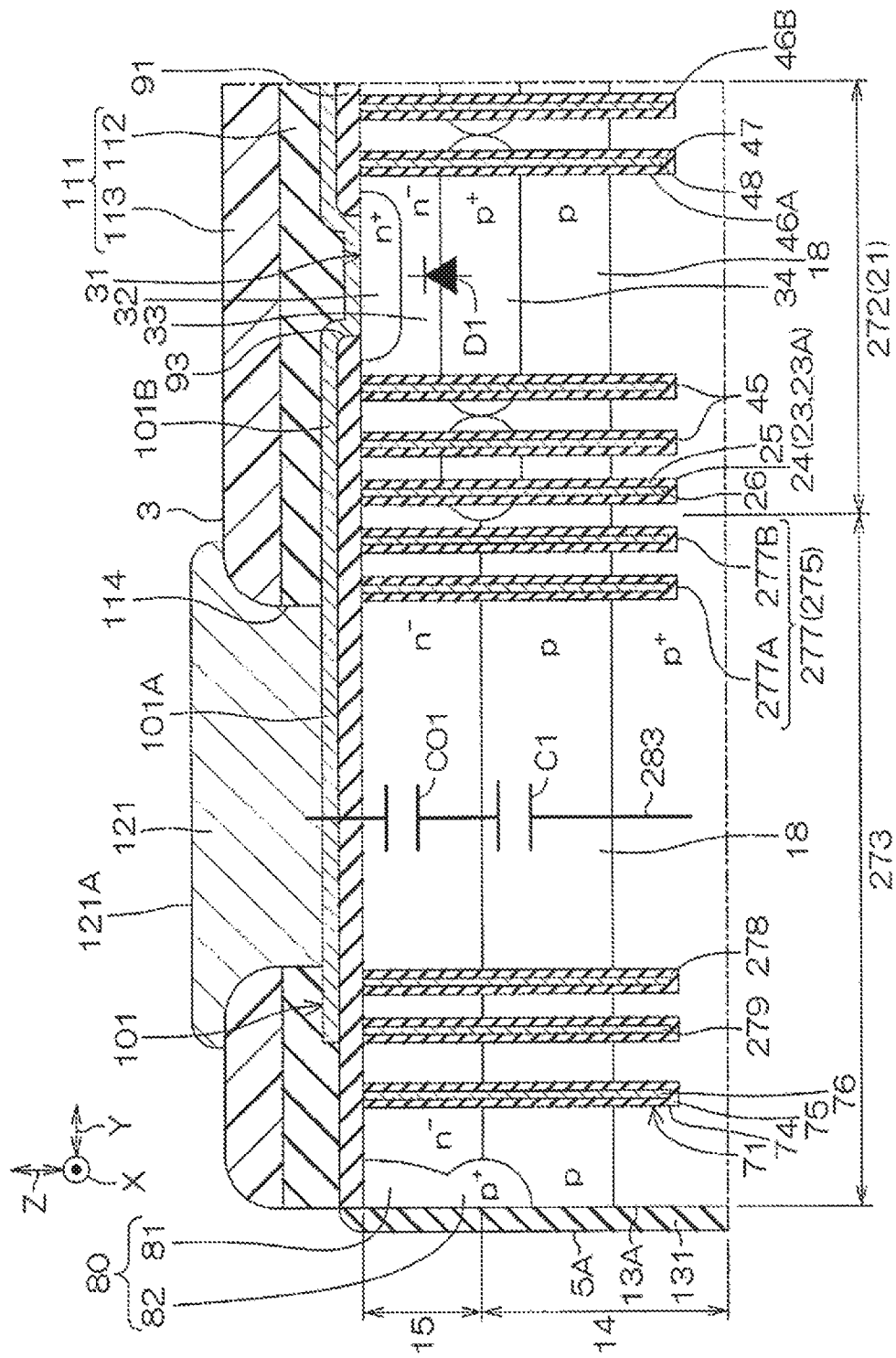
FIG. 6 is an enlarged cross-sectional diagram of a first pad region shown in FIG. 3.
Figure 7:
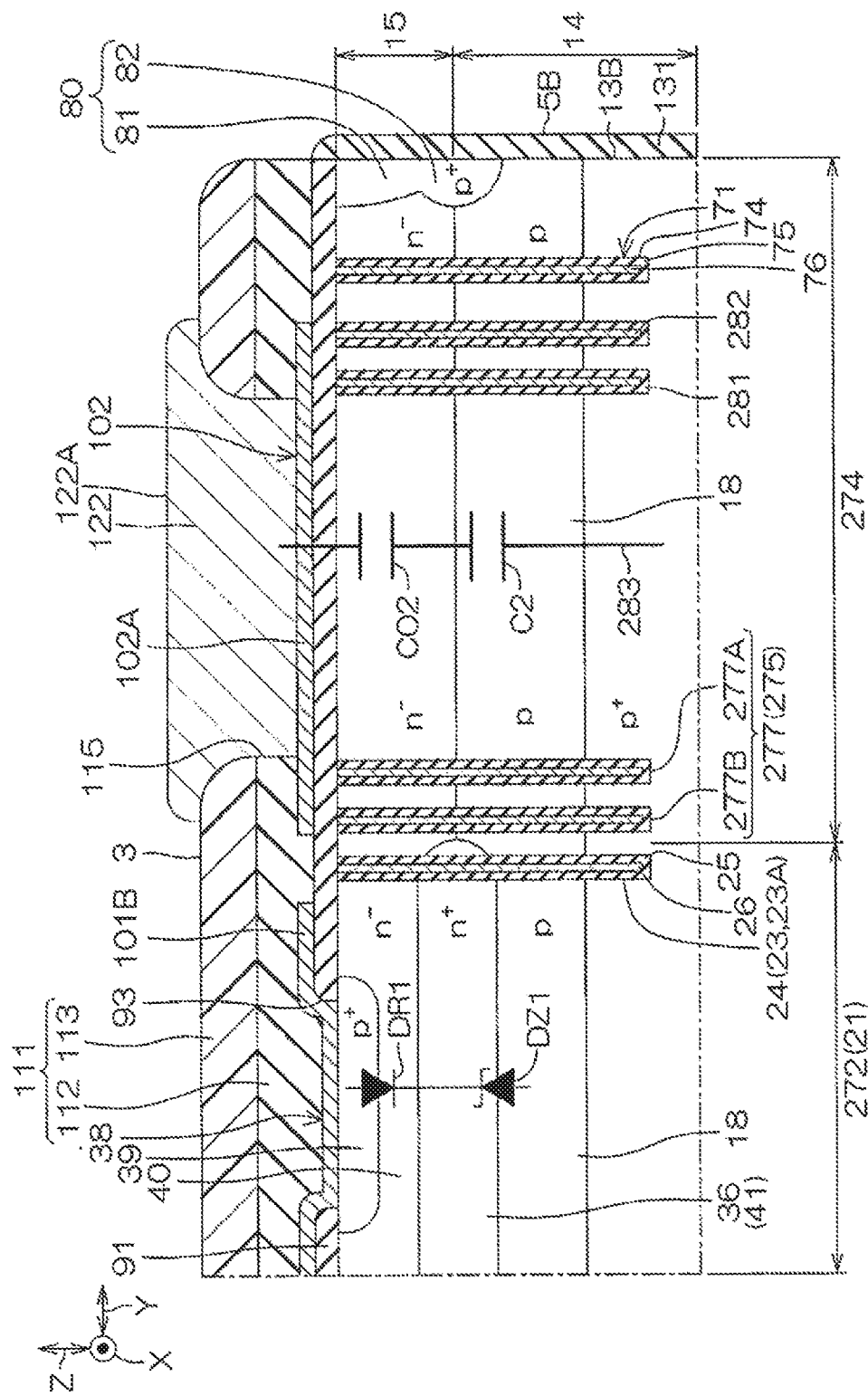
FIG. 7 is an enlarged cross-sectional diagram of a second pad region shown in FIG. 3.
Figure 8:
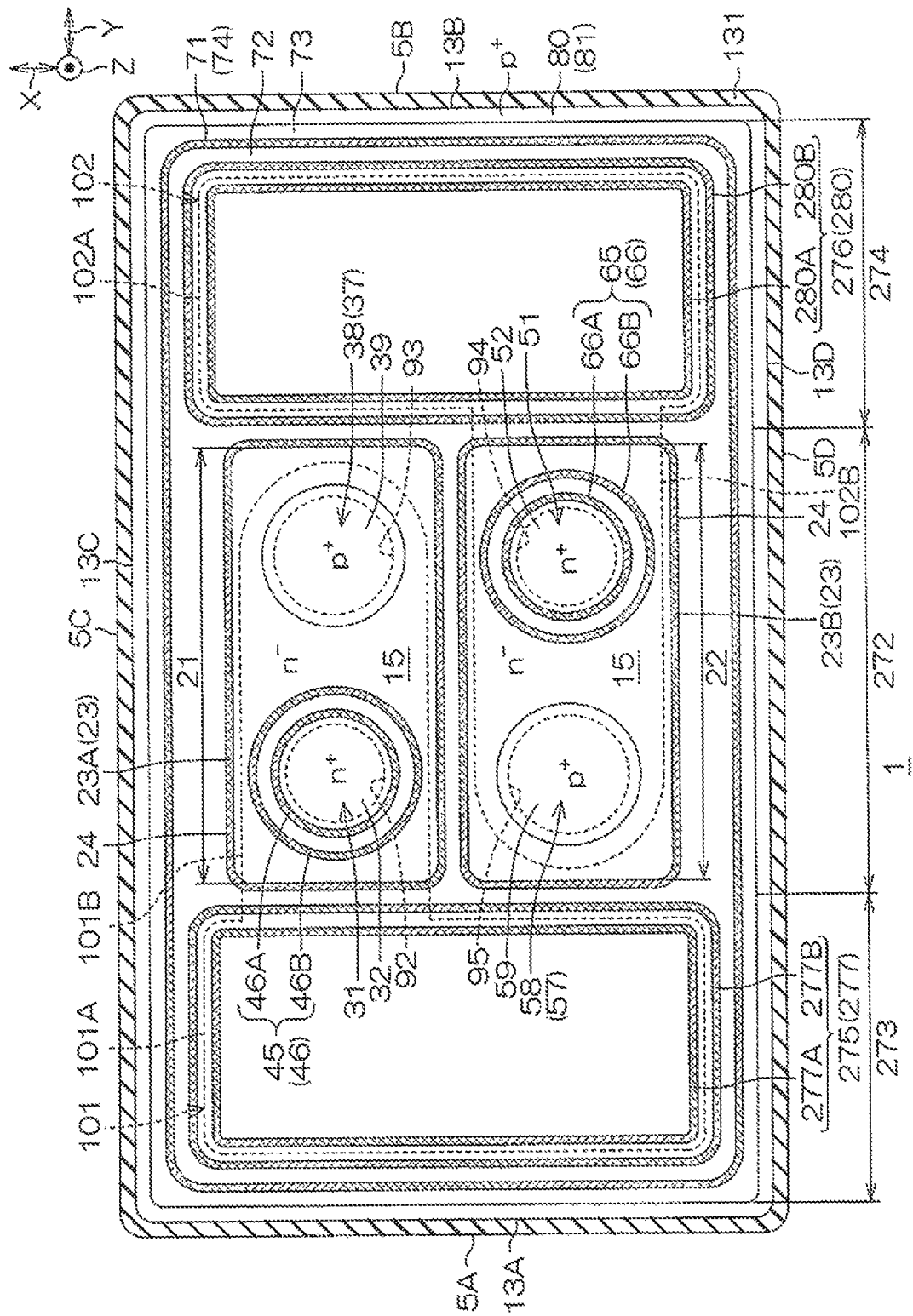
FIG. 8 is a top view of the structure of a first main surface of a semiconductor chip.
Figure 9:
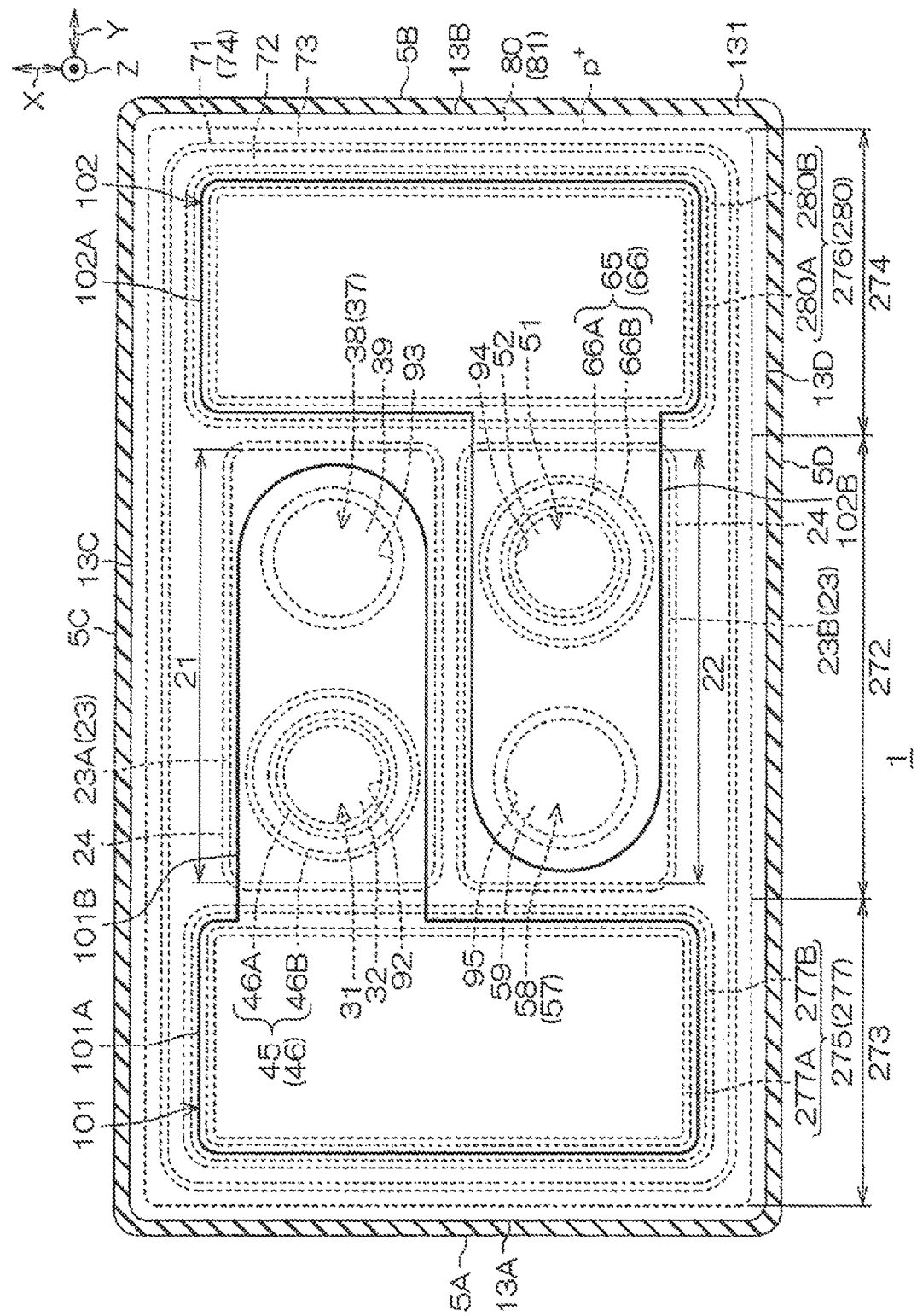
FIG. 9 is a top view of structures of a first electrode layer and a second electrode layer.

FIG. 1 shows a perspective diagram of a section of a diode chip 1 according to a first embodiment of the present invention. FIG. 2 shows a top view of the diode chip 1 in FIG. 1. FIG. 3 shows a cross-sectional diagram taken along line III-III in FIG. 2. FIG. 4 shows a cross-sectional diagram taken along line IV-IV in FIG. 2. FIG. 5 shows a cross-sectional diagram taken along line V-V in FIG. 2. FIG. 6 shows an enlarged cross-sectional diagram of a first pad region 273 shown in FIG. 3. FIG. 7 shows an enlarged cross-sectional diagram of a second pad region 274 shown in FIG. 3. FIG. 8 shows a top view of the structure of a first main surface 11 of a semiconductor chip 10. FIG. 9 shows a top view of structures of a first electrode layer 101 and a second electrode layer 102.

Referring to FIG. 1 to FIG. 9, the diode chip 1 is small-sized chip component (semiconductor apparatus) such as a chip referred to as a 1005 (1 mm×0.5 mm) chip, 0603 (0.6 mm×0.3 mm) chip, 0402 (0.4 mm×0.2 mm) chip, or 03015 (0.3 mm×0.15 mm) chip based on planar dimensions. In this embodiment, the diode chip 1 includes an ESD (electro-static discharge) protection chip that protects electrical circuits from influences of ESD.

The diode chip 1 includes a rectangular chip body 2. The chip body 2 also serves as a package. That is to say, the diode chip 1 (the chip body 2) includes a chip scale package having a chip size serving as a package size. The chip body 2 includes a first chip main surface 3 on one side, a second chip main surface 4 on the other side, and four chip side surfaces 5A, 5B, 5C and 5D connecting the first chip main surface 3 and the second chip main surface 4.

The first chip main surface 3 and the second chip main surface 4 are shaped as a quadrilateral (specifically, a rectangle) when viewing from a normal direction Z thereof (to be referred to as "in top view" below). The first chip main surface 3 is a connection surface (mounting surface) that is opposite to a connection target when connecting to a connection target such as a mounting substrate. The second chip main surface 4 is a non-connection surface (non-mounting surface) opposite to the connection surface. The second chip main surface 4 consists of a ground surface having grinding marks or a mirror.

The chip side surfaces 5A to 5D include a first chip side surface 5A, a second chip side surface 5B, a third chip side surface 5C and a fourth chip side surface 5D. The first chip side surface 5A and the second chip side surface 5B extend along a first direction X, and are opposite to a second direction Y crossing the first direction X. The first chip side surface 5A (the second chip side surface 5B) forms a short side of the chip body 2. The third chip side surface 5C and the fourth chip side surface 5D extend along the second direction Y, and are opposite to the first direction X. The third chip side surface 5C (the fourth chip side surface 5D) forms a long side of the chip body 2. More specifically, the second direction Y is orthogonal to the first direction X. The chip side surfaces 5A to 5D consists of flat surfaces extending along the normal direction Z.

In this embodiment, the four corners of the chip body 2 form curves (R chamfers) toward outer sides of the chip body 2 in top view. The four corners of the chip body 2 may also be C chamfers. The four corners of the chip body 2 may also be opening angles instead of chamfers.

The terms "0603", "0402" and "03015" are defined by the length of the short side and the length of the long side of the chip body 2. The length of the short side of the chip body 2 is not limited to said values, and may be equal to or more than 0.05 mm and equal to or less than 1 mm. The length of the short side of the chip body 2 may be equal to or more than 0.05 mm and equal to or less than 0.1 mm, equal to or more than 0.1 mm and equal to or less than 0.2 mm, equal to or more than 0.2 mm and equal to or less than 0.3 mm, equal to or more than 0.3 mm and equal to or less than 0.4 mm, equal to or more than 0.4 mm and equal to or less than 0.5 mm, equal to or more than 0.5 mm and equal to or less than 0.6 mm, equal to or more than 0.6 mm and equal to or less than 0.7 mm, equal to or more than 0.7 mm and equal to or less than 0.8 mm, equal to or more than 0.8 mm and equal to or less than 0.9 mm, or equal to or more than 0.9 mm and equal to or less than 1 mm.

Furthermore, the length of the long side of the chip body 2 is not limited to said values, and may be equal to or more than 0.1 mm and equal to or less than 2 mm. The length of the long side of the chip body 2 may be equal to or more than 0.1 mm and equal to or less than 0.2 mm, equal to or more than 0.2 mm and equal to or less than 0.4 mm, equal to or more than 0.4 mm and equal to or less than 0.6 mm, equal to or more than 0.6 mm and equal to or less than 0.8 mm, equal to or more than 0.8 mm and equal to or less than 1 mm, equal to or more than 1 mm and equal to or less than 1.2 mm, equal to or more than 1.2 mm and equal to or less than 1.4 mm, equal to or more than 1.4 mm and equal to or less than 1.6 mm, equal to or more than 1.6 mm and equal to or less than 1.8 mm, or equal to or more than 1.8 mm and equal to or less than 2 mm. The ratio of the length of the long side of the chip body 2 to the length of the short side of the chip body 2 is preferably equal to or more than 1 and equal to or less than 3.

The chip body 2 may have a thickness of equal to or more than 50 µm and equal to or less than 1000 µm. The thickness of the chip body 2 may also be equal to or more than 50 µm and equal to or less than 100 µm, equal to or more than 100 µm and equal to or less than 200 µm, equal to or more than 200 µm and equal to or less than 400 µm, equal to or more than 400 µm and equal to or less than 600 µm, equal to or more than 600 µm and equal to or less than 800 µm, or equal to or more than 800 µm and equal to or less than 1000 µm. The thickness of the chip body 2 is preferably equal to or more than 50 µm and equal to or less than 500 µm.

The diode chip 1 (the chip body 2) includes a rectangular semiconductor chip 10 made of silicon. The semiconductor chip 10 includes a first main surface 11 on one side, a second main surface 12 on the other side, and four side surfaces 13A, 13B, 13C and 13D connecting the first main surface 11 and the second main surface 12. The first main surface 11 and the second main surface 12 are shaped as quadrilaterals (as rectangles in this embodiment) in top view.

The first main surface 11 is a mounting surface on which functional apparatuses are formed. The second main surface 12 forms the second chip main surface 4. The side surfaces 13A to 13D include a first side surface 13A, a second side surface 13B, a third side surface 13C and a fourth side surface 13D.

The diode chip 1 includes a p-type first semiconductor layer 14 and an n-type second semiconductor layer 15 sequentially formed from the side of the second main surface 12 to the side of the first main surface 11 of the semiconductor chip 10. The first semiconductor layer 14 is exposed from the second main surface 12 and the side surfaces 13A to 13D of the semiconductor chip 10. The second semiconductor layer 15 is exposed from the first main surface 11 and the side surfaces 13A to 13D of the semiconductor chip 10.

Figure 10:
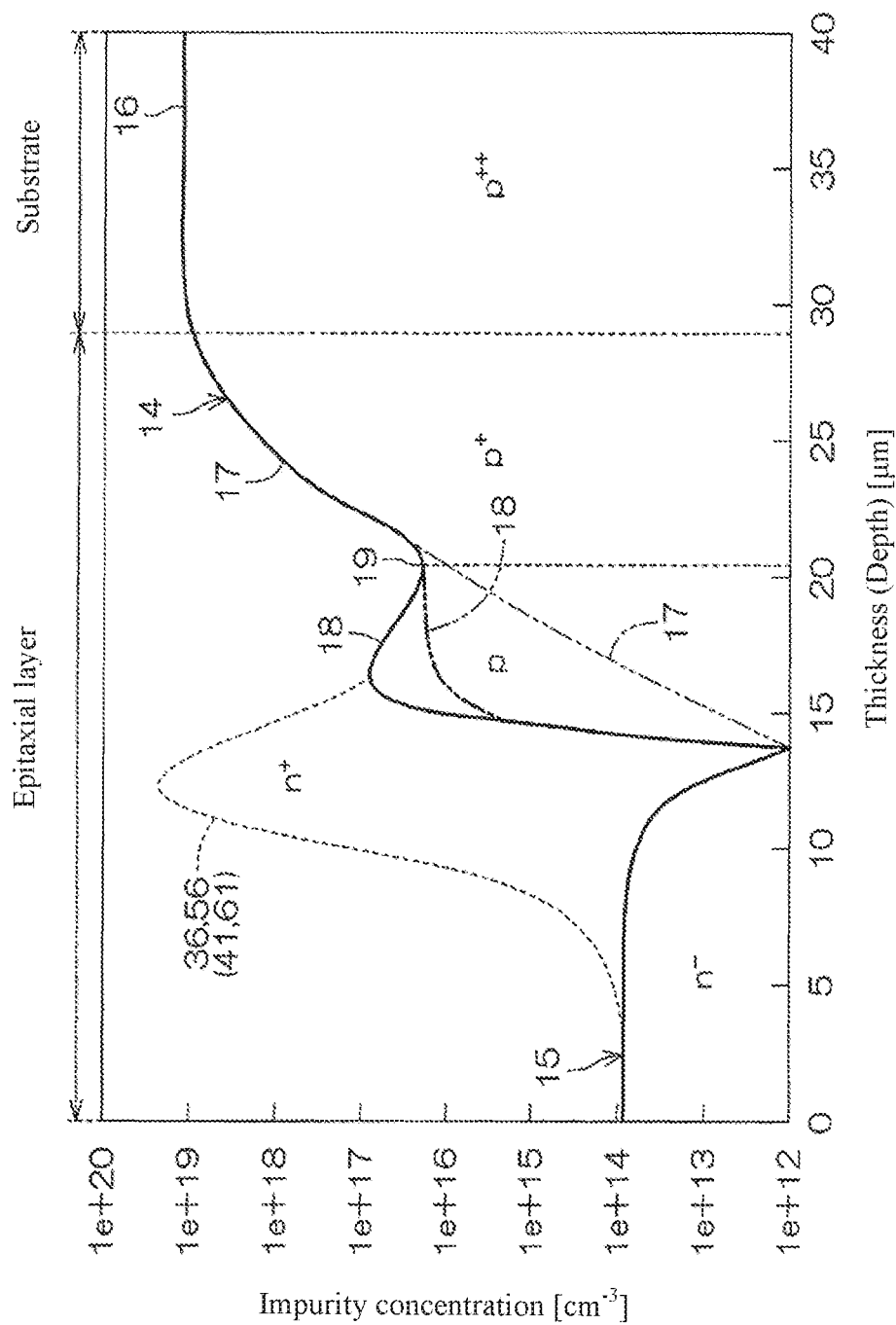
FIG. 10 is a curve diagram representing a concentration gradient of the semiconductor chip.

The first semiconductor layer 14 and the second semiconductor layer 15 are specifically described with reference to FIG. 10 below. FIG. 10 shows a curve diagram of a concentration gradient of the semiconductor chip 10. In FIG. 10, the vertical axis represents the impurity concentration [in $cm^{-3}$], and the horizontal axis represents the thickness (depth) [in µm]. The concentration gradient of the semiconductor chip 10 is obtained by simulation.

Referring to FIG. 10, the first semiconductor layer 14 has a p-type impurity concentration of equal to or more than $1 \times 10^{12}$ $cm^{-3}$ and equal to or less than $1 \times 10^{21}$ $cm^{-3}$. The first semiconductor layer 14 is formed in a manner of having the p-type impurity concentration on the side of the first main surface 11 be less than the p-type impurity concentration on the side of the second main surface 12. More specifically, the first semiconductor layer 14 includes a $p^{++}$-type high concentration layer 16, a $p^+$-type concentration reducing layer 17 and a p-type concentration keeping layer 18 sequentially laminated from the side of the second main surface 12 to the side of the first main surface 11.

The high concentration layer 16 has a p-type impurity concentration of which the average value in the thickness direction is a first value A. The concentration reducing layer 17 has a p-type impurity concentration of which the average value in the thickness direction is a second value B less than the first value A (B<A). The concentration keeping layer 18 has a p-type impurity concentration of which the average value in the thickness direction is a third value C less than the second value B (B<A<C).

To define the concentration gradient of the semiconductor chip 10 by a function f(x), the first value A is obtained from an average value of the function f(x) in an interval defined by the high concentration layer 16, the second value B is obtained from an average value of the function f(x) in the interval defined by the concentration reducing layer 17, and the third value C is obtained from an average of the function f(x) in the interval defined by the concentration keeping layer 18.

The high concentration layer 16 consists of a $p^{++}$-type semiconductor substrate. The high concentration layer 16 globally has a substantially fixed p-type impurity concentration. The p-type impurity concentration of the high concentration layer 16 may be equal to or more than $1 \times 10^{19}$ $cm^{-3}$ and equal to or less than $1 \times 10^{21}$ $cm^{-3}$. In this embodiment, the p-type impurity concentration of the high concentration layer 16 is equal to or more than $1 \times 10^{19}$ $cm^{-3}$ and equal to or less than $1 \times 10^{20}$ $cm^{-3}$.

The high concentration layer 16 may have a thickness of equal to or more than 10 μm and equal to or less than 800 μm. The thickness of the high concentration layer 16 may also be equal to or more than 10 μm and equal to or less than 100 μm, equal to or more than 100 μm and equal to or less than 200 μm, equal to or more than 200 μm and equal to or less than 400 μm, equal to or more than 400 μm and equal to or less than 600 μm, or equal to or more than 600 μm and equal to or less than 800 μm. The thickness of the high concentration layer 16 is preferably equal to or more than 30 μm and equal to or less than 400 μm.

The concentration reducing layer 17 consists of a $p^+$-type epitaxial layer formed on the high concentration layer 16 (the semiconductor substrate). The concentration reducing layer 17 has a p-type impurity diffused from the high concentration layer 16, and includes a region having a p-type impurity concentration less than the p-type impurity concentration of the high concentration layer 16. The concentration reducing layer 17 has a concentration gradient by which the p-type impurity concentration gradually reduces from the high concentration layer 16 toward a crystal growth direction. The reduction rate of the p-type impurity concentration of the concentration reducing layer 17 gradually increases from the high concentration layer 16 toward the crystal growth direction.

The p-type impurity concentration of the concentration reducing layer 17 gradually reduces until the minimum value thereof is in a range of equal to or more than $1 \times 10^{15}$ $cm^{-3}$ and equal to or less than $1 \times 10^{17}$ $cm^{-3}$. In this embodiment, the minimum value of the p-type impurity concentration of the concentration reducing layer 17 is in a range of equal to or more than $1 \times 10^{16}$ $cm^{-3}$ and equal to or less than $1 \times 10^{17}$ $cm^{-3}$.

The concentration reducing layer 17 may have a thickness of equal to or more than 5 μm and equal to or less than 20 μm. The thickness of the concentration reducing layer 17 may also be equal to or more than 5 μm and equal to or less than 10 μm, equal to or more than 10 μm and equal to or less than 15 μm, or equal to or more than 15 μm and equal to or less than 20 μm. In this embodiment, the thickness of the concentration reducing layer 17 is equal to or more than 6 μm and equal to or less than 8 μm.

The concentration keeping layer 18 consists of a p-type epitaxial layer formed on the concentration reducing layer 17 (the epitaxial layer). The concentration keeping layer 18 keeps a specified p-type impurity concentration within a specified thickness range, and suppresses concentration reduction of the concentration reducing layer 17. In other words, the concentration keep layer 18 lowers, within a specified thickness range, the decrease rate of the p-type impurity concentration of the concentration reducing layer 17.

The concentration keeping layer 18 preferably maintains a p-type impurity concentration of equal to or more than $5 \times 10^{15}$ $cm^{-3}$ and equal to or less than $5 \times 10^{17}$ $cm^{-3}$ within a specified thickness range. Thus, the concentration keeping layer 18 suppresses a region in which the concentration gradient of the first semiconductor layer 14 drastically drops. In FIG. 10, the concentration gradient of the concentration reducing layer 17 in the absence of the concentration keeping layer 18 is represented by a dashed double dot line.

The concentration keeping layer 18 is formed on the concentration reducing layer 17 with a concentration transition layer 19 interposed in between. The concentration transition layer 19 is as a concentration constant region of which the slope of the concentration gradient thereof may be considered zero or substantially considered zero. In this embodiment, the concentration keeping layer 18 has a p-type impurity concentration more than the minimum value of the p-type impurity concentration of the concentration reducing layer 17. Furthermore, the concentration keeping layer 18 has a concentration gradient by which the p-type impurity concentration gradually increases from the concentration reducing layer 17 toward the crystal growth direction.

That is to say, the concentration transition layer 19 is a region in which the concentration gradient of the p-type impurity changes from decreasing to increasing, and the p-type impurity concentration of the concentration reducing layer 17 transits to the p-type impurity concentration of the concentration keeping layer 18. The concentration keeping layer 18 includes the p-type impurity diffused from the concentration reducing layer 17 and a p-type impurity introduced from the exterior.

Such concentration keeping layer 18 is formed by the following method: selectively introducing a p-type impurity into the surface layer portion of the concentration reducing layer 17, forming an epitaxial layer on the concentration reducing layer 17, and diffusing the p-type impurity introduced into the concentration reducing layer 17 to the epitaxial layer. Furthermore, such concentration keeping layer 18 may also be obtained by the following method: directly forming an epitaxial layer having a relative high concentration on the concentration reducing layer 17 by an epitaxial growth method accompanied with introduction of a p-type impurity.

The p-type impurity concentration of the concentration keeping layer 18 may gradually increase until being in a range of more than the minimum value of the p-type impurity concentration of the concentration reducing layer 17 and equal to or less than $5 \times 10^{17}$ $cm^{-3}$. The maximum value of the p-type impurity concentration of the concentration keeping layer 18 is preferably more than the minimum value of the p-type impurity concentration of the concentration reducing layer 17 and equal to or less than $1 \times 10^{17}$ $cm^{-3}$.

The concentration keeping layer 18 does not necessarily have a concentration gradient by which the p-type impurity concentration increases. The concentration keeping layer 18 is required to only keep the p-type impurity concentration in a specified thickness, for example, as shown by the thick dashed double dot line in FIG. 10, having a concentration gradient by which the p-type impurity concentration gradually decreases toward the crystal growth direction.

The concentration keeping layer 18 may have a thickness of equal to or more than 1 μm and equal to or less than 10 μm. The thickness of the concentration keeping layer 18 may also be equal to or more than 1 μm and equal to or less than 2 μm, equal to or more than 2 μm and equal to or less than 4 μm, equal to or more than 4 μm and equal to or less than 6 μm, equal to or more than 6 μm and equal to or less than 8 μm, or equal to or more than 8 μm and equal to or less than 10 μm. The thickness of the concentration keeping layer 18 is preferably equal to or more than 2 μm and equal to or less than 5 μm.

The second semiconductor layer 15 consists of an n-type epitaxial layer formed on the concentration keeping layer 18 (the epitaxial layer). The second semiconductor layer 15 has an n-type impurity concentration less than the p-type impurity concentration of the first semiconductor layer 14. The n-type impurity concentration of the second semiconductor layer 15 may have a peak of equal to or more than $1 \times 10^{13}$ $cm^{-3}$ and equal to or less than $1 \times 10^{15}$ $cm^{-3}$. The peak value of the n-type impurity concentration of the second semiconductor layer 15 is preferably equal to or more than $5\times10^{13}$ cm$^{-3}$ and equal to or less than $5\times10^{14}$ cm$^{-3}$.

The second semiconductor layer 15 is formed by an n-type high resistance layer having a relatively low n-type impurity concentration. The second semiconductor layer 15 may have a resistance rate of equal to or more than 50 Ω·cm and equal to or less than 150 Ω·cm. The resistance rate of the second semiconductor layer 15 may also be equal to or more than 50 Ω·cm and equal to or less than 75 Ω·cm, equal to or more than 75 Ω·cm and equal to or less than 100 Ω·cm, equal to or more than 100 Ω·cm and equal to or less than 125 Ω·cm, or equal to or more than 125 Ω·cm and equal to or less than 150 Ω·cm. The resistance rate of the second semiconductor layer 15 is preferably equal to or more than 80 Ω·cm and equal to or less than 120 Ω·cm.

The second semiconductor layer 15 has a thickness less than the thickness of the first semiconductor layer 14. The second semiconductor layer 15 may have a thickness of equal to or more than 5 μm and equal to or less than 20 μm. The thickness of the second semiconductor layer 15 may also be equal to or more than 5 μm and equal to or less than 10 μm, equal to or more than 10 μm and equal to or less than 15 μm, or equal to or more than 15 μm and equal to or less than 20 μm. The thickness of the second semiconductor layer 15 is preferably equal to or more than 8 μm and equal to or less than 15 μm.

Referring to FIG. 2 to FIG. 9, the diode chip 1 includes an apparatus forming region 272, a first pad region 273 and a second pad region 274 configured at the semiconductor chip 10. The apparatus forming region 272 is configured at a center portion of the first main surface 11. The apparatus forming region 272 is shaped as a quadrilateral having four sides parallel to the side surfaces 13A to 13D of the semiconductor chip 10 in top view.

The first pad region 273 is configured in a region close to one side of the first main surface 11 (the side of the first side surface 13A) relative to the apparatus forming region 272. The first pad region 273 is shaped as a band (a rectangle) extending along the first direction X in top view. The second pad region 274 is configured in a region close to the other side of the first main surface 11 (the side of the second side surface 13B) relative to the apparatus forming region 272. The second pad region 274 is shaped as a band (a rectangle) extending along the first direction X in top view.

The diode chip 1 includes a first apparatus region 21 and a second apparatus region 22 centrally formed in the apparatus forming region 272 of the semiconductor chip 10. The first apparatus region 21 and the second apparatus region 22 are arranged at an interval in the first direction X.

Specifically, the first apparatus region 21 is a region formed on one side (the side of the third side surface 13C) in the apparatus forming region 272. More specifically, assuming that a center line crosses the center portion of the semiconductor chip 10 in the second direction Y, the first apparatus region 21 is formed in a region close to the side of the third side surface 13C relative to the center line.

The first apparatus region 21 is shaped as a band (a rectangle) extending along the second direction Y. More specifically, the first apparatus region 21 is shaped as a quadrilateral having four sides parallel to the side surfaces 13A to 13D in top view. The first apparatus region 21 may have any planar shape as desired. The first apparatus region 21 may also be shaped as polygon or a circle (including an oval) other than a quadrilateral in top view.

The second apparatus region 22 is formed, in the apparatus forming region 272, at an interval from the first apparatus region 21 in the first direction X in a region on the other side (the side of the fourth side surface 13D). More specifically, assuming that a center line crosses the center portion of the semiconductor chip 10 in the second direction Y, the second apparatus region 22 is formed in a region close to the side of the fourth side surface 13D relative to the center line.

In this embodiment, the second apparatus region 22 is shaped as a band (a rectangle) extending along the second direction Y. More specifically, the second apparatus region 22 is shaped as a quadrilateral having four sides parallel to the side surfaces 13A to 13D in top view. The second apparatus region 22 may have any planar shape as desired. The second apparatus region 22 may also be shaped as a polygon or a circle (including an oval) other than a quadrilateral in top view.

Assuming that a center line crosses the center portion of the semiconductor chip 10 in the second direction Y, the second apparatus region 22 is formed preferably by a layout of being line symmetric to the first apparatus region 21 relative to the center line. Furthermore, the second apparatus region 22 is formed preferably by a layout of being dot symmetric to the first apparatus region 21 relative to the center portion of the semiconductor chip 10.

In the description below, the region in the first apparatus region 21 on the side of the first side surface 13A is referred to a region on one side (the side of the first side surface 13A) of the first apparatus region 21, and the region in the first apparatus region 21 on the side of the second side surface 13B is referred to as a region on the other side (the side of the second side surface 13B) of the first apparatus region 21. Furthermore, the region in the second apparatus region 22 on the side of the first side surface 13A is referred to a region on one side (the side of the first side surface 13A) of the second apparatus region 22, and the region in the second apparatus region 22 on the side of the second side surface 13B is referred to as a region on the other side (the side of the second side surface 13B) of the second apparatus region 22.

The diode chip 1 includes a region separation structure 23 separating the first apparatus region 21 and the second apparatus region 22 in the apparatus forming region 272. In some of the drawings, for better illustration purposes, the region separation structure 23 is represented by crosshatch. The region separation structure 23 includes a first region separation structure 23A separating the first apparatus region 21, and a second region separation structure 23B separating the second apparatus region 22.

The first region separation structure 23A forms a loop (a quadrilateral loop in this embodiment) surrounding the first apparatus region 21 in top view. The first apparatus region 21 has a planar shape that is adjusted by the first region separation structure 23A. The second region separation structure 23B is separated from the first region separation structure 23A and forms a loop (a quadrilateral loop in this embodiment) surrounding the second apparatus region 22 in top view. The second apparatus region 22 has a planar shape that is adjusted by the second region separation structure 23B. The second region separation structure 23B may also be formed integrally with the first region separation structure 23A, in a region between the first apparatus region 21 and the second apparatus region 22.

The region separation structure 23 has a trench insulation structure including a region separation trench 24 (a region separation trench), a region separation insulation layer 25, and a polysilicon 26. The region separation trench 24 is formed by excavating the first main surface 11 toward the second main surface 12. The region separation trench 24 penetrates the semiconductor layer 15 till reaching the first semiconductor layer 14. More specifically, the region separation trench 24 penetrates the second semiconductor layer 15 and the concentration keeping layer 18 till reaching concentration reducing layer 17.

The region separation trench 24 includes sidewalls and a bottom wall. The sidewalls of the region separation trench 24 may be formed as being perpendicular to the first main surface 11. The sidewalls of the region separation trench 24 may also be formed as inclining relative to the first main surface 11. In this case, the region separation trench 24 may be shaped as having a pointed front end and having a bottom area less than an opening area.

The bottom wall of the region separation trench 24 is located on the side close to the concentration reducing layer 17 relative to the high concentration layer 16. Thus, the sidewalls of the region separation trench 24 expose the second semiconductor layer 15, the concentration keeping layer 18 and the concentration reducing layer 17. Furthermore, the bottom wall of the region separation trench 24 exposes the concentration reducing wall 17.

In this embodiment, the region separation trench 24 is formed by a deep trench having an aspect ratio of more than 1. The aspect ratio is defined by the depth of the region separation trench 24 relative to the width of the region separation trench 24. The aspect ratio is preferably equal to or more than 5 and equal to or less than 20.

The region separation trench 24 may have a width of equal to or more than 0.1 μm and equal to or less than 3 μm. The width of the region separation trench 24 may also be equal to or more than 0.1 μm and equal to or less than 0.5 μm, equal to or more than 0.5 μm and equal to or less than 1 μm, equal to or more than 1 μm and equal to or less than 1.5 μm, equal to or more than 1.5 μm and equal to or less than 2 μm, equal to or more than 2 μm and equal to or less than 2.5 μm, or equal to or more than 2.5 μm and equal to or less than 3 μm. The width of the region separation trench 24 is preferably equal to or more than 1.5 μm and equal to or less than 2.5 μm.

The region separation trench 24 may have a depth of equal to or more than 1 μm and equal to or less than 50 μm. The depth of the region separation trench 24 may also be equal to or more than 1 μm and equal to or less than 5 μm, equal to or more than 5 μm and equal to or less than 10 μm, equal to or more than 10 μm and equal to or less than 15 μm, equal to or more than 15 μm and equal to or less than 20 μm, equal to or more than 20 μm and equal to or less than 25 μm, equal to or more than 25 μm and equal to or less than 30 μm, equal to or more than 30 μm and equal to or less than 40 μm, or equal to or more than 40 μm and equal to or less than 50 μm. The depth of the region separation trench 24 is preferably equal to or more than 15 μm and equal to or less than 35 μm.

The region separation insulation layer 25 is formed in the region separation trench 24. More specifically, the region separation insulation layer 25 is shaped as a film along the inner wall of the region separation trench 24. Thus, the region separation insulation layer 25 separates a recessed space in the region separation trench 24.

The region separation insulation layer 25 may include at least one of a silicon oxide layer and a silicon nitride layer. The region separation insulation layer 25 may have a laminated structure formed by laminating a silicon oxide layer and a silicon nitride layer according to any sequence. The region separation insulation layer 25 may also be a single-layer structure consisting of a silicon oxide layer or a silicon nitride layer. In this embodiment, the region separation insulation layer 25 has a single-layer structure consisting of a silicon oxide layer.

The polysilicon 26 is embedded in the region separation trench 24 with the region separation insulation layer 25 interposed in between. The polysilicon 26 forms an electrically floating state. The region separation structure 23 may exclude the polysilicon 26, but includes the region separation insulation layer 25 serving as an integral body embedded in the region separation trench 24.

As such, the region separation insulation layer 25 electrically connects the first apparatus region 21 to the second apparatus region 22 via the semiconductor chip 10 (the first semiconductor layer 14). On the other hand, the region separation insulation layer 25 electrically separates the second semiconductor layer 15 in the first apparatus region 21 from the second semiconductor layer 15 in the second apparatus region 22.

Referring to FIG. 2 to FIG. 9, the diode chip 1 includes a first pad separation structure 275 separating a portion of the first pad region 273 from other regions, and a second pad separation structure 276 separating a portion of the second pad region 274 from other regions.

The first pad separation structure 275 is at an interval from the region separation structure 23 and forms a loop surrounding a portion of the first pad region 273 in top view. More specifically, assuming that a center line crosses the center portion of the first main surface 11 in the second direction Y, the first pad separation structure 275 forms a rectangular loop that crosses the center line.

Thus, the first pad separation structure 275 is opposite to the first apparatus region 21 and the second apparatus region 22 in the second direction Y. Furthermore, the first pad separation structure 275 separates a portion of the first pad region 273 by a band shape (specifically, a rectangle) extending along the first direction X. The first pad separation structure 275 may have any planar shape as desired. The first pad separation structure 275 may also be shaped as a polygonal loop or a circular loop.

The first pad separation structure 275 has a trench insulation structure including a first pad separation trench 277 (a separation trench), a first pad separation insulation layer 278, and a polysilicon 279. In this embodiment, the first pad separation trench 277 has a double trench structure. More specifically, the first pad separation trench 277 includes a first inner pad trench 277A and a first outer pad trench 277B. The first pad separation trench 277 may have a single trench structure including only either one of the first inner pad trench 277A and the first outer pad trench 277B.

The first inner pad trench 277A is shaped as a loop (a rectangular loop) surrounding a portion of the first pad region 273 in top view. The first inner pad trench 277A may have any planar shape as desired. The first inner pad trench 277A may also be shaped as a polygonal loop or a circular loop.

The first inner pad trench 277A is formed by excavating the first main surface 11 toward the second main surface 12. The first inner pad trench 277A penetrates the second semiconductor layer 15 till reaching the first semiconductor layer 14 (specifically, the concentration reducing layer 17).

The first inner pad trench 277A includes an inner peripheral wall, an outer peripheral wall and a bottom wall. The inner peripheral wall and the outer peripheral wall of the first inner pad trench 277A expose the first semiconductor layer 14 and the second semiconductor layer 15. The inner peripheral wall and the outer peripheral wall of the first inner pad trench 277A may be formed as being perpendicular to the first main surface 11. The inner peripheral wall and the outer peripheral wall of the first inner pad trench 277A may also be formed as inclining relative to the first main surface 11. In this case, the first inner pad trench 277A may be shaped as having a pointed front end and having a bottom area less than an opening area.

The bottom wall of the first inner pad trench 277A is close to the side of the concentration reducing layer 17 relative to the high concentration layer 16. The bottom wall of the first inner pad trench 277A exposes the concentration reducing layer 17. The first inner pad trench 277A may be formed simultaneously with the region separation trench 24. In this case, the first inner pad trench 277A has a width and a depth equal to those of the region separation trench 24.

The first outer pad trench 277B is separated from the first inner pad trench 277A and is shaped as a loop (a rectangular loop) surrounding the first inner pad trench 277A in top view. The first outer pad trench 277B may have any planar shape as desired, which is not necessarily the same as the planar shape of the first inner pad trench 277A. The first outer pad trench 277B may also be shaped as a polygonal loop or a circular loop.

The first outer pad trench 277B is formed by excavating the first main surface 11 toward the second main surface 12. The first outer pad trench 277B penetrates the second semiconductor layer 15 till reaching the first semiconductor layer 14 (specifically, the concentration reducing layer 17).

The first outer pad trench 277B includes an inner peripheral wall, an outer peripheral wall and a bottom wall. The inner peripheral wall and the outer peripheral wall of the first outer pad trench 277B expose the first semiconductor layer 14 and the second semiconductor layer 15. The inner peripheral wall and the outer peripheral wall of the first outer pad trench 277B may be formed as being perpendicular to the first main surface 11. The inner peripheral wall and the outer peripheral wall of the first outer pad trench 277B may also be formed as inclining relative to the first main surface 11. In this case, the first outer pad trench 277B may be shaped as having a pointed front end and having a bottom area less than an opening area.

The bottom wall of the first outer pad trench 277B is close to the side of the concentration reducing layer 17 relative to the high concentration layer 16. The bottom wall of the first outer pad trench 277B exposes the concentration reducing layer 17. The first outer pad trench 277B may be formed simultaneously with the region separation trench 24. In this case, the first outer pad trench 277B has a width and a depth equal to those of the region separation trench 24. As such, the first outer pad trench 277B and the first inner pad trench 277A jointly form a double trench structure.

A trench gap between the first inner pad trench 277A and the first outer pad trench 277B may be equal to or more than 1 μm and equal to or less than 10 μm. The trench gap may also be equal to or more than 1 μm and equal to or less than 2 μm, equal to or more than 2 μm and equal to or less than 4 μm, equal to or more than 4 μm and equal to or less than 6 μm, equal to or more than 6 μm and equal to or less than 8 μm, or equal to or more than 8 μm and equal to or less than 10 μm. The trench gap is preferably equal to or more than 3 μm and equal to or less than 8 μm.

In this embodiment, the first inner pad trench 277A and the first outer pad trench 277B are formed by deep trenches having aspect ratios of more than 1. The aspect ratio is defined by the depth of the first inner pad trench 277A (the first outer pad trench 277B) relative to the width of the first inner pad trench 277A (the first outer pad trench 277B). The aspect ratio is preferably equal to or more than 5 and equal to or less than 20.

The first inner pad trench 277A (the first outer pad trench 277B) may have a width of equal to or more than 0.1 μm and equal to or less than 3 μm. The width of the first inner pad trench 277A (the first outer pad trench 277B) may also be equal to or more than 0.1 μm and equal to or less than 0.5 μm, equal to or more than 0.5 μm and equal to or less than 1 μm, equal to or more than 1 μm and equal to or less than 1.5 μm, equal to or more than 1.5 μm and equal to or less than 2 μm, equal to or more than 2 μm and equal to or less than 2.5 μm, or equal to or more than 2.5 μm and equal to or less than 3 μm. The width of the first inner pad trench 277A (the first outer pad trench 277B) is preferably equal to or more than 1.5 μm and equal to or less than 2.5 μm.

The first inner pad trench 277A (the first outer pad trench 277B) may have a depth of equal to or more than 1 μm and equal to or less than 50 μm. The depth of the first inner pad trench 277A (the first outer pad trench 277B) may also be equal to or more than 1 μm and equal to or less than 5 μm, equal to or more than 5 μm and equal to or less than 10 μm, equal to or more than 10 μm and equal to or less than 15 μm, equal to or more than 15 μm and equal to or less than 20 μm, equal to or more than 20 μm and equal to or less than 25 μm, equal to or more than 25 μm and equal to or less than 30 μm, equal to or more than 30 μm and equal to or less than 40 μm, or equal to or more than 40 μm and equal to or less than 50 μm. The depth of the first inner pad trench 277A (the first outer pad trench 277B) is preferably equal to or more than 15 μm and equal to or less than 35 μm.

The first pad separation insulation layer 278 is formed in the first pad separation trench 277. More specifically, the first pad separation insulation layer 278 is shaped as a film along the inner wall of the first inner pad trench 277A. Thus, the first pad separation insulation layer 278 separates a recessed space in the first inner pad trench 277A. Furthermore, the first pad separation insulation layer 278 is shaped as a film along the inner wall of the first outer pad trench 277B. Thus, the first pad separation insulation layer 278 separates a recessed space in the first outer pad trench 277B.

The first pad separation insulation layer 278 may include at least one of a silicon oxide layer and a silicon nitride layer. The first pad separation insulation layer 278 may have a laminated structure formed by laminating a silicon oxide layer and a silicon nitride layer according to any sequence. The first pad separation insulation layer 278 may also have a single-layer structure consisting of a silicon oxide layer or a silicon nitride layer. The first pad separation insulation layer 278 preferably consists of an insulation material the same as that of the region separation insulation layer 25. In this embodiment, the first pad separation insulation layer 278 has a single-layer structure consisting of a silicon oxide layer.

The polysilicon 279 is embedded in the first pad separation trench 277 with the first pad separation insulation layer 278 interposed in between. More specifically, the polysilicon 279 is embedded in the first inner pad trench 277A with the first pad separation insulation layer 278 interposed in between. Furthermore, the polysilicon 279 is embedded in the first outer pad trench 277B with the first pad separation insulation layer 278 interposed in between.

The polysilicon 279 forms an electrically floating state. The first pad separation structure 275 may also exclude the polysilicon 279, but includes the first pad separation insulation layer 278 serving as an integral body embedded in the first inner pad trench 277A. Furthermore, the first pad separation structure 275 may also exclude the polysilicon 279, but includes the first pad separation insulation layer 278 serving as an integral body embedded in the first outer pad trench 277B.

The second pad separation structure 276 is at an interval from the region separation structure 23 and forms a loop surrounding a portion of the second pad region 274 in top view. More specifically, assuming that a center line crosses the center portion of the first main surface 11 in the second direction Y, the second pad separation structure 276 forms a rectangular loop that crosses the center line.

Thus, the second pad separation structure 276 is opposite to the first apparatus region 21 and the second apparatus region 22 in the second direction Y. Furthermore, the second pad separation structure 276 separates a portion of the second pad region 274 by a band shape (specifically, a rectangle) extending along the first direction X. The second pad separation structure 276 may have any planar shape as desired. The second pad separation structure 276 may also be shaped as a polygonal loop or a circular loop.

Assuming that a center line crosses the center portion of the semiconductor chip 10 in the second direction Y, the second pad separation structure 276 is formed preferably by a layout of being line symmetric to the first pad separation structure 275 relative to the center line. Furthermore, the second pad separation structure 276 is formed preferably by a layout of being dot symmetric to the first pad separation structure 275 relative to the center portion of the semiconductor chip 10.

The second pad separation structure 276 has a trench insulation structure including a second pad separation trench 280 (a separation trench), a second pad separation insulation layer 281, and a polysilicon 282. In this embodiment, the second pad separation trench 280 has a double trench structure. More specifically, the second pad separation trench 280 includes a second inner pad trench 280A and a second outer pad trench 280B. The second pad separation trench 280 may also have a single trench structure including only either one of the second inner pad trench 280A and the second outer pad trench 280B.

The second inner pad trench 280A is shaped as a loop (a rectangular loop) surrounding a portion of the second pad region 274 in top view. The second inner pad trench 280A may have any planar shape as desired. The second inner pad trench 280A may also be shaped as a polygonal loop or a circular loop.

The second inner pad trench 280A is formed by excavating the first main surface 11 toward the second main surface 12. The second inner pad trench 280A penetrates the second semiconductor layer 15 till reaching the first semiconductor layer 14 (specifically, the concentration reducing layer 17).

The second inner pad trench 280A includes an inner peripheral wall, an outer peripheral wall and a bottom wall. The inner peripheral wall and the outer peripheral wall of the second inner pad trench 280A expose the first semiconductor layer 14 and the second semiconductor layer 15. The inner peripheral wall and the outer peripheral wall of the second inner pad trench 280A may be formed as being perpendicular to the first main surface 11. The inner peripheral wall and the outer peripheral wall of the second inner pad trench 280A may also be formed as inclining relative to the first main surface 11. In this case, the second inner pad trench 280A may be shaped as having a pointed front end and having a bottom area less than an opening area.

The bottom wall of the second inner pad trench 280A is close to the side of the concentration reducing layer 17 relative to the high concentration layer 16. The bottom wall of the second inner pad trench 280A exposes the concentration reducing layer 17. The second inner pad trench 280A may also be formed simultaneously with the region separation trench 24. In this case, the second inner pad trench 280A has a width and a depth equal to those of the region separation trench 24.

The second outer pad trench 280B is separated from the second inner pad trench 280A and is shaped as a loop (a rectangular loop) surrounding the second inner pad trench 280A in top view. The second outer pad trench 280B may have any planar shape as desired, which is not necessarily the same as the planar shape of the second inner pad trench 280A. The second outer pad trench 280B may also be shaped as a polygonal loop or a circular loop.

The second outer pad trench 280B is formed by excavating the first main surface 11 toward the second main surface 12. The second outer pad trench 280B penetrates the second semiconductor layer 15 till reaching the first semiconductor layer 14 (specifically, the concentration reducing layer 17).

The second outer pad trench 280B includes an inner peripheral wall, an outer peripheral wall and a bottom wall. The inner peripheral wall and the outer peripheral wall of the second outer pad trench 280B expose the first semiconductor layer 14 and the second semiconductor layer 15. The inner peripheral wall and the outer peripheral wall of the second outer pad trench 280B may be formed as being perpendicular to the first main surface 11. The inner peripheral wall and the outer peripheral wall of the second outer pad trench 280B may also be formed as inclining relative to the first main surface 11. In this case, the second outer pad trench 280B may be shaped as having a pointed front end and having a bottom area less than an opening area.

The bottom wall of the second outer pad trench 280B is close to the side of the concentration reducing layer 17 relative to the high concentration layer 16. The bottom wall of the second outer pad trench 280B exposes the concentration reducing layer 17. The second outer pad trench 280B may be formed simultaneously with the region separation trench 24. In this case, the second outer pad trench 280B has a width and a depth equal to those of the region separation trench 24. As such, the second outer pad trench 280B and the second inner pad trench 280A jointly form a double trench structure.

A trench gap between the second inner pad trench 280A and the second outer pad trench 280B may be equal to or more than 1 μm and equal to or less than 10 μm. The trench gap may also be equal to or more than 1 μm and equal to or less than 2 μm, equal to or more than 2 μm and equal to or less than 4 μm, equal to or more than 4 μm and equal to or less than 6 μm, equal to or more than 6 μm and equal to or less than 8 μm, or equal to or more than 8 μm and equal to or less than 10 μm. The trench gap is preferably equal to or more than 3 μm and equal to or less than 8 μm.

In this embodiment, the second inner pad trench 280A and the second outer pad trench 280B are formed by deep trenches having aspect ratios of more than 1. The aspect ratio is defined by the depth of the second inner pad trench 280A (the second outer pad trench 280B) relative to the width of the second inner pad trench 280A (the second outer pad trench 280B). The aspect ratio is preferably equal to or more than 5 and equal to or less than 20.

The second inner pad trench 280A (the second outer pad trench 280B) may have a width of equal to or more than 0.1 μm and equal to or less than 3 μm. The width of the second inner pad trench 280A (the second outer pad trench 280B) may also be equal to or more than 0.1 μm and equal to or less than 0.5 μm, equal to or more than 0.5 μm and equal to or less than 1 µm, equal to or more than 1 µm and equal to or less than 1.5 µm, equal to or more than 1.5 µm and equal to or less than 2 µm, equal to or more than 2 µm and equal to or less than 2.5 µm, or equal to or more than 2.5 µm and equal to or less than 3 µm. The width of the second inner pad trench 280A (the second outer pad trench 280B) is preferably equal to or more than 1.5 µm and equal to or less than 2.5 µm.

The second inner pad trench 280A (the second outer pad trench 280B) may have a depth of equal to or more than 1 µm and equal to or less than 50 µm. The depth of the second inner pad trench 280A (the second outer pad trench 280B) may also be equal to or more than 1 µm and equal to or less than 5 µm, equal to or more than 5 µm and equal to or less than 10 µm, equal to or more than 10 µm and equal to or less than 15 µm, equal to or more than 15 µm and equal to or less than 20 µm, equal to or more than 20 µm and equal to or less than 25 µm, equal to or more than 25 µm and equal to or less than 30 µm, equal to or more than 30 µm and equal to or less than 40 µm, or equal to or more than 40 µm and equal to or less than 50 µm. The depth of the second inner pad trench 280A (the second outer pad trench 280B) is preferably equal to or more than 15 µm and equal to or less than 35 µm.

The second pad separation insulation layer 281 is formed in the second pad separation trench 280. More specifically, the second pad separation insulation layer 281 is shaped as a film along the inner wall of the second inner pad trench 280A. Thus, the second pad separation insulation layer 281 separates a recessed space in the second inner pad trench 280A. Furthermore, the second pad separation insulation layer 281 is shaped as a film along the inner wall of the second outer pad trench 280B. Thus, the second pad separation insulation layer 281 separates a recessed space in the second outer pad trench 280B.

The second pad separation insulation layer 281 may include at least one of a silicon oxide layer and a silicon nitride layer. The second pad separation insulation layer 281 may have a laminated structure formed by laminating a silicon oxide layer and a silicon nitride layer according to any sequence. The second pad separation insulation layer 281 may also have a single-layer structure consisting of a silicon oxide layer or a silicon nitride layer. The second pad separation insulation layer 281 preferably consists of an insulation material the same as that of the region separation insulation layer 25. In this embodiment, the second pad separation insulation layer 281 has a single-layer structure consisting of a silicon oxide layer.

The polysilicon 282 is embedded in the second pad separation trench 280 with the second pad separation insulation layer 281 interposed in between. More specifically, the polysilicon 282 is embedded in the second inner pad trench 280A with the second pad separation insulation layer 281 interposed in between. Furthermore, the polysilicon 282 is embedded in the second outer pad trench 280B with the second pad separation insulation layer 281 interposed in between.

The polysilicon 282 forms an electrically floating state. The second pad separation structure 276 may also exclude the polysilicon 282, but includes a second pad separation insulation layer 281 serving as an integral body embedded in the second inner pad trench 280A. Furthermore, the second pad separation structure 276 may also exclude the polysilicon 282, but includes a second pad separation insulation layer 281 serving as an integral body embedded in the second outer pad trench 280B.

Referring to FIG. 2 to FIG. 9, in the first pad region 273, a first internal parasitic capacitance C1 is formed in a region surrounded by the first pad separation structure 275. The first internal parasitic capacitance C1 is formed between the first semiconductor layer 14 and the second semiconductor layer 15.

Furthermore, in the second pad region 274, a second internal parasitic capacitance C2 is formed in a region surrounded by the second pad separation structure 276. The second internal parasitic capacitance C2 is formed between the first semiconductor layer 14 and the second semiconductor layer 15. The second internal parasitic capacitance C2 is connected in series to the first internal parasitic capacitance C1 via the semiconductor chip 10 (the first semiconductor layer 14).

The second internal parasitic capacitance C2 is preferably equal to the first internal parasitic capacitance C. That is to say, a configuration below is preferred: the first pad separation structure 275 separates a partial region of the first pad region 273 by a first pad area in top view, and the second pad separation structure 276 separates a partial region of the second pad region 274 by a second pad area equal to the first pad area in top view.

Referring to FIG. 2 to FIG. 9, the diode chip 1 includes a first pin junction portion (p-intrinsic-n junction portion) 31 formed at a surface layer portion of the first apparatus region 21 in a first polarity direction. The first pin junction portion 31 has a first pin diode D1 formed at the surface layer portion of the first apparatus region 21.

The term "polarity direction" indicates a direction in which a forward current flows (that is, the direction of the polarity of a diode). The first polarity direction is a direction in which a forward current flows along the thickness direction of the semiconductor chip 10 (that is, the normal direction Z). In this embodiment, the first polarity direction is a direction in which a forward current flows from the side of the second main surface 12 to the side of the first main surface 11.

The first pin junction portion 31 forms a region on one side (the side of the first side surface 13A) at the surface layer portion of the first apparatus region 21 in top view. The first pin junction portion 31 includes an $n^+$-type first N layer 32 (a first upper semiconductor layer), an n-type first I layer 33 (a first resistance layer) and a $p^+$-type first P layer 34 (a first lower semiconductor layer) sequentially formed from the surface layer portion of the first apparatus region 21 toward the thickness direction.

The first N layer 32 is formed at the surface layer portion of the second semiconductor layer 15. The first N layer 32 is shaped as a circle (including an oval) in top view. The first N layer 32 may have any planar shape as desired. The first N layer 32 may be shaped as a polygon (for example, a quadrilateral).

The first N layer 32 may have an n-type impurity concentration more than the n-type impurity concentration of the second semiconductor layer 15. The n-type impurity concentration of the first N layer 32 may have a peak of equal to or more than $1\times10^{18}$ cm$^{-3}$ and equal to or less than $1\times10^{21}$ cm$^{-3}$. The peak of the n-type impurity concentration of the first N layer 32 is preferably equal to or more than $5\times10^{19}$ cm$^{-3}$ and equal to or less than $1\times10^{20}$ cm$^{-3}$.

The first I layer 33 is formed by the second semiconductor layer 15. The first I layer 33 has an n-type impurity concentration equal to the n-type impurity concentration of the second semiconductor layer 15. The n-type impurity concentration of the first I layer 33 may have a peak of equal to or more than $1\times10^{13}$ cm$^{-3}$ and equal to or less than $1\times10^{15}$ cm$^{-3}$. The peak of the n-type impurity concentration of the first I layer 33 is preferably equal to or more than $5\times10^{13}$ cm$^{-3}$ and equal to or less than $5\times10^{14}$ cm$^{-3}$.

The first P layer 34 is formed at a boundary portion of the first semiconductor layer 14 (specifically, the concentration keeping layer 18) and the second semiconductor layer 15. The first P layer 34 is opposite to the global range of the first N layer 32 with the first I layer 33 interposed in between. The first P layer 34 is opposite to the concentration reducing layer 17 with a portion of the concentration keeping layer 18 interposed in between.

The first P layer 34 has a width more than the width of the first N layer 32 in top view. The periphery of the first P layer 34 surrounds the first N layer 32 in top view. The first P layer 34 is shaped as a circle (including an oval) in top view. The first P layer 34 may have any planar shape as desired. The first P layer 34 may also be shaped as a polygon (e.g., a quadrilateral).

The first P layer 34 has a p-type impurity concentration more than the n-type impurity concentration of the first I layer 33. Furthermore, the first P layer 34 has a p-type impurity concentration more than the p-type impurity concentration of the concentration keeping layer 18. The first P layer 34 may also have a p-type impurity concentration more than the p-type impurity concentration of the high concentration layer 16. The p-type impurity concentration of the first P layer 34 may have a peak of equal to or more than $1\times10^{18}$ cm$^{-3}$ and equal to or less than $1\times10^{21}$ cm$^{-3}$. The peak of the p-type impurity concentration of the first P layer 34 is preferably equal to or more than $5\times10^{18}$ cm$^{-3}$ and equal to or less than $1\times10^{20}$ cm$^{-3}$.

The first N layer 32, the first I layer 33 and the first P layer 34 form a pin junction in the thickness direction (that is, the normal direction Z) of the semiconductor chip 10. Thus, a first pin diode D1 having the first N layer 32 as a cathode and the first P layer 34 as an anode is formed at the surface layer portion of the first apparatus region 21. The anode of the first pin diode D1 is electrically connected to the first semiconductor layer 14.

Referring to FIG. 2 to FIG. 9, the diode chip 10 includes a first pn junction portion 35 separated from the first pin junction portion 31 and formed inside the first apparatus region 21 in the first polarity direction. The first pn junction portion 35 has a first Zener diode DZ1 formed inside the first apparatus region 21.

The first pn junction 35 is electrically connected to the first pin junction portion 31 via the semiconductor chip 10 (the first semiconductor layer 14). More specifically, the first pn junction portion 35 is reverse bias connected to the first pin junction portion 31 via the semiconductor chip 10 (the first semiconductor layer 14).

The first pn junction portion 35 includes, inside the first apparatus region 21, an n$^+$-type first internal N layer 36 (the first inner semiconductor layer) forming a pn junction between the first pn junction 35 and the first semiconductor layer 14 (specifically, the concentration keeping layer 18). The first internal N layer 36 is formed at a boundary portion of the first semiconductor layer 14 (specifically, the concentration keeping layer 18) and the second semiconductor layer 15. The first internal N layer 36 is formed in a region other than the first pin junction portion 31 (specifically, the first P layer 34) in the first apparatus region 21. The first internal N layer 36 may be formed in a substantially global range other than the first pin junction portion 31 (the first P layer 34).

The first internal N layer 36 has an inner peripheral portion surrounding the first pin junction portion 31 (the first P layer 34). The first inner peripheral portion of the first internal N layer 36 may be connected to the first P layer 34, or be separated from the first P layer 34. The first internal N layer 36 has an outer peripheral portion that may be located outside the first apparatus region 21. That is to say, the outer peripheral portion of the first internal N layer 36 may be separated from an inner portion of the first internal N layer 36 by the first region separation structure 23A.

Referring to FIG. 10, the first internal N layer 36 has an n-type impurity concentration more than the n-type impurity concentration of the second semiconductor layer 15. In FIG. 10, the n-type impurity concentration gradient of the first internal N layer 36 is represented by a dotted line. The first internal N layer 36 has an n-type impurity concentration more than the p-type impurity concentration of the concentration keeping layer 18. The n-type impurity concentration of the first internal N layer 36 may have a peak of equal to or more than $1\times10^{18}$ cm$^{-3}$ and equal to or less than $1\times10^{21}$ cm$^{-3}$. The peak of the n-type impurity concentration of the first internal N layer 36 is preferably equal to or more than $5\times10^{18}$ cm$^{-3}$ and equal to or less than $1\times10^{20}$ cm$^{-3}$.

The first pn junction 35 forms a first Zener diode DZ1 having the first internal N layer 36 as a cathode and the first semiconductor layer 14 (specifically, the concentration keeping layer 18) as an anode. The anode of the first Zener diode DZ1 is reverse bias connected to the anode of the first pin diode D1 via the semiconductor chip 10 (the first semiconductor layer 14).

When the first semiconductor layer 14 does not have the concentration keeping layer 18, a pn junction is formed between the first internal N layer 36 and the concentration reducing layer 17. In this case, the change in the pn concentration of the first pn junction portion 35 becomes drastic, and hence it is possible that an actual withstand voltage (specifically, a breakdown voltage VB) starts to change from a target withstand voltage, starting from the first pn junction portion 35. Such issue is aggravated by a difference (for example, ±5%) in the thickness of the concentration reducing layer 17.

Therefore, in the diode chip 1, the concentration keeping layer 18 is formed on the concentration reducing layer 17, thereby moderating the pn concentration change of the first pn junction portion 35. Thus, the change of the withstand voltage (specifically, the breakdown voltage VB) starting from the first pn junction portion 35 may be suppressed. Furthermore, even if a difference in the thickness of the concentration reducing layer 17 occurs, the change of the withstand voltage caused by the difference in the thickness of the concentration reducing layer 17 may still be reliably suppressed by the concentration keeping layer 18 having a specified thickness formed. Furthermore, even if a difference in the thickness of the concentration keeping layer 18 occurs, the change of the withstand voltage caused by the difference in the thickness of the concentration keeping layer 18 may still be reliably suppressed as the pn concentration change is moderate.

Referring to FIG. 2 to FIG. 9, the diode chip 1 includes a first reversed pin junction portion (reverse p-intrinsic-n junction portion) 38. The first reversed pin junction portion 38 is formed at the surface layer portion of the first apparatus region 21 in a second polarity direction in a manner of being reverse bias connected to the first pn junction portion 35.

The second polarity direction is a direction in which a forward current flows opposite to the first polarity direction in the thickness direction of the semiconductor chip 10. In this embodiment, the second polarity direction is a direction in which a forward current flows from the side of the first main surface 11 to the side of the second main surface 12.

The first reversed pin junction portion 38 has a first reversed pin diode DR1 formed at the surface layer portion of the first apparatus region 21. A first diode pair 37 (a first rectifier pair) is formed between the first reversed pin junction portion 38 and the first pn junction portion 35.

The first reversed pin junction portion 38 is separated from the first pin junction portion 31 and is formed in a region on the other side (the side of the second side surface 13B) of the surface layer portion of the first apparatus region 21 in top view. Assuming that a line crosses the first pin junction portion 31 in the second direction Y, the first reversed pin junction portion 38 is configured on the line. That is to say, the first reversed pin junction portion 38 is opposite to the first pin junction portion 31 in the second direction Y.

The first reversed pin junction portion 38 includes a p$^+$-type first reversed P layer 39 (a first upper reversed semiconductor layer), an n-type first reversed I layer 40 (a first reversed resistance layer) and an n$^+$-type first reversed N layer 41 (a first lower reversed semiconductor layer) sequentially formed from the surface layer portion of the first apparatus region 21 toward the thickness direction.

The first reversed P layer 39 is formed at the surface layer portion of the second semiconductor layer 15. The first reversed P layer 39 has a p-type impurity concentration more than the n-type impurity concentration of the second semiconductor layer 15. The p-type impurity concentration of the first reversed P layer 39 may have a peak of equal to or more than $1\times10^{18}$ cm$^{-3}$ and equal to or less than $1\times10^{21}$ cm$^{-3}$. The peak of the p-type impurity concentration of the first reversed P layer 39 is preferably equal to or more than $5\times10^{18}$ cm$^{-3}$ and equal to or less than $1\times10^{20}$ cm$^{-3}$.

The first reversed P layer 39 is shaped as a circle (including an oval) in top view. The first reversed P layer 39 may have any planar shape as desired. The first reversed P layer 39 may also be shaped as a polygon (for example, a quadrilateral).

The first reverse P layer 39 has a first planar area S1. The first planar area S1 may be equal to or more than 1000 µm$^2$ and equal to or less than 10000 µm$^2$. The first planar area S1 may also be equal to or more than 1000 µm$^2$ and equal to or less than 2000 µm$^2$, equal to or more than 2000 µm$^2$ and equal to or less than 4000 µm$^2$, equal to or more than 4000 µm$^2$ and equal to or less than 6000 µm$^2$, equal to or more than 6000 µm$^2$ and equal to or less than 8000 µm$^2$, or equal to or more than 8000 µm$^2$ and equal to or less than 10000 µm$^2$.

The first reversed I layer 40 is formed by the second semiconductor layer 15. The first reversed I layer 40 has an n-type impurity concentration equal to the n-type impurity concentration of the second semiconductor layer 15. The n-type impurity concentration of the first reversed I layer 40 may have a peak of equal to or more than $1\times10^{13}$ cm$^{-3}$ and equal to or less than $1\times10^{15}$ cm$^{-3}$. The peak of the n-type impurity concentration of the first reversed I layer 40 is preferably equal to or more than $5\times10^{13}$ cm$^{-3}$ and equal to or less than $5\times10^{14}$ cm$^{-3}$.

The first reversed N layer 41 is formed at a boundary portion of the first semiconductor layer 14 (specifically, the concentration keeping layer 18) and the second semiconductor layer 15. The first reversed N layer 41 is formed by the first internal N layer 36 that is a portion of the first pn junction portion 35. Therefore, the first reversed N layer 41 (the first internal N layer 36) is opposite to a global range of the first reversed N layer 41 with the first reversed I layer 40 interposed in between.

The first reversed P layer 39, the first reversed I layer 40 and the first reversed N layer 41 form a pin junction in the thickness direction (that is, the normal direction Z) of the semiconductor chip 10. Thus, the first reversed pin diode DR1 having the first reversed P layer 39 as an anode and the first reversed N layer 41 as a cathode is formed. The cathode of the first reversed pin diode DR1 is connected to the cathode of the first Zener diode DZ1.

Thus, the first diode pair 37 including the first Zener diode DZ1 and the first reversed pin diode DR1 reverse bias connected in series to the first Zener diode DZ1 is formed. The first diode pair 37 is connected in parallel to the first pin diode D1 via the semiconductor chip 10 (the first semiconductor layer 14). As such, a first parallel circuit 42 including the first pin diode D1 and the first diode pair 37 is formed.

Referring to FIG. 2 to FIG. 9, the diode chip 1 includes a first junction separation structure 45. The first junction separation structure 45 is formed in the first apparatus region 21, and separates the first pin junction portion 31 from the first pn junction portion 35 and the first reversed pin junction portion 38.

The first junction separation structure 45 includes a first junction separation trench 46 (a first junction separation trench), a first junction separation insulation layer 47 and a polysilicon 48. In this embodiment, the first junction separation trench 46 has a double trench structure that surrounds the first pin junction portion 31 in a manner of sandwiching the boundary between the first pin junction portion 31 (the first P layer 34) and the first pn junction portion 35 (the first internal N layer 36) from both sides. More specifically, the first junction separation trench 46 includes a first inner trench 46A and first outer trench 46B.

The first inner trench 46A is shaped as a loop (a circular loop in this embodiment) surrounding the first pin junction portion 31 in top view. The first inner trench 46A may have any planar shape as desired. The first inner trench 46A may also be shaped as a polygonal loop (for example, a quadrilateral loop) or a circular loop (including an oval loop).

The first inner trench 46A is formed by excavating the first main surface 11 toward the second main surface 12. The first inner trench 46A penetrates the first P layer 34 of the first pin junction portion 31 till reaching the first semiconductor layer 14 (specifically, the concentration reducing layer 17).

The first inner trench 46A includes an inner peripheral wall, an outer peripheral wall and a bottom wall. The inner peripheral wall of the first inner trench 46A exposes the inner portion of the first P layer 34. The outer peripheral wall of the first inner trench 46A exposes the peripheral portion of the first P layer 34. Thus, the first inner trench 46A electrically separates the peripheral portion of the first P layer 34 from the first pin junction portion 31.

The inner peripheral wall and the outer peripheral wall of the first inner trench 46A may be formed as being perpendicular to the first main surface 11. The inner peripheral wall and the outer peripheral wall of the first inner trench 46A may also be formed as inclining relative to the first main surface 11. In this case, the first inner trench 46A may be shaped as having a pointed front end and having a bottom area less than an opening area.

The bottom wall of the first inner trench 46A is close to the side of the concentration reducing layer 17 relative to the high concentration layer 16. The bottom wall of the first inner trench 46A exposes the concentration reducing layer 17. The first inner trench 46A may also be formed simultaneously with the region separation trench 24. In this case, the first inner trench 46A has a width and a depth equal to those of the region separation trench 24.

The first outer trench 46B is separated from the first inner trench 46A, and is shaped as a loop (a circular loop in this embodiment) surrounding the first inner trench 46A in top view. The first outer trench 46B may have any planar shape, which is not necessarily the same as the planar shape of the first inner trench 46A. The first outer trench 46B may also be shaped as a polygonal loop (for example, a quadrilateral loop) or a circular loop (including an oval loop).

The first outer trench 46B is formed by excavating the first main surface 11 toward the second main surface 12. The first outer trench 46B penetrates the first internal N layer 36 (the first reversed N layer 41) of the first pn junction portion 35 till reaching the first semiconductor layer 14 (specifically, the concentration reducing layer 17).

The first outer trench 46B includes an inner peripheral wall, an outer peripheral wall and a bottom wall. The inner peripheral wall of the first outer trench 46B exposes the inner peripheral portion of the first internal N layer 36 (the first reversed N layer 41). The outer peripheral wall of the first outer trench 46B exposes the inner portion of the first internal N layer 36 (the first reversed N layer 41). Thus, the first outer trench 46B electrically separates the inner peripheral portion of the first internal N layer 36 (the first reversed N layer 41) from the first pn junction portion 35 and the first reversed pin junction portion 38.

The inner peripheral wall and the outer peripheral wall of the first outer trench 46B may be formed as being perpendicular to the first main surface 11. The inner peripheral wall and the outer peripheral wall of the first outer trench 46B may also be formed as inclining relative to the first main surface 11. In this case, the first outer trench 46B may be shaped as having a pointed front end and having a bottom area less than an opening area.

The bottom wall of the first outer trench 46B is close to the side of the concentration reducing layer 17 relative to the high concentration layer 16. The bottom wall of the first outer trench 46B exposes the concentration reducing layer 17. The first outer trench 46B may also be formed simultaneously with the region separation trench 24. In this case, the first outer trench 46B has a width and a depth equal to those of the region separation trench 24.

A trench gap between the first inner trench 46A and the first outer trench 46B may be equal to or more than 1 μm and equal to or less than 10 μm. The trench gap may also be equal to or more than 1 μm and equal to or less than 2 μm, equal to or more than 2 μm and equal to or less than 4 μm, equal to or more than 4 μm and equal to or less than 6 μm, equal to or more than 6 μm and equal to or less than 8 μm, or equal to or more than 8 μm and equal to or less than 10 μm. The trench gap is preferably equal to or more than 3 μm and equal to or less than 8 μm.

In this embodiment, the first inner trench 46A and the first outer trench 46B are respectively formed by deep trenches having aspect ratios of more than 1. The aspect ratio is defined by the depth of the first inner trench 46A (the first outer trench 46B) relative to the width of the first inner trench 46A (the first outer trench 46B). The aspect ratio is preferably equal to or more than 5 and equal to or less than 20.

The first inner trench 46A (the first outer trench 46B) may have a width of equal to or more than 0.1 μm and equal to or less than 3 μm. The width of the first inner trench 46A (the first outer trench 46B) may also be equal to or more than 0.1 μm and equal to or less than 0.5 μm, equal to or more than 0.5 μm and equal to or less than 1 μm, equal to or more than 1 μm and equal to or less than 1.5 μm, equal to or more than 1.5 μm and equal to or less than 2 μm, equal to or more than 2 μm and equal to or less than 2.5 μm, or equal to or more than 2.5 μm and equal to or less than 3 μm. The width of the first inner trench 46A (the first outer trench 46B) is preferably equal to or more than 1.5 μm and equal to or less than 2.5 μm.

The first inner trench 46A (the first outer trench 46B) may have a depth of equal to or more than 1 μm and equal to or less than 50 μm. The depth of the first inner trench 46A (the first outer trench 46B) may also be equal to or more than 1 μm and equal to or less than 5 μm, equal to or more than 5 μm and equal to or less than 10 μm, equal to or more than 10 μm and equal to or less than 15 μm, equal to or more than 15 μm and equal to or less than 20 μm, equal to or more than 20 μm and equal to or less than 25 μm, equal to or more than 25 μm and equal to or less than 30 μm, equal to or more than 30 μm and equal to or less than 40 μm, or equal to or more than 40 μm and equal to or less than 50 μm. The depth of the first inner trench 46A (the first outer trench 46B) is preferably equal to or more than 15 μm and equal to or less than 35 μm.

As such, the first outer trench 46B and the first inner trench 46A jointly form a double trench structure sandwiching the boundary between the first pin junction portion 31 (the first P layer 34) and the first pn junction portion 35 (the first internal N layer 36) from both sides.

The first junction separation insulation layer 47 is formed in the first junction separation trench 46. More specifically, the first junction separation insulation layer 47 is shaped as a film along the inner wall of the first inner trench 46A. Thus, the first junction separation insulation layer 47 separates a recessed space in the first inner trench 46A. Furthermore, the first junction separation insulation layer 47 is shaped as a film along the inner wall of the first outer trench 46B. Thus, the first junction separation insulation layer 47 separates a recessed space in the first outer trench 46B.

The first junction separation insulation layer 47 may include at least one of a silicon oxide layer and a silicon nitride layer. The first junction separation insulation layer 47 may have a laminated structure formed by laminating a silicon oxide layer and a silicon nitride layer according to any sequence. The first junction separation insulation layer 47 may also be a single-layer structure consisting of a silicon oxide layer or a silicon nitride layer. The first junction separation insulation layer 47 preferably consists of an insulation material the same as that of the region separation insulation layer 25. In this embodiment, the first junction separation insulation layer 47 has a single-layer structure consisting of a silicon oxide layer.

The polysilicon 48 is embedded in the first junction separation trench 46 with the first junction separation insulation layer 47 interposed in between. More specifically, the polysilicon 48 is embedded in the first inner trench 46A with the first junction separation insulation layer 47 interposed in between. Furthermore, the polysilicon 48 is embedded in the first outer trench 46B with the first junction separation insulation layer 47 interposed in between.

The polysilicon 48 forms an electrically floating state. The first junction separation structure 45 may also exclude the polysilicon 48, but includes the first junction separation insulation layer 47 as an integral body embedded in the first inner trench 46A. Furthermore, the first junction separation structure 45 may also exclude the polysilicon 48, but includes the first junction separation insulation layer 47 as an integral body embedded in the first outer trench 46B.

In this embodiment, an example in which the first junction separation trench 46 has a double trench structure that sandwiches the boundary between the first pin junction portion 31 and the first pn junction portion 35 from both sides is described. However, the first junction separation trench 46 may also have a single trench structure that crosses the boundary between the first pin junction portion 31 and the first pn junction portion 35. In this case, the first junction separation trench 46 becomes a structure in which the first inner trench 46A and the first outer trench 46B are an integral.

Referring to FIG. 2 to FIG. 9, the diode chip 1 includes a second pin junction portion 51 formed at the surface layer portion of the second apparatus region 22 in the first polarity direction. The second pin junction portion 51 has a second pin diode D2 formed at the surface layer portion of the second apparatus region 22.

The second pin junction portion 51 is formed in a region on the other side (the side of the second side surface 13B) at the surface layer portion of the second apparatus region 22 in top view. Assuming that a line crosses the first reversed pin junction portion 38 in the first direction X, the second pin junction portion 51 is located on the line. Thus, the second pin junction portion 51 is opposite to the first reversed pin junction portion 38 in the first direction X. The second pin junction portion 51 is formed preferably in a layout of being dot symmetric to the first pin junction portion 31 relative to the center portion of the first main surface 11.

The second pin junction portion 51 includes an $n^+$-type second N layer 52 (a second upper semiconductor layer), an n-type second I layer 53 (a second resistance layer) and a $p^+$-type second P layer 54 (a second lower semiconductor layer) sequentially formed from the surface layer portion of the second apparatus region 22 toward the thickness direction.

The second N layer 52 is formed at the surface layer portion of the second semiconductor layer 15. The second N layer 52 is shaped as a circle (including an oval) in top view. The second N layer 52 may have any planar shape as desired. The second N layer 52 may be shaped as a polygon (e.g., a quadrilateral).

The second N layer 52 may have an n-type impurity concentration more than the n-type impurity concentration of the second semiconductor layer 15. The n-type impurity concentration of the second N layer 52 may have a peak of equal to or more than $1 \times 10^{18}$ cm$^{-3}$ and equal to or less than $1 \times 10^{21}$ cm$^{-3}$. The peak of the n-type impurity concentration of the second N layer 52 is preferably equal to or more than $5 \times 10^{18}$ cm$^-$ and equal to or less than $1 \times 10^{20}$ cm$^{-3}$. The n-type impurity concentration of the second N layer 52 is preferably equal to the n-type impurity concentration of the first N layer 32 of the first pin junction portion 31.

The second I layer 53 is formed by the second semiconductor layer 15. The second I layer 53 has an n-type impurity concentration equal to the n-type impurity concentration of the second semiconductor layer 15. The n-type impurity concentration of the second I layer 53 may have a peak of equal to or more than $1 \times 10^{13}$ cm$^{-3}$ and equal to or less than $1 \times 10^{15}$ cm$^{-3}$. The peak of the n-type impurity concentration of the second I layer 53 is preferably equal to or more than $5 \times 10^{13}$ cm$^{-3}$ and equal to or less than $5 \times 10^{14}$ cm$^{-3}$. The n-type impurity concentration of the second I layer 53 is preferably equal to the n-type impurity concentration of the first I layer 33 of the first pin junction portion 31.

The second P layer 54 is formed at a boundary portion of the first semiconductor layer 14 (specifically, the concentration keeping layer 18) and the second semiconductor layer 15. The second P layer 54 is opposite to a full range of the second N layer 52 with the second I layer 53 interposed in between. The second P layer 54 is opposite to the concentration reducing layer 17 with a portion of the concentration keeping layer 18 interposed in between.

The second P layer 54 has a width more than the width of the second N layer 52 in top view. Thus, the periphery of the second P layer 54 surrounds the second N layer 52 in top view. The second P layer 54 is shaped as a circle (including an oval) in top view. The second P layer 54 may have any planar shape as desired. The second P layer 54 may also be shaped as a polygon (e.g., a quadrilateral).

The second P layer 54 has a p-type impurity concentration more than the n-type impurity concentration of the second I layer 53. Furthermore, the second P layer 54 has a p-type impurity concentration more than the p-type impurity concentration of the concentration keeping layer 18. The second P layer 54 may also have a p-type impurity concentration more than the p-type impurity concentration of the high concentration layer 16.

The p-type impurity concentration of the second P layer 54 may have a peak of equal to or more than $1 \times 10^{18}$ cm$^{-3}$ and equal to or less than $1 \times 10^{21}$ cm$^{-3}$. The peak of the p-type impurity concentration of the second P layer 54 is preferably equal to or more than $5 \times 10^{18}$ cm$^{-3}$ and equal to or less than $1 \times 10^{20}$ cm$^{-3}$. The second P layer 54 preferably has a p-type impurity concentration equal to that of the first P layer 34 of the first pin junction portion 31.

The second N layer 52, the second I layer 53 and the second P layer 54 form a pin junction in the thickness direction (that is, the normal direction Z) of the semiconductor chip 10. Thus, the second pin diode D2 having the second N layer 52 as a cathode and the second P layer 54 as an anode is formed at the surface layer portion of the second apparatus region 22. The anode of the second pin diode D2 is electrically connected to the first semiconductor layer 14. The anode of the second pin diode D2 is reverse bias connected to the anode of the first pin diode D1 via the semiconductor chip 10 (the first semiconductor layer 14).

Referring to FIG. 2 to FIG. 9, the diode chip 1 includes a second pn junction portion 55 separated from the second pin junction portion 51 and formed inside the second apparatus region 22 in the first polarity direction. The second pn junction portion 55 has a second Zener diode DZ2 formed inside the second apparatus region 22.

The second pn junction portion 55 includes, inside the second apparatus region 22, an $n^+$-type second internal N layer 56 (a second internal semiconductor layer) forming a pn junction between the second pn junction portion 55 and the first semiconductor layer 14 (specifically, the concentration keeping layer 18). The second internal N layer 56 is formed at the boundary between the first semiconductor layer 14 (specifically, the concentration keeping layer 18) and the second semiconductor layer 15. The second internal N layer 56 is formed in a region other than the second pin junction portion 51 (specifically, the second P layer 54) in the second apparatus region 22. The second internal N layer 56 may be formed in a substantially global range other than the second pin junction portion 51 (the second P layer 54).

The second internal N layer 56 has an inner peripheral portion surrounding the second pin junction portion 51 (the second P layer 54). The inner peripheral portion of the second internal N layer 56 may be connected to the second P layer 54, or be separated from the second P layer 54. The outer peripheral portion of the second internal N layer 56 may be located outside the second apparatus region 22. That is to say, the outer peripheral portion of the second internal N layer 56 may be separated from an inner portion of the second internal N layer 56 by the second region separation structure 23B. The outer peripheral portion of the second internal N layer 56 may also be formed as an integral with the outer peripheral portion of the first internal N layer 36 at the boundary between the first apparatus region 21 and the second apparatus region 22.

Referring to FIG. 10, the second internal N layer 56 has an n-type impurity concentration more than the n-type impurity concentration of the second semiconductor layer 15. In FIG. 10, the n-type impurity concentration gradient of the first internal N layer 36 and the n-type impurity concentration gradient of the second internal N layer 56 are represented by dotted lines. The second internal N layer 56 has an n-type impurity concentration more than the p-type impurity concentration of the concentration keeping layer 18.

The n-type impurity concentration of the second internal N layer 56 may have a peak of equal to or more than $1\times10^{18}$ cm$^{-3}$ and equal to or less than $1\times10^{21}$ cm$^{-3}$. The peak of the n-type impurity concentration of the second internal N layer 56 is preferably equal to or more than $5\times10^{18}$ cm$^{-3}$ and equal to or less than $1\times10^{20}$ cm$^{-3}$. The n-type impurity concentration of the second internal N layer 56 is preferably equal to the n-type impurity concentration of the first internal N layer 36 of the first pn junction portion 35.

The second pn junction portion 55 forms a second Zener diode DZ2 having the second internal N layer 56 as a cathode and the first semiconductor layer 14 (specifically, the concentration keeping layer 18) as an anode. The anode of the second Zener diode DZ2 is reverse bias connected to the anode of the first pin diode D1 and the anode of the second pin diode D2 via the semiconductor chip 10 (the first semiconductor layer 14).

When the first semiconductor layer 14 does not include the concentration keeping layer 18, a pn junction is formed between the second internal N layer 56 and the concentration reducing layer 17. In this case, the pn concentration change of the second pn junction portion 55 becomes drastic, and it is possible that an actual withstand voltage (specifically, a breakdown voltage VB) starts to change from a target withstand voltage, starting from the second pn junction portion 55. Such issue is aggravated by a difference (for example, ±5%) in the thickness of the concentration reducing layer 17.

Hence, in the diode chip 1, the concentration keeping layer 18 is formed on the concentration reducing layer 17, thereby moderating the concentration change of the second pn junction portion 55. Thus, the change of the withstand voltage (specifically, the breakdown voltage VB) starting from the second pn junction portion 55 may be suppressed. Furthermore, even if a difference in the thickness of the concentration reducing layer 17 occurs, the change of the withstand voltage caused by the difference in the thickness of the concentration reducing layer 17 may still be reliably suppressed by the concentration keeping layer 18 having a specified thickness formed. Furthermore, even if a difference in the thickness of the concentration keeping layer 18 occurs, the change of the withstand voltage caused by the difference in the thickness of the concentration keeping layer 18 may still be reliably suppressed as the pn concentration change is moderate.

Referring to FIG. 2 to FIG. 9, the diode chip 1 includes a second reversed pin junction portion 58. The second reversed pin junction portion 58 is formed at the surface layer portion of the second apparatus region 22 in the second polarity direction in a manner of being reverse bias connected to the second pn junction portion 55. The second reversed pin junction portion 58 has a second reversed pin diode DR2 formed at the surface layer portion of the second apparatus region 22. A second diode pair 57 (a second rectifier pair) is formed between the second reversed pin junction portion 58 and the second pn junction portion 55.

The second reversed pin junction portion 58 is separated from the second pin junction portion 51 and is formed in a region on one side (the side of the first side surface 13A) of the surface layer portion of the second apparatus region 22 in top view. Assuming that a line crosses the second pin junction portion 51 in the second direction Y, the second reversed pin junction portion 58 is configured on the line. Thus, the second reversed pin junction portion 58 is opposite to the second pin junction portion 51 in the second direction Y.

Furthermore, assuming that a line crosses the first pin junction portion 31 in the first direction X, the second reversed pin junction portion 58 is located on the line. Thus, the second reversed pin junction portion 58 is opposite to the first pin junction portion 31 in the first direction X. The second reversed pin junction portion 58 is formed preferably by a layout of being dot symmetric to the first reversed pin junction portion 38 relative to the center portion of the first main surface 11.

The second reversed pin junction portion 58 includes a p$^+$-type second reversed P layer 59 (a second upper reversed semiconductor layer), an n-type second reversed I layer 60 (a second reversed resistance layer) and an n$^+$-type second reversed N layer 61 (a second lower reversed semiconductor layer) sequentially formed from the surface layer portion of the second apparatus region 22 toward the thickness direction.

The second reversed P layer 59 is formed at the surface layer portion of the second semiconductor layer 15. The second reversed P layer 59 has a p-type impurity concentration more than the n-type impurity concentration of the second semiconductor layer 15. The p-type impurity concentration of the second reversed P layer 59 may have a peak of equal to or more than $1\times10^{18}$ cm$^{-3}$ and equal to or less than $1\times10^{21}$ cm$^{-3}$. The peak of the p-type impurity concentration of the second reversed P layer 59 is preferably equal to or more than $5\times10^{18}$ cm$^{-3}$ and equal to or less than $1\times10^{20}$ cm$^{-3}$. The p-type impurity concentration of the second reversed P layer 59 is preferably equal to the p-type impurity concentration of the first reversed P layer 39 of the first reversed pin junction portion 38.

The second reversed P layer 59 is shaped as a circle (including an oval) in top view. The second reversed P layer 59 may have any planar shape as desired. The second reversed P layer 59 may also be shaped as a polygon (for example, a quadrilateral).

The second reversed P layer 59 has a second planar area S2. The second planar area S2 may be equal to or more than 1000 µm$^2$ and equal to or less than 10000 µm$^2$. The second planar area S2 may also be equal to or more than 1000 µm$^2$ and equal to or less than 2000 µm$^2$, equal to or more than 2000 µm$^2$ and equal to or less than 4000 µm$^2$, equal to or more than 4000 µm$^2$ and equal to or less than 6000 µm$^2$, equal to or more than 6000 µm$^2$ and equal to or less than 8000 µm$^2$, or equal to or more than 8000 µm$^2$ and equal to or less than 10000 µm$^2$. The second planar area S2 is preferably equal to the first planar area S1 of the first reversed P layer 39.

The second reversed I layer 60 is formed by the second semiconductor layer 15. The second reversed I layer 60 has an n-type impurity concentration equal to the n-type impurity concentration of the second semiconductor layer 15. The n-type impurity concentration of the second reversed I layer 60 may have a peak of equal to or more than $1\times10^{13}$ cm$^{-3}$ and equal to or less than $1\times10^{15}$ cm$^{-3}$. The peak of the n-type impurity concentration of the second reversed I layer 60 is preferably equal to or more than $5\times10^{13}$ cm$^{-3}$ and equal to or less than $5\times10^{14}$ cm$^{-3}$.

The second reversed N layer 61 is formed at a boundary portion of the first semiconductor layer 14 (specifically, the concentration keeping layer 18) and the second semiconductor layer 15. The second reversed N layer 61 is formed by the second internal N layer 56 that is a portion of the second pn junction portion 55. Hence, the second reversed N layer 61 (the second internal N layer 56) is opposite to the global range of the second reversed N layer 61 with the second reversed I layer 60 interposed in between.

The second reversed P layer 59, the second reversed I layer 60 and the second reversed N layer 61 form a pin junction in the thickness direction (that is, the normal direction Z) of the semiconductor chip 10. Thus, the second reverse pin diode DR2 having the second reversed P layer 59 as an anode and the second reversed N layer 61 as a cathode is formed. The cathode of the second reversed pin diode DR2 is connected to the cathode of the second Zener diode DZ2.

Thus, the second diode pair 57 including the second Zener diode DZ2 and the second reversed pin diode DR2 reverse bias connected in series to the second Zener diode DZ2 is formed. The second diode pair 57 is connected in parallel to the second pin diode D2 via the semiconductor chip 10 (the first semiconductor layer 14). As such, a second parallel circuit 62 including the second pin diode D2 and the second diode pair 57 is formed. A TVS circuit 63 is formed between the second parallel circuit 62 and the first parallel circuit 42.

Referring to FIG. 2 to FIG. 9, the diode chip 1 includes a second junction separation structure 65. The second junction separation structure 65 is formed in the second apparatus region 22, and separates the second pin junction portion 51 from the second pn junction portion 55 and the second reversed pin junction portion 58.

The second junction separation structure 65 includes a second junction separation trench 66 (a second junction separation trench), a second junction separation insulation layer 67 and a polysilicon 68. In this embodiment, the second junction separation trench 66 has a double trench structure that surrounds the second pin junction portion 51 in a manner of sandwiching the boundary between the second pin junction portion 51 (the second P layer 54) and the second pn junction portion 55 (the second internal N layer 56) from both sides. More specifically, the second junction separation trench 66 includes a second inner trench 66A and second outer trench 66B.

The second inner trench 66A is shaped as a loop (a circular loop in this embodiment) surrounding the second pin junction portion 51 in top view. The second inner trench 66A may have any planar shape as desired. The second inner trench 66A may also be shaped as a polygonal loop (for example, a quadrilateral loop) or a circular loop (including an oval loop).

The second inner trench 66A is formed by excavating the first main surface 11 toward the second main surface 12. The second inner trench 66A penetrates the second P layer 54 of the second pin junction portion 51 till reaching the first semiconductor layer 14 (specifically, the concentration reducing layer 17).

The second inner trench 66A includes an inner peripheral wall, an outer peripheral wall and a bottom wall. The inner peripheral wall of the second inner trench 66A exposes the inner portion of the second P layer 54. The outer peripheral wall of the second inner trench 66A exposes the peripheral portion of the second P layer 54. Thus, the second inner trench 66A electrically separates the peripheral portion of the second P layer 54 from the second pin junction portion 51.

The inner peripheral wall and the outer peripheral wall of the second inner trench 66A may be formed as being perpendicular to the first main surface 11. The inner peripheral wall and the outer peripheral wall of the second inner trench 66A may also be formed as inclining relative to the first main surface 11. In this case, the second inner trench 66A may be shaped as having a pointed front end and having a bottom area less than an opening area.

The bottom wall of the second inner trench 66A is close to the side of the concentration reducing layer 17 relative to the high concentration layer 16. The bottom wall of the second inner trench 66A exposes the concentration reducing layer 17. The second inner trench 66A may also be formed simultaneously with the region separation trench 24. In this case, the second inner trench 66A has a width and a depth equal to those of the region separation trench 24.

The second outer trench 66B is separated from the second inner trench 66A, and is shaped as a loop (a circular loop in this embodiment) surrounding the second inner trench 66A in top view. The second outer trench 66B may have any planar shape, which is not necessarily the same as the planar shape of the second inner trench 66A. The second outer trench 66B may also be shaped as a polygonal loop (for example, a quadrilateral loop) or a circular loop (including an oval loop).

The second outer trench 66B is formed by excavating the first main surface 11 toward the second main surface 12. The second outer trench 66B penetrates the second internal N layer 56 (the second reversed N layer 61) of the second pn junction portion 55 till reaching the first semiconductor layer 14 (specifically, the concentration reducing layer 17).

The second outer trench 66B includes an inner peripheral wall, an outer peripheral wall and a bottom wall. The inner peripheral wall of the second outer trench 66B exposes the inner peripheral portion of the second internal N layer 56 (the second reversed N layer 61). The outer peripheral wall of the second outer trench 66B exposes the inner portion of the second internal N layer 56 (the second reversed N layer 61). Thus, the second outer trench 66B electrically separates the inner peripheral portion of the second internal N layer 56 (the second reversed N layer 61) from the second pn junction portion 55 and the second reversed pin junction portion 58.

The inner peripheral wall and the outer peripheral wall of the second outer trench 66B may be formed as being perpendicular to the first main surface 11. The inner peripheral wall and the outer peripheral wall of the second outer trench 66B may be formed as inclining relative to the first main surface 11. In this case, the second outer trench 66B may be shaped as having a pointed front end portion and having a bottom area less than an opening area.

The bottom wall of the second outer trench 66B is close to the side of the concentration reducing layer 17 relative to the high concentration layer 16. The bottom wall of the second outer trench 66B exposes the concentration reducing layer 17. The second outer trench 66B may also be formed simultaneously with the region separation trench 24. In this case, the second outer trench 66B has a width and a depth equal to those of the region separation trench 24.

A trench gap between the second inner trench 66A and the second outer trench 66B may be equal to or more than 1 μm and equal to or less than 10 μm. The trench gap may also be equal to or more than 1 μm and equal to or less than 2 μm, equal to or more than 2 μm and equal to or less than 4 μm, equal to or more than 4 µm and equal to or less than 6 µm, equal to or more than 6 µm and equal to or less than 8 µm, or equal to or more than 8 µm and equal to or less than 10 µm. The trench gap is preferably equal to or more than 3 µm and equal to or less than 8 µm.

In this embodiment, the second inner trench 66A and the second outer trench 66B may be respectively formed by deep trenches having aspect ratios of more than 1. The aspect ratio is defined by the depth of the second inner trench 66A (the second outer trench 66B) relative to the width of the second inner trench 66A (the second outer trench 66B). The aspect ratio is preferably equal to or more than 5 and equal to or less than 20.

The second inner trench 66A (the second outer trench 66B) may have a width of equal to or more than 0.1 µm and equal to or less than 3 µm. The width of the second inner trench 66A (the second outer trench 66B) may also be equal to or more than 0.1 µm and equal to or less than 0.5 µm, equal to or more than 0.5 µm and equal to or less than 1 µm, equal to or more than 1 µm and equal to or less than 1.5 µm, equal to or more than 1.5 µm and equal to or less than 2 µm, equal to or more than 2 µm and equal to or less than 2.5 µm, or equal to or more than 2.5 µm and equal to or less than 3 µm. The width of the second inner trench 66A (the second outer trench 66B) is preferably equal to or more than 1.5 µm and equal to or less than 2.5 µm.

The second inner trench 66A (the second outer trench 66B) may have a depth of equal to or more than 1 µm and equal to or less than 50 µm. The depth of the second inner trench 66A (the second outer trench 66B) may also be equal to or more than 1 µm and equal to or less than 5 µm, equal to or more than 5 µm and equal to or less than 10 µm, equal to or more than 10 µm and equal to or less than 15 µm, equal to or more than 15 µm and equal to or less than 20 µm, equal to or more than 20 µm and equal to or less than 25 µm, equal to or more than 25 µm and equal to or less than 30 µm, equal to or more than 30 µm and equal to or less than 40 µm, or equal to or more than 40 µm and equal to or less than 50 µm. The depth of the second inner trench 66A (the second outer trench 66B) is preferably equal to or more than 15 µm and equal to or less than 35 µm.

As such, the second outer trench 66B and the second inner trench 66A jointly form a double trench structure sandwiching the boundary between the second pin junction portion 51 (the second P layer 54) and the second pn junction portion 55 (the second internal N layer 56) from both sides.

The second junction separation insulation layer 67 is formed in the second junction separation trench 66. More specifically, the second junction separation insulation layer 67 is shaped as a film along the inner wall of the second inner trench 66A. Thus, the second junction separation insulation layer 67 separates a recessed space in the second inner trench 66A. Furthermore, the second junction separation insulation layer 67 is shaped as a film along the inner wall of the second outer trench 66B. Thus, the second junction separation insulation layer 67 separates a recessed space in the second outer trench 66B.

The second junction separation insulation layer 67 may include at least one of a silicon oxide layer and a silicon nitride layer. The second junction separation insulation layer 67 may have a laminated structure formed by laminating a silicon oxide layer and a silicon nitride layer according to any sequence. The second junction separation insulation layer 67 may also be a single-layer structure consisting of a silicon oxide layer or a silicon nitride layer. The second junction separation insulation layer 67 preferably consists of an insulation material the same as that of the region separation insulation layer 25. In this embodiment, the second junction separation insulation layer 67 has a single-layer structure consisting of a silicon oxide layer.

The polysilicon 68 is embedded in the second junction separation trench 66 with the second junction separation insulation layer 67 interposed in between. More specifically, the polysilicon 68 is embedded in the second inner trench 66A with the second junction separation insulation layer 67 interposed in between. Furthermore, the polysilicon 68 is embedded in the second outer trench 66B with the second junction separation insulation layer 67 interposed in between.

The polysilicon 68 forms an electrically floating state. The second junction separation structure 65 may also exclude the polysilicon 68, but includes the second junction separation insulation layer 67 as an integral body embedded in the second inner trench 66A. Furthermore, the second junction separation structure 65 may also exclude the polysilicon 68, but includes the second junction separation insulation layer 67 as an integral body embedded in the second outer trench 66B.

In this embodiment, an example in which the second junction separation trench 66 has a double trench structure that sandwiches the boundary between the second pin junction portion 51 and the second pn junction portion 55 from both sides is described. However, the second junction separation trench 66 may also have a single trench structure that crosses the boundary between the second pin junction portion 51 and the second pn junction portion 55. In this case, the second junction separation trench 66 becomes a structure in which the second inner trench 66A and the second outer trench 66B are an integral.

Referring to FIG. 2 to FIG. 9, the diode chip 1 includes a shielding structure 71 formed at the peripheral portion of the semiconductor chip 10. The shielding structure 71 is at an interval toward an inner side from the side surfaces 13A to 13D and is formed on the first main surface 11. The shielding structure 71 extends as a band shape along the side surfaces 13A to 13D in top view, and separates the apparatus forming region 272, the first pad region 273 and the second pad region 274 from a plurality of directions. More specifically, the shielding structure 71 forms a loop (a quadrilateral loop in this embodiment) surrounding the apparatus forming region 272, the first pad region 273 and the second pad region 274 altogether.

Thus, the shielding structure 71 separates the semiconductor chip 10 into an inner region 72, and an outer region 73 outside the inner region 72. The inner region 72 includes the apparatus forming region 272, the first pad region 273 and the second pad region 274. The shielding structure 71 protects the inner region 72 from influences of external forces applied to the outer region 73 or cracks generated at the outer region 73.

The shielding structure 71 consists of a material different form that of the semiconductor chip 10, and extends as a wall from the first main surface 11 to the second main surface 12. More specifically, the shielding structure 71 has a trench insulation structure including a shielding trench 74, a shielding insulation layer 75 and a polysilicon 76.

The shielding trench 74 is formed by excavating the first main surface 11 toward the second main surface 12. The shielding trench 74 penetrates the second semiconductor layer 15 till reaching the first semiconductor layer 14. More specifically, the shielding trench 74 penetrates the second semiconductor layer 15 and the concentration keeping layer 18 till reaching the concentration reducing layer 17.

The shielding trench 74 includes sidewalls and a bottom wall. The sidewalls of the shielding trench 74 may be formed as being perpendicular to the first main surface 11. The sidewalls of the shielding trench 74 may be formed as inclining relative to the first main surface 11. In this case, the shielding trench 74 may be shaped as having a pointed front end portion and having a bottom area less than an opening area.

The bottom wall of the shielding trench 74 is close to the side of the concentration reducing layer 17 relative to the high concentration layer 16. Thus, the sidewalls of the shielding trench 74 expose the second semiconductor layer 15, the concentration keeping layer 18 and the concentration reducing layer 17. Furthermore, the bottom wall of the shielding trench 74 exposes the concentration reducing layer 17. The shielding trench 74 may also be formed simultaneously with the region separation trench 24. In this case, the shielding trench 74 has a width and a depth equal to those of the region separation trench 24.

In this embodiment, the shielding trench 74 is formed by a deep trench having an aspect ratio of more than 1. The aspect ratio is defined by the depth of the shielding trench 74 relative to the width of the shielding trench 74. The aspect ratio is preferably equal to or more than 5 and equal to or less than 20.

The shielding trench 74 may have a width of equal to or more than 0.1 μm and equal to or less than 3 μm. The width of the shielding trench 74 may also be equal to or more than 0.1 μm and equal to or less than 0.5 μm, equal to or more than 0.5 μm and equal to or less than 1 μm, equal to or more than 1 μm and equal to or less than 1.5 μm, equal to or more than 1.5 μm and equal to or less than 2 μm, equal to or more than 2 μm and equal to or less than 2.5 μm, or equal to or more than 2.5 μm and equal to or less than 3 μm. The width of the shielding trench 74 is preferably equal to or more than 1.5 μm and equal to or less than 2.5 μm.

The shielding trench 74 may have a depth of equal to or more than 1 μm and equal to or less than 50 μm. The depth of the shielding trench 74 may be equal to or more than 1 μm and equal to or less than 5 μm, equal to or more than 5 μm and equal to or less than 10 μm, equal to or more than 10 μm and equal to or less than 15 μm, equal to or more than 15 μm and equal to or less than 20 μm, equal to or more than 20 μm and equal to or less than 25 μm, equal to or more than 25 μm and equal to or less than 30 μm, equal to or more than 30 μm and equal to or less than 40 μm, or equal to or more than 40 μm and equal to or less than 50 μm. The depth of the shielding trench 74 is preferably equal to or more than 15 μm and equal to or less than 35 μm.

The shielding insulation layer 75 is formed in the shielding trench 74. More specifically, the shielding insulation layer 75 is shaped as a film along the inner wall of the shielding trench 74. Thus, the shielding insulation layer 75 separates a recessed space in the shielding trench 74.

The shielding insulation layer 75 may include at least one of a silicon oxide layer and a silicon nitride layer. The shielding insulation layer 75 may have a laminated structure formed by laminating a silicon oxide layer and a silicon nitride layer according to any sequence. The shielding insulation layer 75 may also be a single-layer structure consisting of a silicon oxide layer or a silicon nitride layer. The shielding insulation layer 75 preferably consists of an insulation material the same as that of the region separation insulation layer 25. In this embodiment, the shielding insulation layer 75 has a single-layer structure consisting of a silicon oxide layer.

The polysilicon 76 is embedded in the shielding trench 74 with the shielding insulation layer 75 interposed in between. The polysilicon 76 forms an electrically floating state. The shielding structure 71 may also exclude the polysilicon 76, but includes the shielding insulation layer 75 serving as an integral body embedded in the shielding trench 74.

Referring to FIG. 2 to FIG. 9, the diode chip 1, at the periphery of the first main surface 11, includes a $p^+$-type outer impurity layer 80 formed at the surface layer portion of the first main surface 11. The outer impurity layer 80 suppresses leakage current between the first semiconductor layer 14 and the second semiconductor layer 15 at the periphery of the semiconductor chip 10.

The outer impurity layer 80 is formed in a region between the shielding structure 71 and the side surfaces 13A to 13D (that is, the outer region 73). The outer impurity layer 80 is formed at an interval from the shielding structure 71 toward the side surfaces 13A to 13D. The outer impurity layer 80 is exposed from the side surfaces 13A to 13D. The outer impurity layer 80 may also cover the shielding structure 71.

The outer impurity layer 80 extends as a band shape along the side surfaces 13A to 13D in top view. More specifically, the outer impurity layer 80 is shaped as a loop (a quadrilateral loop in this embodiment) extending along the side surfaces 13A to 13D.

The outer impurity layer 80 has a p-type impurity concentration more than the p-type impurity concentration of the second semiconductor layer 15. The p-type impurity concentration of the outer impurity layer 80 may have a peak of equal to or more than $1 \times 10^{18}$ cm$^{-3}$ and equal to or less than $1 \times 10^{21}$ cm$^{-3}$. The peak of the p-type impurity concentration of the outer impurity layer 80 is preferably than $5 \times 10^{18}$ cm$^{-3}$ and equal to or less than $1 \times 10^{20}$ cm$^{-3}$.

The outer impurity layer 80 is formed at the surface layer portion of the first main surface 11 in a manner of crossing the boundary between the first semiconductor layer 14 and the second semiconductor layer 15. More specifically, the outer impurity layer 80 includes an upper region 81 and a lower region 82 sequentially formed from the first main surface 11 toward the thickness direction. The upper region 81 is formed at the surface layer portion of the second semiconductor layer 15. The upper region 81 has a p-type impurity concentration more than the n-type impurity concentration of the second semiconductor layer 15. The upper region 81 has a concentration gradient by which p-type impurity concentration gradually decreases from the side of the first main surface 11 to the side of the second main surface 12.

The lower region 82 is formed at the boundary between the first semiconductor layer 14 (specifically, the concentration keeping layer 18) and the second semiconductor layer 15 in a manner of being connected to the upper region 81. The lower region 82 has a p-type impurity concentration (concentration gradient) different from that of the upper region 81. More specifically, the lower region 82 has a concentration gradient by which the p-type impurity concentration gradually increases and then gradually decreases from the side of the second main surface 12 to the side of the first main surface 11. The p-type impurity concentration of the lower region 82 is preferably equal to the p-type impurity concentration of the first P layer 34 of the first pin junction portion 31 (the second P layer 54 of the second pin junction portion 51).

Referring to FIG. 2 to FIG. 9, the diode chip 1 (the chip body 2) includes an inter-insulation layer 91 covering the first main surface 11. The inter-insulation layer 91 has a peripheral portion exposed from the side surfaces 13A to 13D of the semiconductor chip 10. The peripheral portion of the inter-insulation layer 91 is connected to the side surfaces 13A to 13D. More specifically, the peripheral portion of the inter-insulation layer 91 and the side surfaces 13A to 13D are formed on the same surface.

The inter-insulation layer 91 may have a laminated structure formed by laminating a plurality of insulation layers, or may have a single-layer structure consisting of a single insulation layer. The inter-insulation layer 91 may include at least one of a silicon oxide layer and a silicon nitride layer. The inter-insulation layer 91 may have a laminated structure formed by laminating a silicon oxide layer and a silicon nitride layer according to any sequence. The inter-insulation layer 91 may also have a single-layer structure consisting of a silicon oxide layer or a silicon nitride layer.

In this embodiment, the inter-insulation layer 91 has an ONO (oxide-nitride-oxide) laminated structure including a first silicon oxide layer, a silicon nitride layer and a second silicon oxide layer sequentially laminated from the side of the first main surface 11. The inter-insulation layer 91 is not required to globally include the ONO laminated structure. The inter-insulation layer 91 may also, for example, have an ONO laminated structure at a portion covering the first pad region 273 and the second pad region 274, and have an insulation layer different form the ONO laminated structure at a portion covering regions other than said regions.

The first silicon oxide layer may have a laminated structure formed by laminating a plurality of silicon oxide layers, or may have a single-layer structure consisting of a single silicon oxide layer. The first silicon oxide layer may include at least one of an USG (undoped silica glass) layer, a PSG (phosphor silicate glass) layer, and a BPSG (boron phosphor silicate glass) layer, as an example of the silicon oxide layer. In this embodiment, the first silicon oxide layer has a single-layer structure consisting of a single silicon oxide layer.

The second silicon oxide layer may have a laminated structure formed by laminating a plurality of silicon oxide layers, or may have a single-layer structure consisting of a single silicon oxide layer. The second silicon oxide layer may include at least one of a USG layer, a PSG layer and a BPSG layer, as an example of the silicon oxide layer. In this embodiment, the second silicon oxide layer has a laminated structure including a USG layer and a BPSG layer sequentially laminated from the side of the silicon nitride layer.

The inter-insulation layer 91 may have a thickness (total thickness) of equal to or more than 1 µm and equal to or less than 10 µm. The thickness (total thickness) of the inter-insulation layer 91 may also be equal to or more than 1 µm and equal to or less than 2 µm, equal to or more than 2 µm and equal to or less than 4 µm, equal to or more than 4 µm and equal to or less than 6 µm, equal to or more than 6 µm and equal to or less than 8 µm, or equal to or more than 8 µm and equal to or less than 10 µm. The thickness (total thickness) of the inter-insulation layer 91 is preferably equal to or more than 4 µm and equal to or less than 5 µm.

The inter-insulation layer 91 includes a first pin opening 92, a first reversed pin opening 93, a second pin opening 94, and a second reversed pin opening 95. The first pin opening 92 exposes the first pin junction portion 31 in the first apparatus region 21. The first reversed pin opening 93 exposes the first reversed pin junction portion 38 in the first apparatus region 21. The second pin opening 94 exposes the second pin junction portion 51 in the second apparatus region 22. The second reversed pin opening 95 exposes the second reversed pin junction portion 58 in the second apparatus region 22.

The first pin opening 92, the first reversed pin opening 93, the second pin opening 94, and the second reversed pin opening 95 are shaped as circles (including ovals) in top view. The first pin opening 92, the first reversed pin opening 93, the second pin opening 94, and the second reversed pin opening 95 may have any planar shapes as desired. The first pin opening 92, the first reversed pin opening 93, the second pin opening 94, and the second reversed pin opening 95 may also be shaped as polygons (for examples, quadrilaterals) in top view.

Referring to FIG. 2 to FIG. 9 (particularly FIG. 9), the diode chip 1 includes a first electrode layer 101 (a first electrode) in the first apparatus region 21, wherein the first electrode layer 101 penetrates the inter-insulation layer 91 and is hence electrically connected to the first pin junction portion 31 and the first diode pair 37. The first electrode layer 101 connects the first pin junction portion 31 and the first diode pair 37 in parallel. The first electrode layer 101 is shaped as a film formed on the inter-insulation layer 91. The first electrode layer 101 includes a first pad portion 101A and a first wiring portion 101B.

The first pad portion 101A is separated from the first apparatus region 21 and the second apparatus region 22 and is formed on the first pad region 273 in top view. In this embodiment, the first pad portion 101A is formed in a region that does not overlap the first apparatus region 21 and the second apparatus region 22 in top view. The first pad portion 101A may also be formed as overlapping a portion of the first apparatus region 21 and a portion of the second apparatus region 22 in top view.

The first pad portion 101A is opposite to a region surrounded by the first pad separation structure 275 (specifically, the second semiconductor layer 15) with the inter-insulation layer 91 interposed in between. The first pad portion 101A may also cover the first pad separation structure 275 with the inter-insulation layer 91 interposed in between. In this case, the first pad portion 101A may cover a global range of the region surrounded by the first pad separation structure 275. The first pad portion 101A is shaped as a rectangle extending along the first direction X in top view. The first pad portion 101A may have any planar shape as desired.

The first wiring portion 101B is led out as a band shape from the first pad portion 101A toward the first apparatus region 21. The first wiring portion 101B has a width in the first direction X less than the width of the first pad portion 101A in the first direction X. The width of the first wiring portion 101B in the first direction X may be any value as desired. Parasitic capacitance may be suppressed by reducing the width of the first wiring portion 101B in the first direction X.

The first wiring portion 101B enters the first pin opening 92 and the first reversed pin opening 93 from above the inter-insulation layer 91. The first wiring portion 101B is electrically connected to the first pin junction portion 31 in the first pin opening 92. An ohmic contact is formed between the first wiring portion 101B and the first pin junction portion 31 (specifically, the first N layer 32).

The first wiring portion 101B is electrically connected to the first reversed pin junction portion 38 in the first reversed pin opening 93. An ohmic contact is formed between the first wiring portion 101B and the first reversed pin junction portion 38 (specifically, the first reversed P layer 39). As such, the first electrode layer 101 connects the first pin junction portion 31 and the first diode pair 37 in parallel in the first apparatus region 21.

The first electrode layer 101 may include at least one of a pure copper layer (a copper layer having a purity of equal to or more than 99%), a pure aluminum layer (an aluminum layer having a purity of equal to or more than 99%), an aluminum silicon alloy layer, an aluminum copper alloy layer, and an aluminum silicon copper alloy layer.

Referring to FIG. 2 to FIG. 9 (particularly FIG. 9), the diode chip 1 includes a second electrode layer 102 (a second electrode) in the second apparatus region 22, wherein the second electrode layer 102 penetrates the inter-insulation layer 91 and is hence electrically connected to the second pin junction portion 51 and the second diode pair 57. The second electrode layer 102 connects the second pin junction portion 51 and the second diode pair 57 in parallel. The second electrode layer 102 is shaped as a film, separated from the first electrode layer 101 and formed on the inter-insulation layer 91. The second electrode layer 102 includes a second pad portion 102A and a second wiring portion 102B.

The second portion 102A is separated from the first apparatus region 21 and the second apparatus region 22 and is formed in the second pad region 274. In this embodiment, the second pad portion 102A is formed in a region that does not overlap the first apparatus region 21 and the second apparatus region 22 in top view. The second pad portion 102A may also overlap a portion of the first apparatus region 21 and a portion of the second apparatus region 22 in top view.

The second pad portion 102A is opposite to a region surrounded by the second pad separation structure 276 (specifically, the second semiconductor layer 15) with the inter-insulation layer 91 interposed in between. The second pad portion 102A may also cover the second pad separation structure 276 with the inter-insulation layer 91 interposed in between. In this case, the second pad portion 102A may cover a global range of the region surrounded by the second pad separation structure 276. The second pad portion 102A is shaped as a rectangle extending along the first direction X in top view. The second pad portion 102A may have any planar shape as desired.

The second wiring portion 102B is led out as a band shape from the second pad portion 102A toward the second apparatus region 22. The second wiring portion 102B is at an interval from the first wiring portion 101B toward the first direction X, and extends in parallel relative to the first wiring portion 101B. The second wiring portion 102B has a width in the first direction X less than the width of the second pad portion 102A in the first direction X. The width of the second wiring portion 102B in the first direction X may be any value as desired. The width of the second wiring portion 102B in the first direction X is preferably equal to the width of the first wiring portion 101B in the first direction X. Parasitic capacitance may be suppressed by reducing the width of the second wiring portion 102B in the first direction X.

The second wiring portion 102B enters the second pin opening 94 and the second reversed pin opening 95 from above the inter-insulation layer 91. The second wiring portion 102B is electrically connected to the second pin junction portion 51 in the second pin opening 94. An ohmic contact is formed between the second wiring portion 102B and the second pin junction portion 51 (specifically, the second N layer 52).

The second wiring portion 102B is electrically connected to the second reversed pin junction portion 58 in the second reversed pin opening 95. An ohmic contact is formed between the second wiring portion 102B and the second reversed pin junction portion 58 (specifically, the second reversed P layer 59). As such, the second electrode layer 102 connects the second pin junction portion 51 and the second diode pair 57 in parallel in the second apparatus region 22.

The second electrode layer 102 may include at least one of a pure copper layer (a copper layer having a purity of equal to or more than 99%), a pure aluminum layer (an aluminum layer having a purity of equal to or more than 99%), an aluminum silicon alloy layer, an aluminum copper alloy layer, and an aluminum silicon copper alloy layer. The second electrode layer 102 preferably includes a conductive material the same as the conductive material of the first electrode layer 101.

Referring to FIG. 2 to FIG. 9, a first external parasitic capacitance CO1 is formed between the first electrode layer 101 (the first pad portion 101A) and the first pad region 273 (specifically, the second semiconductor layer 15). The first external parasitic capacitance CO1 is connected in series to the first internal parasitic capacitance C1 via the second semiconductor layer 15. A region of the semiconductor chip 10 (the first pad region 273) separated by the first pad separation structure 275 is exclusive to the series circuit including the first internal parasitic capacitance C1 and the first external parasitic capacitance CO1.

A second external parasitic capacitance CO2 is formed between the second electrode layer 102 (the second pad portion 102A) and the second pad region 274 (specifically, the second semiconductor layer 15). The second external parasitic capacitance CO2 is connected in series to the second internal parasitic capacitance C2 via the second semiconductor layer 15. A region of the semiconductor chip 10 (the second pad region 274) separated by the second pad separation structure 276 is exclusive to the series circuit including the second internal parasitic capacitance C2 and the second external parasitic capacitance CO2.

Thus, a parasitic capacitance circuit 283 including a series circuit of the first internal parasitic capacitance C1, the second internal parasitic capacitance C2, the first external parasitic capacitance CO1 and the second external parasitic capacitance CO2 is formed between the first electrode layer 101 and the second electrode layer 102.

The second external parasitic capacitance CO2 is preferably equal to the first external parasitic capacitance CO1. That is to say, the following configuration is preferred: the first electrode layer 101 (the first pad portion 101A) is formed on the inter-insulation layer 91 by a first electrode area in top view, and the second electrode layer 102 (the second pad portion 102A) is formed on the inter-insulation layer 91 by a second electrode area equal to the first electrode area in top view.

Referring to FIG. 1 to FIG. 7, the diode chip 1 (the chip body 2) includes an uppermost insulation layer 111 covering the inter-insulation layer 91. The uppermost insulation layer 111 covers the first electrode layer 101 and the second electrode layer 102 on the inter-insulation layer 91. The uppermost insulation layer 111 has a peripheral portion exposed from the side surfaces 13A to 13D of the semiconductor chip 10. The peripheral portion of the uppermost insulation layer 111 is connected to the side surfaces 13A to 13D. More specifically, the peripheral portion of the uppermost insulation layer 111 and the side surfaces 13A to 13D are formed on the same surface. The uppermost insulation layer 111 forms a portion of the chip side surfaces 5A to 5D of the chip body 2.

In this embodiment, the uppermost insulation layer 111 has a laminated structure including a passivation layer 112 and a resin layer 113. The passivation layer 112 may have a single-layer structure consisting of a silicon oxide layer or a silicon nitride layer. The passivation layer 112 may also have a laminated structure including a silicon oxide layer and a silicon nitride layer laminated according to any sequence. The passivation layer 112 preferably consists of an insulation material different from that forming the main surface part of the inter-insulation layer 91. In this embodiment, the passivation layer 112 has a single-layer structure consisting of a silicon nitride layer.

The resin layer 113 may include photosensitive resin. The photosensitive resin may be either a negative type or a positive type. The resin layer 113 may include at least one of polyimide, polyamide and polybenzoxazole, as an example of the photosensitive resin. In this embodiment, the resin layer 113 includes polyimide.

The uppermost insulation layer 111 includes a first pad opening 114 exposing the first electrode layer 101, and a second pad opening 115 exposing the second electrode layer 102.

The first pad opening 114 exposes the first pad portion 101A of the first electrode layer 101. The first pad opening 114 exposes an inner portion of the first pad portion 101A other than the edge portion of the first pad portion 101A. The first pad opening 114 is shaped as a quadrilateral (specifically, a rectangle) matching the first pad portion 101A in top view. The first pad opening 114 may have any planar shape as desired.

The second pad opening 115 exposes the second pad portion 102A of the second electrode layer 102. The second pad opening 115 exposes the inner portion of the second pad portion 102A other than the edge portion of the second pad portion 102A. The second pad opening 115 is shaped as a quadrilateral (specifically, a rectangle) matching the second pad portion 102A in top view. The second pad opening 115 may have any planar shape as desired.

Referring to FIG. 1 to FIG. 7, the diode chip 1 (the chip body 2) includes a first terminal electrode 121 electrically connected to the first electrode layer 101. The first terminal electrode 121 penetrates the uppermost insulation layer 111 and is hence connected to the first electrode layer 101. More specifically, the first terminal electrode 121 is embedded in the first pad opening 114, and is electrically connected to the first pad portion 101A in the first pad opening 114.

The first terminal electrode 121 is separated from the first apparatus region 21 and the second apparatus region 22, and is formed in the first pad region 273 in top view. In this embodiment, the first terminal electrode 121 is formed in a region that does not overlap the first apparatus region 21 and the second apparatus region 22 in top view. The first terminal electrode 121 may also overlap a portion of the first apparatus region 21 and a portion of the second apparatus region 22 in top view. The first terminal electrode 121 is shaped as a rectangle extending along the first direction X. The first terminal electrode 121 may have any planar shape as desired.

The first terminal electrode 121 has a first electrode surface 121A exposed from the main surface (the first chip main surface 3) of the resin layer 113. The first electrode surface 121A protrudes in a manner of being separated from the main surface (the first chip main surface 3) of the resin layer 113. The first electrode surface 121A includes an overlapping portion covering the main surface (the first chip main surface 3) of the resin layer 113. The first terminal electrode 121 may have a laminated structure including a nickel layer, a palladium layer and a gold layer sequentially laminated from the side of the first electrode layer 101.

Referring to FIG. 1 to FIG. 7, the diode chip 1 (the chip body 2) includes a second terminal electrode 122 electrically connected to the second electrode layer 102. The second terminal electrode 122 penetrates the uppermost insulation layer 111 and is hence connected to the second electrode layer 102. More specifically, the second terminal electrode 122 is embedded in the second pad opening 115, and is electrically connected to the second pad portion 102A in the second pad opening 115.

The second terminal electrode 122 is separated from the first apparatus region 21 and the second apparatus region 22, and is formed in the second pad region 274 in top view. In this embodiment, the second terminal electrode 122 is formed in a region that does not overlap the first apparatus region 21 and the second apparatus region 22 in top view. The second terminal electrode 122 may also overlap a portion of the first apparatus region 21 and a portion of the second apparatus region 22 in top view. The second terminal electrode 122 is shaped as a rectangle extending along the first direction X. The second terminal electrode 122 may have any planar shape as desired.

The second terminal electrode 122 has a second electrode surface 122A exposed from the main surface (the first chip main surface 3) of the resin layer 113. The second electrode surface 122A protrudes in a manner of being separated from the main surface (the first chip main surface 3) of the resin layer 113. The second electrode surface 122A includes an overlapping portion covering the main surface (the first chip main surface 3) of the resin layer 113. The second electrode surface 122A may have a laminated structure including a nickel layer, a palladium layer and a gold layer sequentially laminated from the side of the second electrode layer 102.

Referring to FIG. 1 to FIG. 9, the diode chip 1 (the chip body 2) includes a side surface insulation layer 131 covering the side surfaces 13A to 13D of the semiconductor chip 10. The side surface insulation layer 131 covers the side surfaces 13A to 13D altogether. The side surface insulation layer 131 forms the chip side surfaces 5A to 5D of the chip body 2. The side surface insulation layer 131 enhances the insulation property of the semiconductor chip 10 and at the same time protects the semiconductor chip 10.

The side surface insulation layer 131 is shaped as a film along the side surfaces 13A to 13D. The side surface insulation layer 131 has a flat outer surface. The outer surface of the side surface insulation layer 131 extends in parallel to the side surfaces 13A to 13D. The side surface insulation layer 131 may cover a portion of the inter-insulation layer 91. The side surface insulation layer 131 may further cross the inter-insulation layer 91 and hence cover a portion of the uppermost insulation layer 111. In this case, the side surface insulation layer 131 may cover a portion of the passivation layer 112, or may cover a portion of the resin layer 113.

The side surface insulation layer 131 exposes the second main surface 12 of the semiconductor chip 10. The side surface insulation layer 131 is connected to the second main surface 12. Specifically, the side surface insulation layer 131 and the second surface 12 are formed on the same surface. More specifically, a ground surface or a mirror surface is formed between the side surface insulation layer 131 and the second main surface 12.

The side surface insulation layer 131 may have a single-layer structure including a silicon oxide layer or a silicon nitride layer. The side surface insulation layer 131 may also have a laminated structure including a silicon oxide layer and a silicon nitride layer laminated according to any sequence. In this embodiment, the side surface insulation layer 131 has a single-layer structure consisting of a silicon oxide layer.

Figure 11:
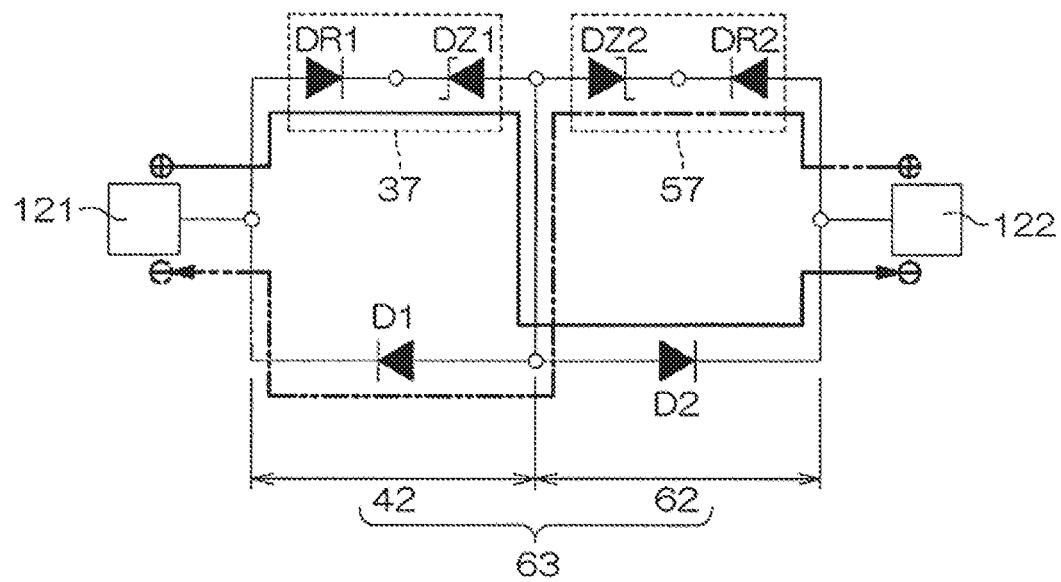
FIG. 11 is an electrical circuit diagram of the diode chip in FIG. 1.

FIG. 11 shows an electrical circuit diagram of the diode chip 1 in FIG. 1. Referring to FIG. 11, the diode chip 1 includes the first terminal electrode 121, the second terminal electrode 122 and the TVS circuit 63. The TVS circuit 63 includes a series circuit formed by the first parallel circuit 42 and the second parallel circuit 62 connected in series, and is electrically connected to the first terminal electrode 121 and the second terminal electrode 122.

The first parallel circuit 42 includes the first pin diode D1 and the first diode pair 37. The first diode pair 37 includes the first reversed pin diode DR1 and the first Zener diode DZ1. The cathode of the first pin diode D1 is electrically connected to the first terminal electrode 121.

The first diode pair 37 includes a reverse series circuit in which the cathode of the first reversed pin diode DR1 is reverse bias connected to the cathode of the first Zener diode DZ1. The anode of the first reversed pin diode DR1 is electrically connected to the first terminal electrode 121. The anode of the first Zener diode DZ1 is reverse bias connected to the anode of the first pin diode D1.

The second parallel circuit 62 includes the second pin diode D2 and the second diode pair 57. The second diode pair 57 includes the second reversed pin diode DR2 and the second Zener diode DZ2. The cathode of the second pin diode D2 is electrically connected to the second terminal electrode 122. The anode of the second pin diode D2 is reverse bias connected to the anode of the first pin diode D1 and the anode of the first Zener diode DZ1.

The second diode pair 57 includes a reverse series circuit in which the cathode of the second reversed pin diode DR2 is reverse bias connected to the cathode of the second Zener diode DZ2. The anode of the second reversed pin diode DR2 is electrically connected to the second terminal electrode 122. The anode of the second Zener diode DZ2 is reverse bias connected to the anode of the first pin diode D1, the anode of the first Zener diode DZ1 and the anode of the second pin diode D2.

The diode chip 1 is a bi-directional device in which a current is capable of flowing in two directions toward the first terminal electrode 121 and the second terminal electrode 122. That is to say, if a voltage equal to or more than a specified threshold voltage with the first terminal electrode 121 as positive is applied between the first terminal electrode 121 and the second terminal electrode 122, the current flows from the first terminal electrode 121 through the first diode pair 37 and the second pin diode D2 toward the second terminal electrode 122.

On the other hand, if a voltage equal to or more than a specified threshold voltage with the second terminal electrode 122 as positive is applied between the first terminal electrode 121 and the second terminal electrode 122, the current flows from the second terminal electrode 122 through the second diode pair 57 and the first pin diode D1 toward the first terminal electrode 121.

By increasing symmetry of the layout of the second pin junction portion 51, the second pn junction portion 55 and the second reversed pin junction portion 58 relative to the layout of the first pin junction portion 31, the first pn junction portion 35 and the first reversed pin junction portion 38, electrical characteristics of the bi-directional device may be enhanced. That is to say, electrical characteristics when a current flows from the first terminal electrode 121 toward the second terminal electrode 122 are equal to electrical characteristics when a current flows from the second terminal electrode 122 toward the first terminal electrode 121.

Figure 12:
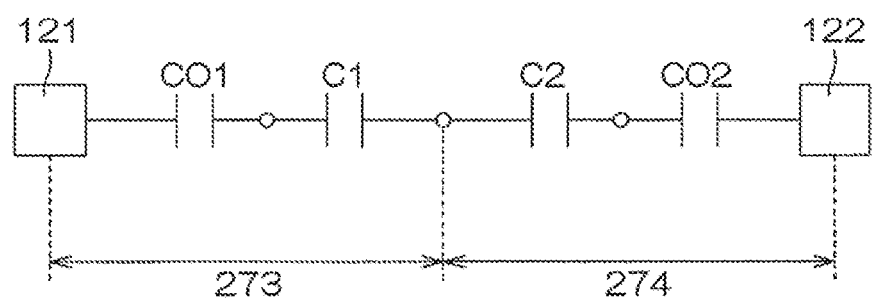
FIG. 12 is an electrical circuit diagram representing the parasitic capacitance of the diode chip in FIG. 1.

FIG. 12 shows an electrical circuit diagram of the parasitic capacitance of the diode chip 1 in FIG. 1. Referring to FIG. 12, the diode chip 1 includes the first terminal electrode 121, the second electrode terminal 122 and the parasitic capacitance circuit 283.

The parasitic capacitance circuit 283 includes a series circuit consisting of the first internal parasitic capacitance C1, the second internal parasitic capacitance C2, the first external parasitic capacitance CO1 and the second external parasitic capacitance CO2, and is electrically connected to the first terminal electrode 121 and the second terminal electrode 122. A synthetic capacitance CP1 on the side of the first pad region 273 is expressed by equation (1) below. Furthermore, a synthetic capacitance CP2 on the side of the second pad region 274 is expressed by equation (2) below.

[Equation 1]
$$CP1 = \frac{C1}{C1 + CO1} \times CO1 \quad (1)$$

[Equation 2]
$$CP2 = \frac{C2}{C2 + CO2} \times CO2 \quad (2)$$

When the first pad separation structure 275 and the second pad separation structure 276 are removed, the second external parasitic capacitance CO2 is connected to the first external parasitic capacitance CO1 via the second semiconductor layer 15. As a result, the first internal parasitic capacitance C1 and the second internal parasitic capacitance C2 disappear, and the parasitic capacitance circuit 283 including the series circuit of the first external parasitic capacitance CO1 and the second external parasitic capacitance CO2 is formed between the first terminal electrode 121 and the second terminal electrode 122. In this case, the synthetic capacitance CP1* on the side of the first pad region 273 and the synthetic capacitance CP2* on the side of the second pad region 274 are expressed by equation (3) and equation (4) below.

[Equation 3]
$$CP1^* = CO1 (>CP1) \quad (3)$$

[Equation 4]
$$CP2^* = CO2 (>CP2) \quad (4)$$

Referring to equation (1) and equation (3), the synthetic capacitance CP1 is less than the synthetic capacitance CP1*. Furthermore, referring to equation (2) and equation (4), the synthetic capacitance CP2 is less than the synthetic capacitance CP2*. Therefore, according to the diode chip 1, the first pad separation structure 275 and the second pad separation structure 276 are capable of suppressing parasitic capacitance, thereby lowering the inter-terminal capacitance CT.

Figure 13:
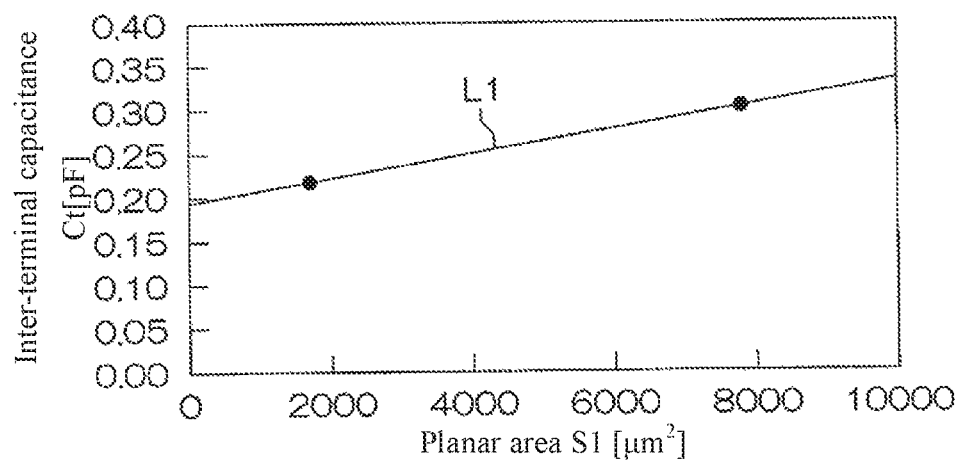
FIG. 13 is a curve diagram representing the inter-terminal capacitance of the diode chip in FIG. 1.

FIG. 13 shows a curve diagram of the inter-terminal capacitance CT of the diode chip 1 in FIG. 1. The vertical axis represents the inter-terminal capacitance CT [in pF], and the horizontal axis represents the first planar area S1 [in $\mu m^2$] of the first reversed P layer 39. Since the diode chip 1 is a bi-directional device, the same applies to a case of setting the horizontal axis as the second planar area S2 [in $\mu m^2$] of the second reversed P layer 59.

In FIG. 13, a capacitance characteristic L1 of the inter-terminal capacitance CT of the diode chip 1 is depicted.

Referring to the capacitance characteristic L1, the inter-terminal capacitance CT increases in proportion to the increase in the first planar area S1 and decreases in proportion to the decrease in the first planar area S1. When the first planar area S1 is in a range of equal to or more than 1000 $\mu m^2$ and equal to or less than 10000 $\mu m^2$, the inter-terminal capacitance CT is equal to or more than 0.15 pF and equal to or less than 0.35 pF.

Figure 14:
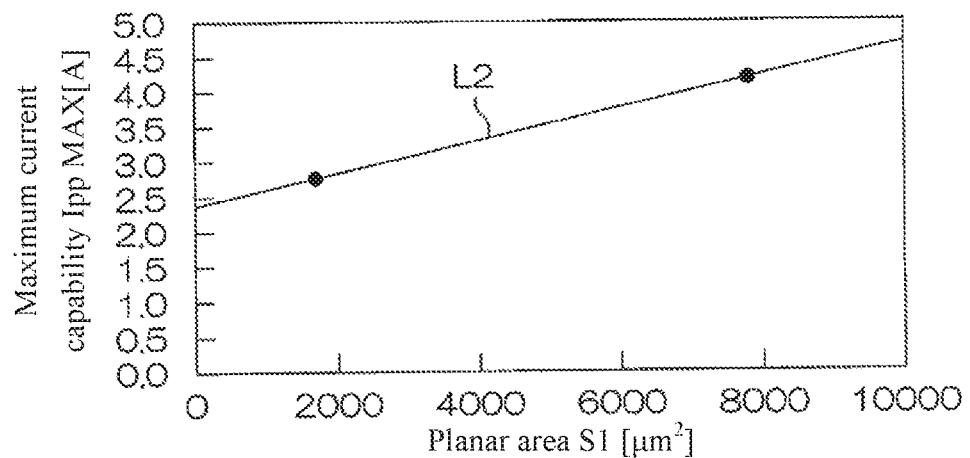
FIG. 14 is a curve diagram representing the maximum current capability of the diode chip in FIG. 1.

FIG. 14 shows a curve diagram representing a maximum current capability IPP of the diode chip 1 in FIG. 1. The vertical axis represents the maximum current capability IPP [in A], and the horizontal axis represents the first planar area S1 [in $\mu m^2$] of the first reversed P layer 39. Since the diode chip 1 is a bi-directional device, the same applies to a case of setting the horizontal axis as the second planar area S2 [in $\mu m^2$] of the second reversed P layer 59.

In FIG. 14, a current characteristic L2 representing the maximum current capability IPP of the diode chip 1 is depicted. Referring to the current characteristic L2, the maximum current capability IPP increases in proportion to the increase in the first planar area S1 and decreases in proportion to the decrease in the first planar area S1. When the first planar area S1 is in a range of equal to or more than 1000 $\mu m^2$ and equal to or less than 10000 $\mu m^2$, the maximum current capability IPP is equal to or more than 2 A and equal to or less than 5 A.

Figure 15:
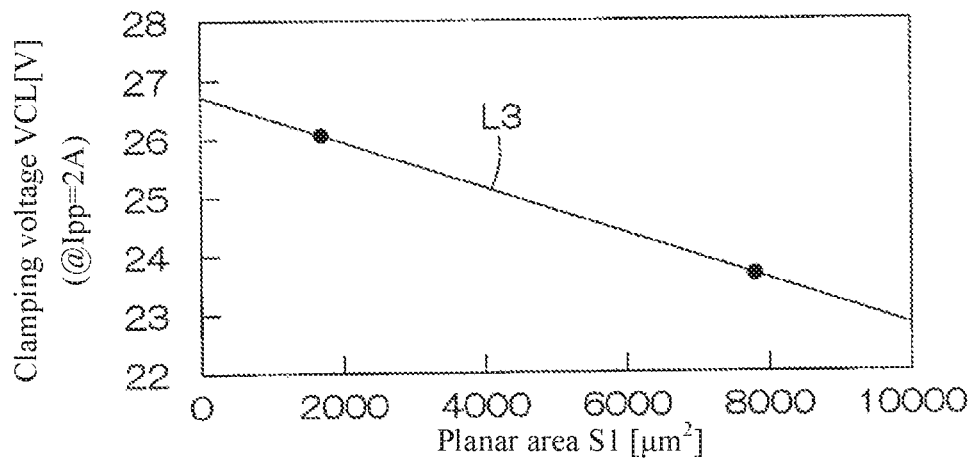
FIG. 15 is a curve diagram of the clamping voltage of the diode chip in FIG. 1.

FIG. 15 shows a curve diagram of the clamping voltage VCL of the diode chip 1 in FIG. 1. The vertical axis represents the clamping voltage VCL [in V], and the horizontal axis represents the first planar area S1 [in $\mu m^2$] of the first reversed P layer 39. Since the diode chip 1 is a bi-directional device, the same applies to a case of setting the horizontal axis as the second planar area S2 [in $\mu m^2$] of the second reversed P layer 59.

In FIG. 15, a voltage characteristic L3 representing the clamping voltage VCL of the diode chip 1 is depicted. Referring to the voltage characteristic L3, the clamping voltage VCL increases in proportion to the increase in the first planar area S1 and decreases in proportion to the decrease in the first planar area S1. When the first planar area S1 is in a range of equal to or more than 1000 $\mu m^2$ and equal to or less than 10000 $\mu m^2$, the clamping voltage VCL is equal to or more than 23 V and equal to or less than 27 V.

It is known with reference to FIG. 13 to FIG. 15 that, the inter-terminal capacitance CT, the maximum current capability IPP and the clamping voltage VCL have a trade-off relationship. In the diode chip 1, a lower inter-terminal capacitance CT, a higher maximum current capability IPP and a lower clamping voltage VCL are required.

By reducing the first planar area S1 of the first reversed pin junction portion 38 (the first reversed P layer 39), a lower inter-terminal capacitance CT is achieved, without rendering a higher maximum current capability IPP or a lower clamping voltage VCL. On the other hand, by increasing the first planar area S1 of the first reversed pin junction portion 38 (the first reversed P layer 39), a higher maximum current capability IPP and a lower clamping voltage VCL are achieved, without rendering a lower inter-terminal capacitance CT.

Therefore, the first planar area S1 of the first reversed pin junction portion 38 (the first reversed P layer 39) needs to be adjusted to an appropriate value according to the inter-terminal capacitance CT, the maximum current capability IPP and the clamping voltage VCL to be achieved. From another perspective, by adjusting the first planar area S1 of the first reversed pin junction portion 38 (the first reversed P layer 39), the inter-terminal capacitance CT, the maximum current capability IPP and the clamping voltage VCL may be adjusted, hence easily providing a diode chip 1 having various electrical characteristics.

In conclusion, the diode chip 1 includes the first pad separation structure 275, and the first pad separation structure 275 separates a portion of the first pad region 273 from other regions, so as to form the first internal parasitic capacitance C1 between the first semiconductor layer 14 and the second semiconductor layer 15. Furthermore, the diode chip 1 includes the first electrode layer 101, and the first electrode layer 101 is opposite to a region surrounded by the first pad separation structure 275 with the inter-insulation layer 91 interposed in between, so as to form the first external parasitic capacitance CO1. A series circuit is formed between the first external parasitic capacitance CO1 and the first internal parasitic capacitance C1. Thus, the synthetic capacitance CP1 on the side of the first pad region 273 may be lowered.

Furthermore, the diode chip 1 includes the second pad separation structure 276, and the second pad separation structure 276 separates a portion of the second pad region 274 from other regions, so as to form the second internal parasitic capacitance C2 between the first semiconductor layer 14 and the second semiconductor layer 15. In addition, the diode chip 1 includes the second electrode layer 102, and the second electrode layer 102 is opposite to a region surrounded by the second pad separation structure 276 with the inter-insulation layer 91 interposed in between, so as to form the second external parasitic capacitance CO2. A series circuit is formed between the second external parasitic capacitance CO2 and the second internal parasitic capacitance C2. Thus, the synthetic capacitance CP2 on the side of the second pad region 274 may be lowered. Thus, the diode chip 1 is capable of lowering the inter-terminal capacitance CT compared to situations without the first pad separation structure 275 and the second pad separation structure 276.

Furthermore, according to the diode chip 1, the first pad separation trench 277 has a double trench structure including two trenches (the first inner pad trench 277A and the first outer pad trench 277B). According to the first pad separation trench 277 having a double trench structure, in the semiconductor chip 10, the parasitic capacitance formed in an opposite region interposed with the first pad separation trench 277 in between may be reliably suppressed.

Moreover, according to the diode chip 1, the second pad separation trench 280 has a double trench structure including two trenches (the second inner pad trench 280A and the second outer pad trench 280B). According to the second pad separation trench 280 having a double trench structure, in the semiconductor chip 10, the parasitic capacitance formed in an opposite region interposed with the second pad separation trench 280 in between may be reliably suppressed.

Furthermore, according to the diode chip 1, the semiconductor chip 10 is separated into the first apparatus region 21 and the second apparatus region 22 by the region separation structure 23. Thus, the first pin junction portion 31, the first pn junction portion 35 and the first reversed pin junction portion 38 may be reliably built in the surface layer portion and inside of the first apparatus region 21. Furthermore, the second pin junction portion 51, the second pn junction portion 55 and the second reversed pin junction portion 58 may be reliably built in the surface layer portion and inside of the second apparatus region 22. Thus, outstanding electrical characteristics may be achieved.

Particularly, according to the diode chip 1, the region separation structure 23 has a trench structure including the region separation trench 24. Thus, in the first apparatus region 21, undesired diffusion in the first pin junction portion 31, the first pn junction portion 35 and the first reversed pin junction portion 38 may be reliably suppressed by the region separation structure 23. Furthermore, in the second apparatus region 22, undesired diffusion in the second pin junction portion 51, the second pn junction portion 55 and the second reversed pin junction portion 58 may be reliably suppressed by the region separation structure 23. Thus, electrical characteristics may be reliably enhanced.

Further, the diode chip 1 includes, in the first apparatus region 21, the first junction separation structure 45 that separates the first pin junction portion 31 from the first pn junction portion 35 and the first reverse junction portion 38. Thus, the first pin junction portion 31 may be reliably built in the surface layer portion in the first apparatus region 21.

Particularly, the first junction separation structure 45 has a trench structure including the first junction separation trench 46. Thus, in the first apparatus region 21, undesired diffusion at the first pin junction portion 31 may be reliably suppressed by the first junction separation structure 45.

Further, the first junction separation trench 46 has a double trench structure that sandwiches the boundary between the first pin junction portion 31 (the first P layer 34) and the first pn junction portion 35 (the first internal N layer 36) from both side in the first apparatus region 21. More specifically, the first junction separation trench 46 includes the first inner trench 46A and the first outer trench 46B that sandwich the boundary between the first pin junction portion 31 and the first pn junction portion 35 from both sides.

According to such structure, undesired mutual diffusion of impurities between the first pin junction portion 31 and the first pn junction portion 35 (the first reverse pin junction portion 38) may be reliably suppressed. Thus, the first pin junction portion 31, the first pn junction portion 35 and the first reverse pin junction portion 38 may be reliably formed in the second apparatus region 21.

Further, the diode chip 1 includes, in the second apparatus region 22, the second junction separation structure 65 that separates the second pin junction portion 51 from the second pn junction portion 55 and the second reverse pin junction portion 58. Thus, the second pin junction portion 51 may be reliably built in the surface layer portion in the second apparatus region 22.

Particularly, the second junction separation structure 65 has a trench structure including the second junction separation trench 66. Thus, in the second apparatus region 22, undesired diffusion of the second pin junction portion 51 may be reliably suppressed by the second junction separation structure 65.

Further, the second junction separation trench 66 has a double trench structure that sandwiches the boundary between the second pin junction portion 51 (the second P layer 54) and the second pn junction portion 55 (the second internal N layer 56) from both sides in the second apparatus region 22. More specifically, the second junction separation trench 66 includes the second inner trench 66A and the second outer trench 66B that sandwich the boundary between the second pin junction portion 51 and the second pn junction portion 55 from both sides.

According to such structure, undesired mutual diffusion of impurities between the second pin junction portion 51 and the second pn junction portion 55 (the second reverse pin junction portion 58) may be reliably suppressed. Thus, the second pin junction portion 51, the second pn junction portion 55 and the second reverse pin junction portion 58 may be reliably formed in the second apparatus region 22.

Further, according to the diode chip 1, the first semiconductor layer 14 includes the concentration reducing layer 17 and the concentration keeping layer 18, and a pn junction is formed between the first internal N layer 36 of the first pn junction portion 35 and the concentration keeping layer 18 of the first semiconductor layer 14.

When the first semiconductor layer 14 does not have the concentration keeping layer 18, a pn junction is formed between the first internal N layer 36 and the concentration reducing layer 17. In this case, the change in the pn concentration of the first pn junction portion 35 becomes drastic, and hence it is possible that an actual withstand voltage (specifically, a breakdown voltage VB) starts to change from a target withstand voltage, starting from the first pn junction portion 35. Such issue is aggravated by a difference (for example, ±5%) in the thickness of the concentration reducing layer 17.

Thus, in the diode chip 1, the concentration keeping layer 18 is formed on the concentration reducing layer 17, thereby moderating the pn concentration change of the first pn junction portion 35 (referring to FIG. 10). Thus, in withstand voltage (specifically, the breakdown voltage VB), the change starting from the first pn junction portion 35 may be suppressed. Further, even if a difference in the thickness of the concentration reducing layer 17 occurs, the change in the withstand voltage caused by the difference in the thickness of the concentration reducing layer 17 may still be reliably suppressed by the concentration keeping layer 18 having a specified thickness formed.

Further, according to the diode chip 1, the first semiconductor layer 14 includes the concentration reducing layer 17 and the concentration keeping layer 18, and a pn junction is formed between the second internal N layer 56 of the second pn junction portion 55 and the concentration keeping layer 18.

When the first semiconductor layer 14 does not include the concentration keeping layer 18, a pn junction is formed between the second internal N layer 56 and the concentration reducing layer 17. In this case, the pn concentration change of the second pn junction 55 becomes drastic, and it is possible that an actual withstand voltage (specifically, a breakdown voltage VB) starts to change from a target withstand voltage, starting from the second pn junction portion 55. Such issue is aggravated by a difference (for example, ±5%) in the thickness of the concentration reducing layer 17.

Hence, in the diode chip 1, the concentration keeping layer 18 is formed on the concentration reducing layer 17, thereby moderating the concentration change of the second pn junction portion 55. Thus, in the withstand voltage (specifically, the breakdown voltage VB), the change starting from the second pn junction portion 55 may be suppressed. Further, even if a difference in the thickness of the concentration reducing layer 17 occurs, the change in the withstand voltage caused by the difference in the thickness of the concentration reducing layer 17 may still be reliably suppressed by the concentration keeping layer 18 having a specified thickness formed.

Further, according to the diode chip 1, from the perspective of the layout of the first apparatus region 21 and the second apparatus region 22, electrical characteristics may also be enhanced. More specifically, the diode chip 1 includes the first apparatus region 21 and the second apparatus region 22 centrally formed at a center portion (the apparatus forming region 272) of the semiconductor chip 10. That is to say, the diode chip 1 includes the first pin junction portion 31, the first pn junction portion 35, the first reverse pin junction portion 38, the second pin junction portion 51, the second pn junction portion 55 and the second reverse pin junction portion 58 centrally formed at the center portion (the apparatus forming region 272) of the semiconductor chip 10.

Thus, the second pin junction portion 51 is in close proximity to the first diode pair 37, and is formed at the center portion (the apparatus forming region 272) of the semiconductor chip 10. Further, the second diode pair 57 is in close proximity to the first pin junction portion 31, and is formed at the center portion (the apparatus forming region 272) of the semiconductor chip 10.

According to such structure, a current path formed between the first apparatus region 21 and the second apparatus region 22 may be shortened, thereby lowering the influences caused by resistance components of the semiconductor chip 10 (the first semiconductor layer 14). As a result, the maximum current capability IPP is increased and the clamping voltage VCL is reduced according to the decrease in the resistance components.

Further, according to the diode chip 1, the second pin junction portion 51 is, at the center portion (the apparatus forming region 272) of the semiconductor chip 10, opposite to the first reverse pin junction portion 38 in the first direction X. Further, according to the diode chip 1, the second reverse pin junction portion 58 is, at the center portion (the apparatus forming region 272) of the semiconductor chip 10, opposite to the first pin junction portion 31 in the first direction X. According to such structure, a current path formed between the first apparatus region 21 and the second apparatus region 22 may be reliably shortened by a relatively simple structure. Thus, electrical characteristics may be enhanced by a relatively simple structure.

Figure 16:
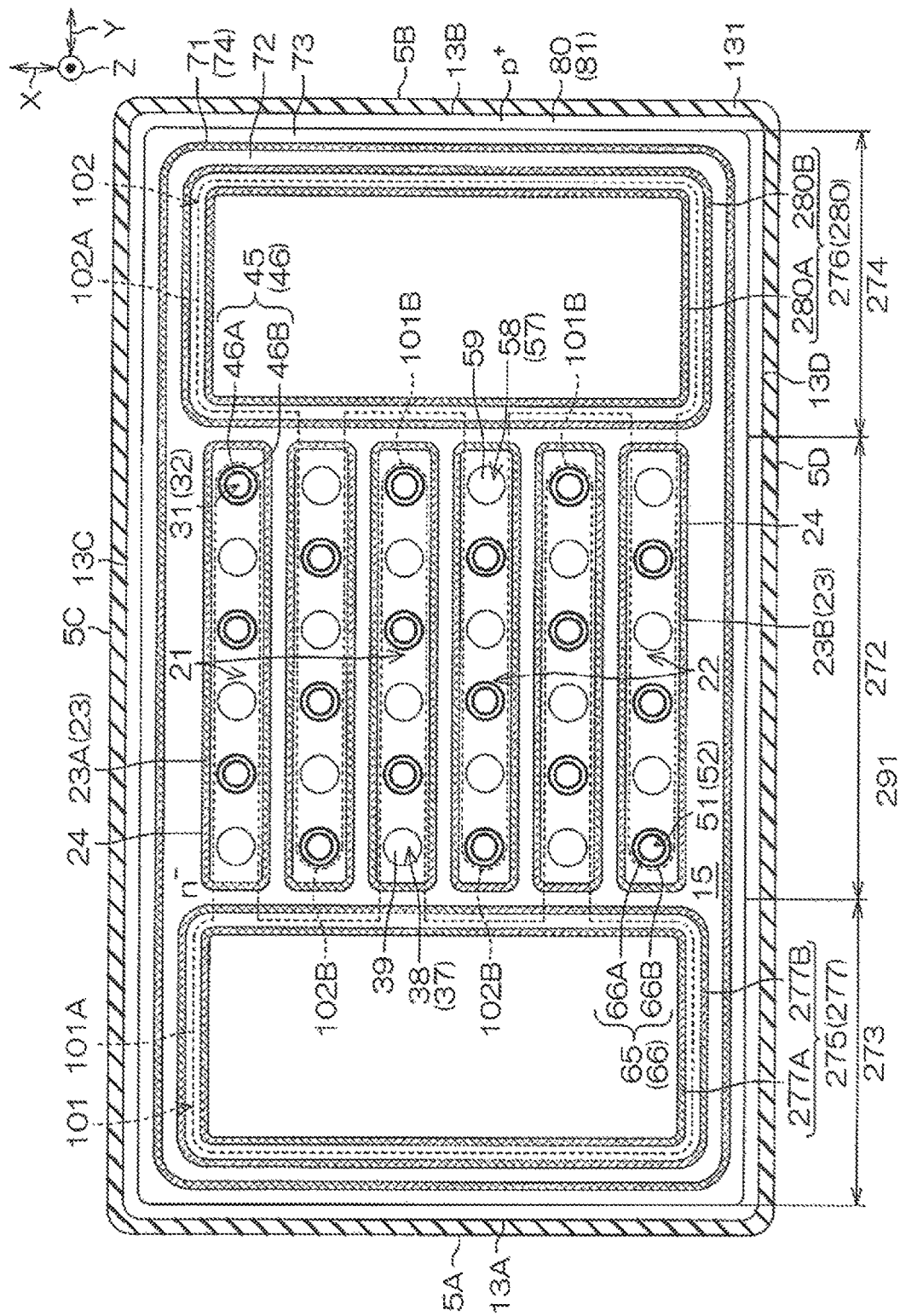
FIG. 16 is a corresponding diagram of FIG. 8, and is a top view of a diode chip according to a second embodiment of the present invention.

FIG. 16 shows a corresponding diagram of FIG. 8, and is a top view of a diode chip 291 according to a second embodiment of the present invention. In FIG. 16, the first junction separation structure 45 and the second junction separation structure 65 are represented by thick lines. In the description below, a structure corresponding to the structure described for the diode chip 1 is denoted by the same reference denotations and the associated description is omitted.

The diode chip 291 includes a plurality of (three in this embodiment) first apparatus regions 21 and a plurality of (three in this embodiment) of second apparatus regions 22. The number of the first apparatus regions 21 may be two or more, and four or more may be formed. The number of the second apparatus regions 22 may be two or more, and four or more may be formed. From the perspective of symmetry, the number of the second apparatus regions 22 is preferably equal to the number of the first apparatus regions 21.

The plurality of first apparatus regions 21 are formed at intervals in the first direction X in the apparatus forming region 272 of the semiconductor chip 10, and are respectively shaped as bands (shaped as rectangles) extending along the second direction Y.

The plurality of second apparatus regions 22 are formed at intervals in the first direction X in the apparatus forming region 272 of the semiconductor chip 10, and are respectively shaped as bands (shaped as rectangles) extending along the second direction Y. The plurality of second apparatus regions 22 are formed at intervals from the plurality of first apparatus regions 21 toward the first direction X. The plurality of second apparatus regions 22 and the plurality of first apparatus regions 21 are formed alternately in the first direction X. The plurality of second apparatus regions 22 are formed preferably at equal intervals from the plurality of first apparatus regions 21 in the first direction X.

The diode chip 291 includes the region separation structure 23 separating the plurality of first apparatus regions 21 and the plurality of second apparatus regions 22. In this embodiment, region separation structure 23 includes a plurality of first region separation structures 23A and a plurality of second region separation structures 23B.

The plurality of first region separation structures 23A separate the plurality of first apparatus regions 21 in one-on-one correspondence. The plurality of second region separation structures 23B separate the plurality of second apparatus regions 22 in one-on-one correspondence. In this embodiment, the plurality of second region separation regions 23B are formed at intervals from the plurality of first region separation regions 23A. The plurality of second region separation structures 23B may also be formed integrally, between the mutually adjacent first apparatus region 21 and second apparatus region 22, with the plurality of first region separation structures 23A into an integral body.

In this embodiment, the diode chip 291 includes a plurality of (three in this embodiment) first pin junction portions 31, one first pn junction portion 35, and a plurality of (three in this embodiment) first reverse pin junction portions 38 respectively formed in the plurality of first apparatus regions 21.

The plurality of first pin junction portions 31 are arranged at intervals in one column in the second direction Y in each of the first apparatus regions 21. Further, the plurality of first pin junction portions 31 are arranged at intervals in one column in the first direction X among the plurality of first apparatus regions 21. Thus, the plurality of first pin junction portions 31 are arranged as a matrix (a matrix of three rows and three columns in this embodiment) among the plurality of first apparatus regions 21.

In this embodiment, each of the first pin junction portions 31 is shaped as a circle (including an oval) in top view. Each of the first pin junction portions 31 may have any planar shape as desired. Each of the first pin junction portions 31 may also be shaped as a polygon (for example, a quadrilateral).

The number of the first pin junction portions 31 formed in each of the first apparatus regions 21 may be one or more, and two or more may be formed. The numbers of the first pin junction portions 31 in the plurality of first apparatus regions 21 may also be different from one another. From the perspective of symmetry, the numbers of the first pin junction portions 31 in the plurality of first apparatus regions 21 are equal to one another.

The plurality of first reverse pin junction portions 38 are separated from the plurality of first pin junction portions 31 and arranged in one column in the second direction X in each of the first apparatus regions 21. The plurality of first reverse pin junction portions 38 are arranged in one column in the first direction X among the plurality of first apparatus regions 21. Further, the plurality of first reverse pin junction portions 38 are arranged in one column in the first direction X among the plurality of first apparatus regions 21. Further, the plurality of first reverse pin junction portions 38 are arranged as a matrix (a matrix of three column and three rows in this embodiment) among the plurality of first apparatus regions 21.

In this embodiment, each of the first reverse pin junction portions 38 is shaped as a circle (including an oval) in top view. Each of the first reverse pin junction portions 38 may have any planar shape as desired. Each of the first reverse pin junction portions 38 may also be shaped as a polygon (for example, a quadrilateral).

A plurality of first reverse P layers 39 (the first reverse pin junction portions 38) have a first total area ST1. The first total area ST1 is defined by the sum of first planar areas S1 of the plurality of first reverse P layers 39. The plurality of first reverse P layers 39 may have the first planar areas S1 equal to one another, respectively, or may have the first planar areas S1 different from one another. From the perspective of symmetry, the plurality of reverse P layers 39 preferably have equal first planar areas S, respectively.

The first total area ST1 may be equal to or more than 1000 $\mu m^2$ and equal to or less than 10000 $\mu m^2$. The first total area ST may also be equal to or more than 1000 $\mu m^2$ and equal to or less than 2000 $\mu m^2$, equal to or more than 2000 $\mu m^2$ and equal to or less than 4000 $\mu m^2$, equal to or more than 4000 $\mu m^2$ and equal to or less than 6000 $\mu m^2$, equal to or more than 6000 $\mu m^2$ and equal to or less than 8000 $\mu m^2$, or equal to or more than 8000 $\mu m^2$ and equal to or less than 10000 $\mu m^2$.

The number of the first reverse pin junction portions 38 formed in each of the first apparatus regions 21 may be one or more, and two or more may be formed. The numbers of the first reverse pin junction portions 38 in the plurality of first apparatus regions 21 may also be different. Among the plurality of first apparatus regions 21, from the perspective of symmetry, the numbers of the first reverse pin junction portions 38 are equal to one another.

The plurality of (three in this embodiment) of the first pin junction portions 31 formed in each of the first apparatus regions 21 are connected in parallel to one another. Further, the plurality of (three in this embodiment) first reverse pin junction portions 38 formed in each of the first apparatus regions 21 are connected in parallel to one another, and form one single first diode pair 37 between the plurality of first reverse pin junction portions 38 and one single first pn junction portion 35 formed in each of the first apparatus regions 21.

The first diode pair 37 formed in each of the first apparatus regions 21 is connected in parallel to the plurality of first pin junction portions 31 formed in each of the first apparatus regions 21 via the semiconductor chip 10 (the first semiconductor layer 14). Thus, the first parallel circuit 42 including the plurality of first pin junction portions 31 and the first diode pair 37 is individually formed the plurality of first apparatus regions 21. The plurality of first parallel circuits 42 are connected in parallel to one another via the semiconductor chip 10 (the first semiconductor layer 14).

In this embodiment, the diode chip 291 includes a plurality of (three in this embodiment) second pin junction portions 51, one second pn junction portion 55, and a plurality of (three in this embodiment) second reverse pin junction portions 58 formed in the plurality of second apparatus regions 22, respectively.

The plurality of second pin junction portions 51 are arranged at intervals in one column in the second direction Y in each of the second apparatus regions 22. Further, the plurality of second pin junction portions 51 are arranged at intervals in one column in the first direction X among the plurality of second apparatus regions 22. Thus, the plurality of second pin junction portions 51 are arranged as a matrix (a matrix of three rows and three columns in this embodiment) among the plurality of second apparatus regions 22.

Assuming a line individually cross sections the plurality of first reverse pin junction portions 38 in the first direction X, the plurality of second pin junctions 51 are formed on the line. Thus, the plurality of second pin junction portions 51 and the plurality of first reverse pin junction portions 38 are arranged alternately in the first direction X. The plurality of second pin junction portions 51 are formed preferably by a layout that is dot symmetric to the plurality of first pin junction portions 31 relative to the center portion of the first main surface 11.

In this embodiment, each of the second pin junction portions 51 is shaped as a circle (including an oval) in top view. Each of the second pin junction portions 51 may have any planar shape as desired. Each of the second pin junction portions 51 may also be shaped as a polygon (for example, a quadrilateral).

The number of the second pin junction portions 51 formed in each of the second apparatus regions 22 may be one or more, and two or more may be formed. The numbers of the second pin junction portions 51 in the plurality of second apparatus regions 22 may also be different from one another. From the perspective of symmetry, the numbers of the second pin junction portions 51 in the plurality of second apparatus regions 22 are equal to one another. Further, from the perspective of symmetry, the number of the second pin junction portions 51 is preferably equal to the number of the first pin junction portions 31.

The plurality of second reverse pin junction portions 58 are separated from the plurality of second pin junction portions 51 and arranged in one column in the second direction X in each of the second apparatus regions 22. The plurality of second reverse pin junction portions 58 and the plurality of second pin junction portions 51 are alternately formed in the second direction Y in each of the second apparatus regions 22. The plurality of second reverse pin junction portions 58 are arranged in one column in the first direction X among the plurality of second apparatus regions 22. Thus, the plurality of second reverse pin junction portions 58 are arranged as a matrix (a matrix of three column and three rows in this embodiment) among the plurality of second apparatus regions 22.

Assuming a line individually cross sections the plurality of first pin junction portions 31 in the first direction X, the plurality of second reverse pin junctions 58 are formed on the line. Thus, the plurality of second reverse pin junction portions 58 and the plurality of first pin junction portions 31 are arranged alternately in the first direction X.

The plurality of second reverse pin junction portions 58 are formed preferably by a layout that is dot symmetric to the plurality of first reverse pin junction portions 38 relative to the center portion of the first main surface 11. In the first direction X, the distance between the first reverse pin junction portion 38 and the second pin junction portion 51 is preferably equal to the distance between the first pin junction portion 31 and the second reverse pin junction portion 58.

In this embodiment, each of the second reverse pin junction portions 58 is shaped as a circle (including an oval) in top view. Each of the second reverse pin junction portions 58 may have any planar shape as desired. Each of the second reverse pin junction portions 58 may also be shaped as a polygon (for example, a quadrilateral).

The plurality of second reverse P layers 59 (the second reverse pin junction portions 58) have a second total area ST2. The second total area ST2 is defined by the sum of the second planar areas S2 of the plurality of second reverse P layers 59. The plurality of second reverse P layers 59 may have the second planar areas S2 equal to one another, respectively, or may have the second planar areas S2 different from one another, respectively. From the perspective of consistency in electrical characteristics, the plurality of second reverse P layers 59 preferably have equal second planar areas S2.

The second total area ST2 may be equal to or more than 1000 µm² and equal to or less than 10000 µm². The second total area ST2 may also be equal to or more than 1000 µm² and equal to or less than 2000 µm², equal to or more than 2000 µm² and equal to or less than 4000 µm², equal to or more than 4000 µm² and equal to or less than 6000 µm², equal to or more than 6000 µm² and equal to or less than 8000 µm, or equal to or more than 8000 µm² and equal to or less than 10000 µm².

The second total area ST2 is preferably equal to the first total area ST1 of the plurality of first reverse P layers 39. In this case, the second planar area ST2 of each of the second reverse P layers 59 is more preferably equal to the first planar areas S1 of each of the first reverse P layer 39.

The number of the second reverse pin junction portions 58 formed in each of the second apparatus regions 22 may be one or more, and two or more may be formed. The numbers of the second reverse pin junction portions 58 in the plurality of second apparatus regions 22 may be different. From the perspective of symmetry, the numbers of the second reverse pin junction portions 58 in the plurality of second apparatus regions 22 are equal to one another. Further, from the perspective of symmetry, the number of the second reverse pin junction portions 58 is preferably equal to the number of the first reverse pin junction portions 38.

The plurality of (three in this embodiment) of the second pin junction portions 51 formed in each of the second apparatus regions 22 are connected in parallel to one another. Further, the plurality of (three in this embodiment) second reverse pin junction portions 58 formed in each of the second apparatus regions 22 are connected in parallel to one another, and form one single second diode pair 57 between the plurality of second reverse pin junction portions 58 and one single second pn junction portion 55 formed in each of the second apparatus regions 22.

The second diode pair 57 formed in each of the second apparatus regions 22 is connected in parallel to the plurality of second pin junction portions 51 formed in each of the second apparatus regions 22 via the semiconductor chip 10 (the first semiconductor layer 14). Thus, the second parallel circuit 62 including the plurality of second pin junction portions 51 and the second diode pair 57 is formed in each of the plurality of second apparatus regions 22. The plurality of second parallel circuits 62 are connected in parallel to one another via the semiconductor chip 10 (the first semiconductor layer 14).

The inter-insulation layer 91 includes a plurality of first pin openings 92, a plurality of first reverse pin openings 93, a plurality of second pin openings 94, and a plurality of second reverse pin openings 95. The plurality of first pin openings 92 expose the corresponding first pin junction portions 31 in the corresponding first apparatus regions 21 in one-on-one correspondence. The plurality of first reverse pin openings 93 expose the corresponding first reverse pin junction portions 38 in the corresponding first apparatus regions 21 in one-on-one correspondence. The plurality of second pin openings 94 expose the corresponding second pin junction portions 51 in the corresponding second apparatus regions 22 in one-on-one correspondence. The plurality of second reverse pin openings 95 expose the corresponding second reverse pin junction portions 58 in the corresponding second apparatus regions 22 in one-on-one correspondence.

The first electrode layer 101 includes the first pad portion 101A and a plurality of first wiring portions 101B. The first pad portion 101A is separated from the plurality of first apparatus regions 21 and the plurality of second apparatus regions 22 and is formed on the first pad region 273 in top view. The first pad portion 101A is formed in a region non-overlapping with the plurality of first apparatus regions 21 and the plurality of second apparatus regions 22 in top view. The first pad portion 101A may also overlap a portion of the plurality of first apparatus regions 21 and a portion of the plurality second apparatus regions 22 in top view.

The plurality of first wiring portions 101B are led out as band shapes from the first pad portion 101A toward the plurality of first apparatus regions 21. The plurality of wiring portions 101B are led out in one-on-one correspondence relative to the plurality of first apparatus regions 21. Thus, the plurality of first wiring portions 101B are shaped as a comb in top view. The width of the plurality of first wiring portions 101B in the first direction X may be any value as desired.

The plurality of first wiring portions 101B enter the corresponding first pin openings 92 and the corresponding first reverse pin openings 93 from above the inter-insulation layer 91. The plurality of first wiring portions 10B are electrically connected to the corresponding first pin junction portions 31 in the corresponding first pin openings 92. Ohmic contacts are formed between the plurality of first wiring portions 101B and the corresponding first pin junction portions 31 (specifically, the first N layers 32).

The plurality of first wiring portions 101B are electrically connected to the corresponding first reverse pin junction portions 38 in the corresponding first reverse pin openings 93. Ohmic contacts are formed between the plurality of first wiring portions 101B and the corresponding first reverse pin junction portions 38 (specifically, the first reverse P layers 39). As such, the first electrode layer 101 connects the plurality of first pin junction portions 31 and the plurality of first diode pairs 37 in parallel.

The second electrode layer 102 includes the second pad portion 102A and a plurality of second wiring portions 102B. The second pad portion 102A is separated from the plurality of first apparatus regions 21 and the plurality of second apparatus regions 22 and is formed in the second pad region 274. In this embodiment, the second pad portion 102A is formed in a region non-overlapping with the plurality of first apparatus regions 21 and the plurality of second apparatus regions 22 in top view. The second portion 102A may also overlap a portion of the plurality of first apparatus regions 21 and the plurality of second apparatus regions 22 in top view.

The plurality of second wiring portions 102B are led out as band shapes from the second pad portion 102A toward the plurality of second apparatus regions 22. The plurality of second wiring portions 102B are led out in one-on-one correspondence relative to the plurality of second apparatus regions 22. The plurality of second wiring portions 102B extend in parallel to the plurality of first wiring portions 101B The plurality of second wiring portions 102B are formed at intervals from the plurality of first wiring portions 101B in the first direction X, and plurality of second wiring portions 102B and the plurality of first wiring portions 101B are alternately formed.

Thus, the plurality of second wiring portions 102B are shaped as a comb engaged with the plurality of first wiring portions 101B in top view. The width of the plurality of second wiring portions 102B in the first direction X may be any value as desired. The width of the plurality of second wiring portions 102B in the first direction X is preferably equal to the width of the plurality of first wiring portions 101B in the first direction X.

The plurality of second wiring portions 102B enter the corresponding second pin openings 94 and the second corresponding reverse pin openings 95 from above the inter-insulation layer 91. The plurality of second wiring portions 102B are electrically connected to the corresponding second pin junction portions 51 in the corresponding second pin openings 94. Ohmic contacts are formed between the second wiring portions 102B and the corresponding second pin junction portions 51 (specifically, the second N layers 52).

The plurality of second wiring portions 102B are electrically connected to the corresponding second reverse pin junction portions 58 in the corresponding second reverse pin opening 95. Ohmic contacts are formed between the plurality of second wiring portions 102B and corresponding the second reverse pin junction portion 58 (specifically, the second reverse P layers 59). As such, the second electrode layer 102 connects the plurality of second pin junction portions 51 and the corresponding second diode pairs 57 in parallel.

Figure 17:
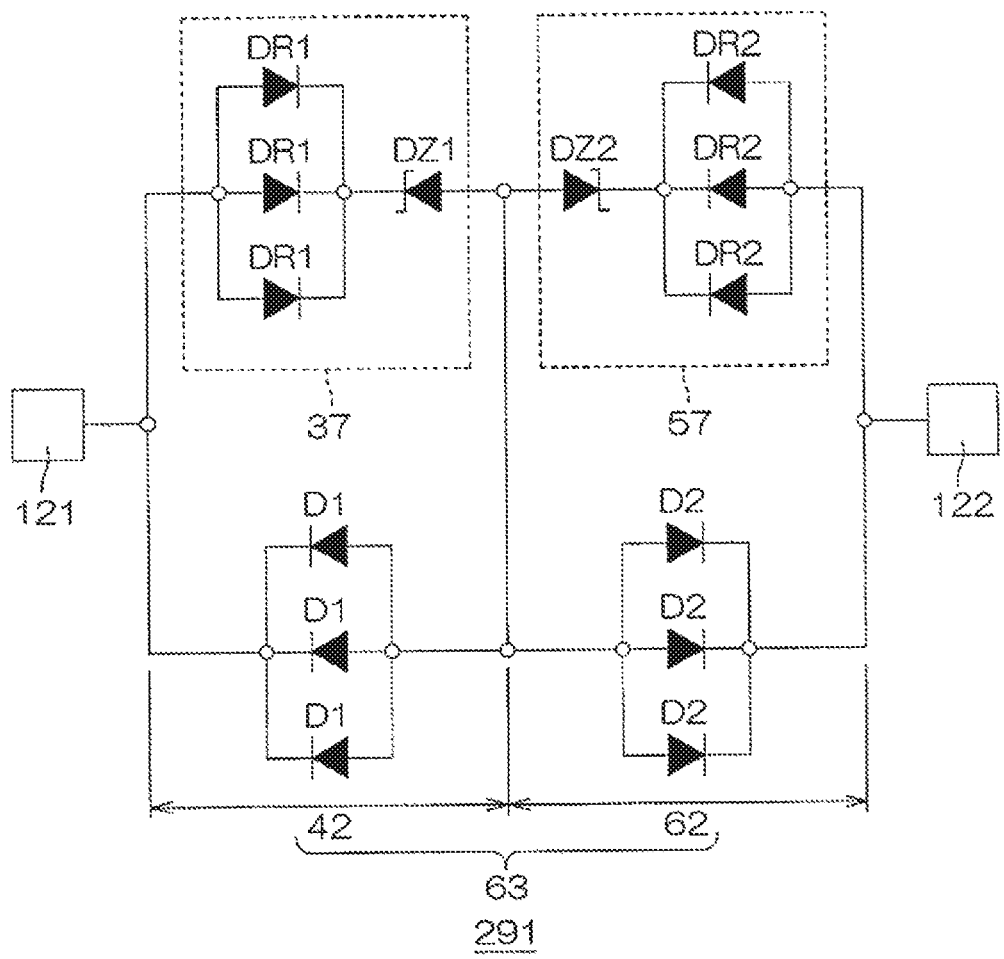
FIG. 17 is an electrical circuit diagram of the diode chip in FIG. 16.

FIG. 17 shows an electrical circuit diagram of the diode chip 291 in FIG. 16. In FIG. 17, an electrical circuit (one TVS circuit 63) formed by a pair of first apparatus region 21 and second apparatus region 22 is extracted and depicted. The diode chip 291 includes a circuit configuration formed by connecting in parallel three of the electrical circuit (one TVS circuit 63) shown in FIG. 17.

Referring to FIG. 17, the diode chip 291 includes the first terminal electrode 121, the second terminal electrode 122 and the TVS circuit 63. The TVS circuit 63 includes a series circuit including the first series circuit 42 and the second series circuit 62 connected in series, and is electrically connected to the first terminal electrode 121 and the second terminal electrode 122.

The first parallel circuit 42 includes a plurality of first pin diodes D1 and the first diode pair 37. The first diode pair 37 includes a plurality of first reverse pin diodes DR1 and one first Zener diode DZ1. The plurality of first pin diodes D1 are connected in parallel to one another. The cathodes of the plurality of first pin diodes D1 are connected to the first terminal electrode 121.

The plurality of first reverse pin diodes DR1 are connected in parallel to one another. The cathodes of the plurality of first reverse pin diodes DR1 are reverse bias connected to the cathode of the first Zener diode DZ1. The anodes of the plurality of first reverse pin diodes DR1 are electrically connected to the first terminal electrode 121. The anode of the first Zener diode DZ1 is reverse bias connected to the anodes of the plurality of first pin diodes D1.

The second parallel circuit 62 includes a plurality of second pin diodes D2 and the second diode pair 57. The second diode pair 57 includes a plurality of second reverse pin diodes DR2 and one second Zener diode DZ2. The plurality of second pin diodes D2 are connected in parallel to one another. The cathodes of the plurality of second pin diodes D2 are electrically connected to the second terminal electrode 122. The anodes of the plurality of second pin diodes D2 are reverse bias connected to the anode of the first pin diode D1 and the anode of the first Zener diode DZ1.

The plurality of second reverse pin diodes DR2 are connected in parallel to one another. The cathodes of the plurality of second reverse pin diodes DR2 are reverse bias connected to the cathode of the second Zener diode DZ2. The anodes of the plurality of second reverse pin diodes DR2 are electrically connected to the second terminal electrode 122. The anode of the second Zener diode DZ2 is reverse bias connected to the anodes of the plurality of first pin diodes D1, the anode of the first Zener diode DZ1 and the anodes of the plurality of second pin diodes D2.

Figure 18:
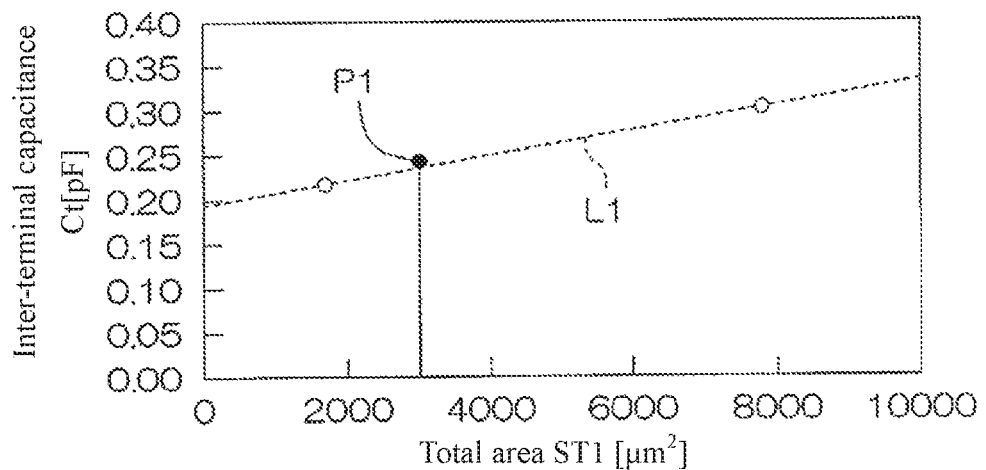
FIG. 18 is a curve diagram representing the inter-terminal capacitance of the diode chip in FIG. 16.

FIG. 18 shows a curve diagram of the inter-terminal capacitance CT of the diode chip 291 in FIG. 16. The vertical axis represents the inter-terminal capacitance CT [in pF], and the horizontal axis represents the first total area ST1 [in $\mu m^2$] of the plurality of first reverse P layers 39. Since the diode chip 291 is a bi-directional device, the same applies to a case of setting the horizontal axis as the second total area ST2 [in m] of the plurality of second reverse P layers 59.

In FIG. 18, the capacitance characteristic L1 represents the inter-terminal capacitance CT of the diode chip 1 of the first embodiment. Further, in FIG. 18, a first point P1 represents the inter-terminal capacitance CT of the diode chip 291 of the second embodiment.

The first point P1 represents the inter-terminal capacitance CT of the diode chip 291 when the first total area ST1 is set as 3000 $\mu m^2$. Referring to the first point P1, the inter-terminal capacitance CT of the diode chip 291 is equal to or more than 0.2 pF and equal to or less than 0.25 pF, which is substantially the same as the capacitance characteristic L1.

Figure 19:
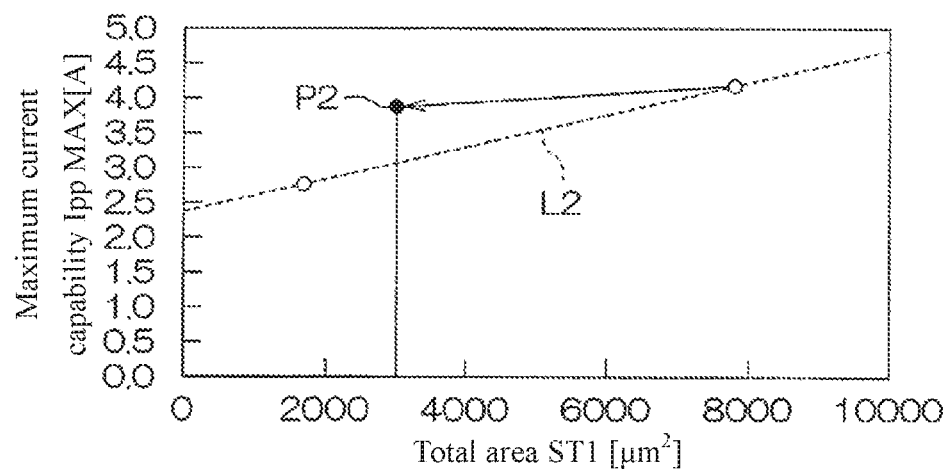
FIG. 19 is a curve diagram representing the maximum current capability of the diode chip in FIG. 16.

FIG. 19 shows a curve diagram representing a maximum current capability IPP of the diode chip 291 in FIG. 16. The vertical axis represents the maximum current capability [in A], and the horizontal axis represents the first total area ST1 [in $\mu m^2$] of the plurality of first reverse P layers 39. Since the diode chip 291 is a bi-directional device, the same applies to a case of setting the horizontal axis as the second total area ST2 [in $\mu m^2$] of the plurality of second reverse P layers 59.

In FIG. 19, a dotted line represents the current characteristic L2 of the diode chip 1 of the first embodiment. Further, in FIG. 19, a second point P2 represents the maximum current capability IPP of the diode chip 291 of the second embodiment.

The second point P2 represents the maximum current capability of the diode chip 291 when the first total area ST1 is set as 3000 $\mu m^2$. Referring to the second point P2, the maximum current capability IPP of the diode chip 291 is equal to or more than 3.5 A and equal to or less than 4 A and changes from the current characteristic L2 toward an increase.

Figure 20:
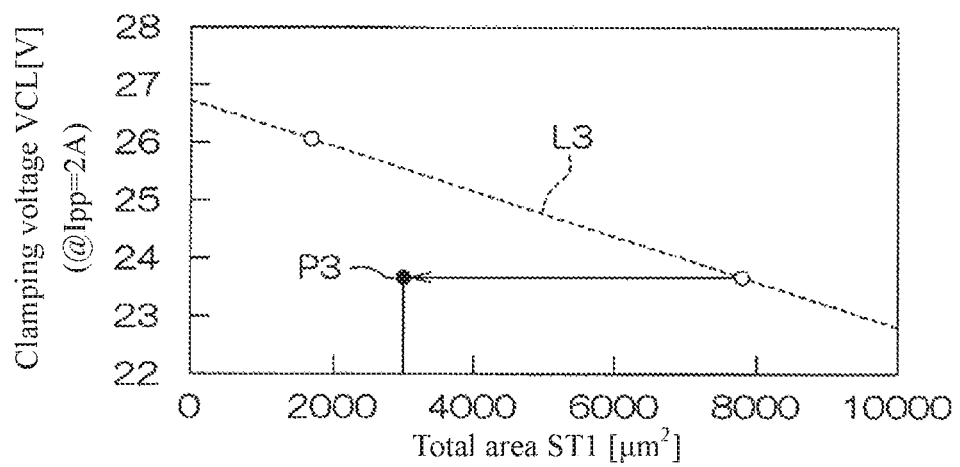
FIG. 20 is a curve diagram of the clamping voltage of the diode chip in FIG. 16.

FIG. 20 shows a curve diagram of the clamping voltage VCL of the diode chip 291 in FIG. 16. The vertical axis represents the clamping voltage VCL [in V], and the horizontal axis represents the first total area ST1 [in $\mu m^2$] of the plurality of first reverse P layers 39. Since the diode chip 291 is a bi-directional device, the same applies to a case of setting the horizontal axis as the second total area ST2 [in $\mu m^2$] of the plurality of second reverse Players 59.

In FIG. 20, a dotted represents the voltage characteristic L3 of the diode chip 1 of the first embodiment. Further, in FIG. 20, a third point P3 represents the clamping voltage VCL of the diode chip 291 of the second embodiment.

The third point P3 represents the clamping voltage VCL of the diode chip 291 when the first total area ST1 is set as 3000 $\mu m^2$. Referring to the third point P3, the clamping voltage VCL of the diode chip 291 is equal to or more than 23 V and equal to or less than 24 V and changes from the voltage characteristic L3 toward a decrease.

Referring to FIG. 18 to FIG. 20, in the diode chip 1 of the first embodiment, the inter-terminal capacitance CT, the maximum current capability IPP and the clamping voltage VLC have a trade-off relationship. In contrast, in the diode chip 291 of the second embodiment, the inter-terminal capacitance CT, the maximum current capability IPP and the clamping voltage VLC are liberated from the foregoing trade-off relationship and be accordingly adjusted.

It is considered that reason for the above is that, the load resulted on the first reverse pin junction portion 38 (the second reverse pin junction portion 58) may be alleviated (distributed) by forming the plurality of first reverse pin junction portions 38 (the second reverse pin junction portions 58).

In summary, the same effect as described for the diode chip 1 may also be achieved by the diode chip 291. Further, according to the diode chip 291, the plurality of first reverse P layers 39 having a relatively small first planar area S1 are formed by the first total area ST1. Thus, compared to a situation of forming one first reverse P layer 39 having a relatively large first planar area S1, the degree of design freedom may be increased, and at the same time a lower inter-terminal capacitance CT, a higher maximum current capability IPP and a lower clamping voltage VCL may be achieved.

Figure 21:
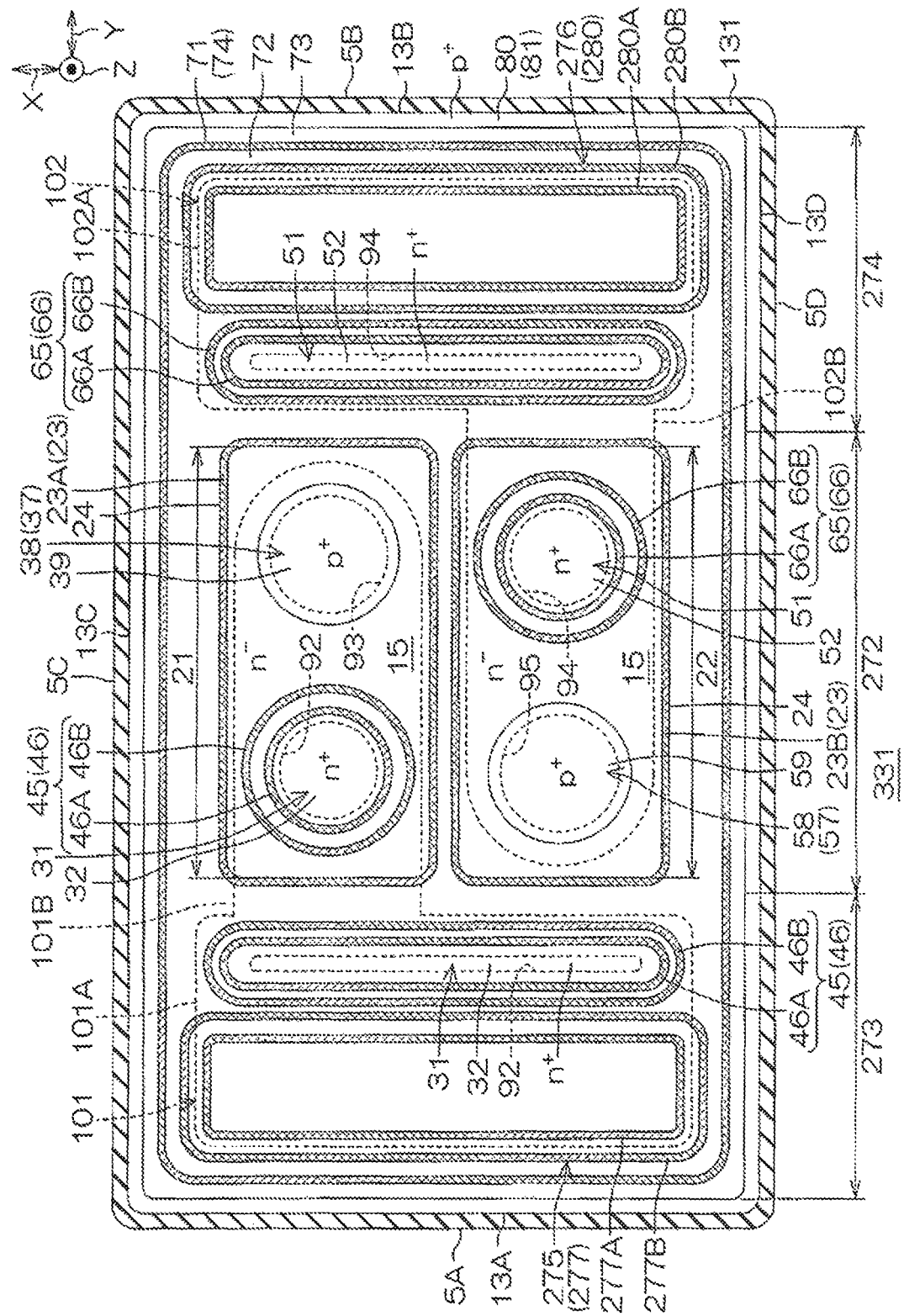
FIG. 21 is a corresponding diagram of FIG. 8, and is a top view of a diode chip according to a third embodiment of the present invention.

FIG. 21 shows a corresponding diagram of FIG. 8, and is a top view of a diode chip 331 according to a third embodiment of the present invention. In the description below, a structure corresponding to the structure described for the diode chip 1 is denoted by the same reference denotations and the associated description is omitted.

Referring to FIG. 21, the diode chip 331 includes one first pin junction portion 31 formed in the first pad region 273. The first pin junction portion 31 on the side of the first pad region 273 has the first pin diode D1 formed in the first pad region 273.

The first pin junction portion 31 on the side of the first pad region 273 is shaped as a band extending in the first direction X in the first pad region 273. In this embodiment, assuming a center line cross sections the center portion of the first main surface 11 in the second direction Y, the first pin junction portion 31 on the side of the first pad region 273 forms a band shape that cross sections the center line.

Thus, the first pin junction portion 31 on the side of the first pad region 273 is opposite to the first apparatus region 21 and the second apparatus region 22 in the second direction Y. The first pin junction portion 31 on the side of the first pad region 273 may also form a configuration (length) of being opposite to only any one of the first apparatus region 21 and the second apparatus region 22 in the second direction Y.

Similar to the first pin junction portion 31 in the first apparatus region 21, the first pin junction portion 31 on the side of the first pad region 273 is separated from other regions by the first junction separation structure 45. The first junction separation structure 45 has a double trench structure that surrounds the first pin junction portion 31 on the side of the first pad region 273 in a manner of sandwiching the peripheral portion of the first P layer 34 of the first pin junction portion 31 from both sides.

The diode chip 331 includes one second pin junction portion 51 formed in the second pad region 274. The second pin junction portion 51 on the side of the second pad region 274 has the second pin diode D2 formed in the second pad region 274.

The second pin junction portion 51 on the side of the second pad region 274 is shaped as a band extending in the second direction X in the second pad region 274. In this embodiment, assuming a center line cross sections the center portion of the first main surface 11 in the second direction Y, the second pin junction portion 51 on the side of the second pad region 274 forms a band shape that cross sections the center line.

Thus, the second pin junction portion 51 on the side of the second pad region 274 is opposite to the first apparatus region 21 and the second apparatus region 22 in the second direction Y. Further, the second pin junction portion 51 on the side of the second pad region 274 is opposite to the first pin junction portion 31 on the side of the first pad region 273 with the first apparatus region 21 and the second apparatus region 22 interposed in between. The second pin junction portion 51 on the side of the second pad region 274 may also form a configuration (length) of being opposite to only any one of the first apparatus region 21 and the second apparatus region 22 in the second direction Y.

Assuming a center line cross sections the center portion of the semiconductor chip 10 in the first direction X, the second pin junction portion 51 on the side of the second pad region 274 is formed preferably by a layout of being line symmetric relative to the first pin junction portion 31 on the side of the first pad region 273 relative to the center line. Further, the second pin junction portion 51 on the side of the second pad region 274 is formed preferably by a layout of being dot symmetric to the first pin junction portion 31 on the side of the first pad region 273 relative to the center portion of the semiconductor chip 10.

Similar to the second pin junction portion 51 in the second apparatus region 22, the second pin junction portion 51 on the side of the second pad region 274 is separated from other regions by the second junction separation structure 65. The second junction separation structure 65 has a double trench structure that surrounds the second pin junction portion 51 on the side of the second pad region 274 in a manner of sandwiching the peripheral portion of the second P layer 54 of the second pin junction portion 51 from both sides.

The first pad separation structure 275 is separated from the first pin junction portion 31 on the side of the first pad region 273, and is formed in a region on one side (the side of the first side surface 13A) of the first main surface 11. The second pad separation structure 276 is separated from the second pin junction portion 51 on the side of the second pad region 274, and is formed in a region on the other side (the side of the second side surface 13B) of the first main surface 11.

The inter-insulation layer 91 includes a plurality of first pin openings 92 and a plurality of second pin openings 94. The plurality of first pin openings 92 expose the first pin junction portion 31 in the first apparatus region 21, and expose the first pin junction portion 31 in the first pad region 273. The plurality of second pin openings 94 expose the second pin junction portion 51 in the second apparatus region 22, and expose the second pin junction portion 51 in the second pad region 274.

The first electrode layer 101 penetrates the inter-insulation layer 91 and is hence electrically connected to the first pin junction portion 31 and the first diode pair 37 in the first apparatus region 21, and penetrates the inter-insulation layer 91 and is hence electrically connected to the first pin junction portion 31 in the first pad region 273. The first electrode layer 101 includes a first pad portion 101A and a first wiring portion 101B.

The first pad portion 101A further covers, in addition to a region surrounded by the first separation structure 275, the first pin junction portion 31 on the side of the first pad region 273. The first pad portion 101A enters the first pin opening 92 from above the inter-insulation layer 91. The first pad portion 101A is electrically connected to the first pin junction portion 31 on the side of the first pad region 273 in the first pin opening 92. An ohmic contact is formed between the first pad portion 101A and first pin junction portion 31 on the side of the first pad region 273 (specifically, the first N layer 32).

The second electrode layer 102 penetrates the inter-insulation layer 91 and is hence electrically connected to the second pin junction portion 51 and the second diode pair 57 in the second apparatus region 22, and penetrates the inter-insulation layer 91 and is hence electrically connected to the second pin junction portion 51 in the second pad region 274. The second electrode layer 102 includes a second pad portion 102A and a second wiring portion 102B.

The second pad portion 102A further covers, in addition to a region surrounded by the second separation structure 276, the second pin junction portion 51 on the side of the second pad region 274. The second pad portion 102A enters the second pin opening 94 from above the inter-insulation layer 91. The second pad portion 102A is electrically connected to the second pin junction portion 51 on the side of the second pad region 274 in the second pin opening 94. An ohmic contact is formed between the second pad portion 102A and second pin junction portion 51 on the side of the second pad region 274 (specifically, the second N layer 52).

In summary, the same effect as described for the diode chip 1 may also be achieved by the diode chip 331. The structure of the diode chip 331 may also be incorporated into the second embodiment.

In this embodiment, an example of the first pad region 273 having one first pin junction portion 31 formed is described. However, the number of the first pin junction portion 31 on the side of the first pad region 273 may be any value as desired. Two or more first pin junction portions 31 may also be formed in the first pad region 273.

Further, in this embodiment, an example of the second pad region 274 having one second pin junction portion 51 formed is described. However, the number of the second pin junction portion 51 on the side of the second pad region 274 may be any value as desired. Two more second pin junction portions 51 may also be formed in the second pad region 274.

Figure 22:
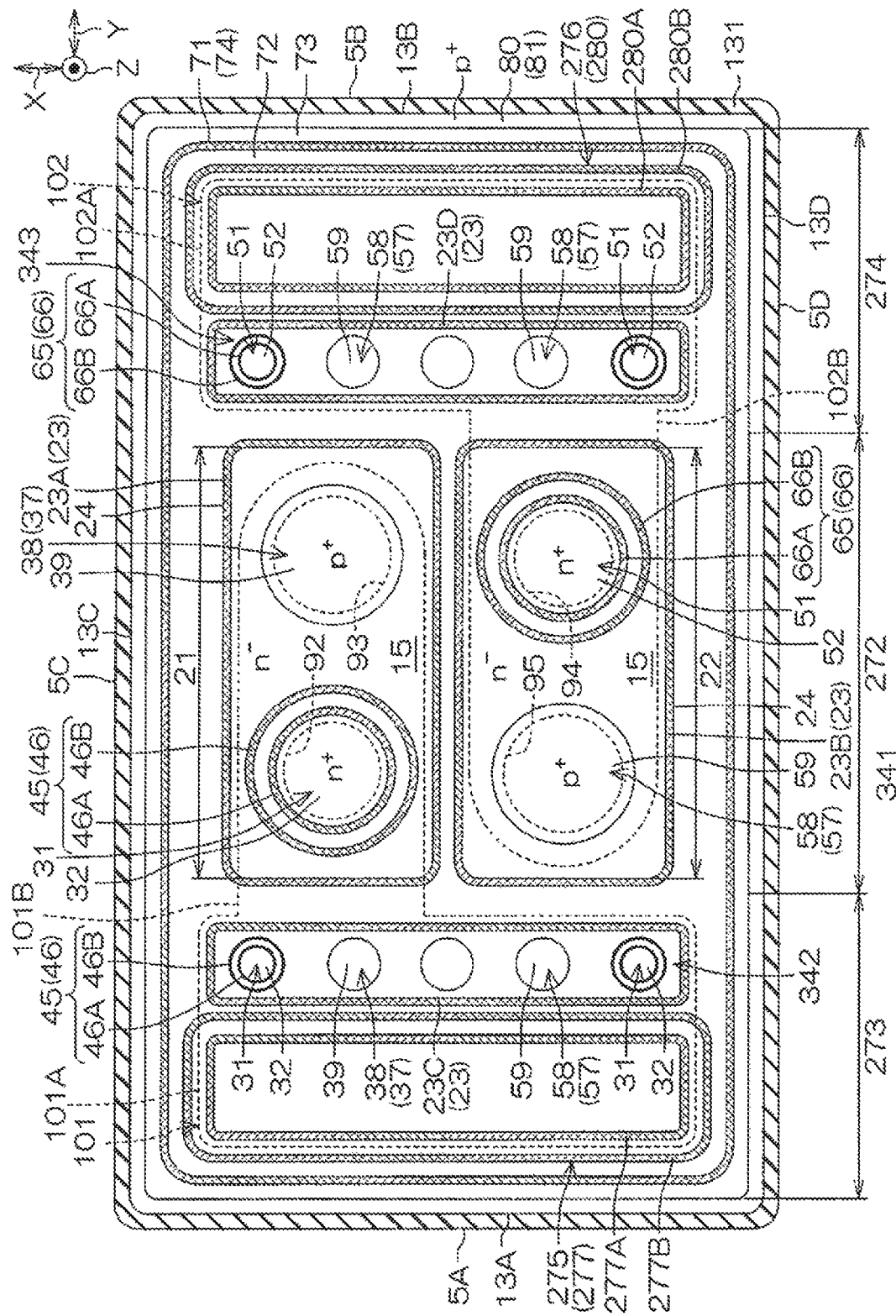
FIG. 22 is a corresponding diagram of FIG. 8, and is a top view of a diode chip according to a fourth embodiment of the present invention.

FIG. 22 shows a corresponding diagram of FIG. 8, and is a top view of a diode chip 341 of a fourth embodiment of the present invention. In the description below, a structure corresponding to the structure described for the diode chip 1 is denoted by the same reference denotations and the associated description is omitted.

Referring to FIG. 22, a diode chip 341 includes a third apparatus region 342 formed in the first pad region 273, and a fourth apparatus region 343 formed in the second pad region 274.

The third apparatus region 342 is shaped as a band (a rectangle) extending in the first direction X in the first pad region 273. In this embodiment, assuming a center line cross sections the center portion of the first main surface 11 in the second direction Y, the third apparatus region 342 forms the band that cross sections the center line.

Thus, the third apparatus region 342 is opposite to the first apparatus region 21 and the second apparatus region 22 in the second direction Y. The third apparatus region 342 may also be formed as having a configuration (length) of being opposite to only any one of the first apparatus region 21 and the second apparatus region 22 in the second direction Y.

The fourth apparatus region 343 is shaped as a band (a rectangle) extending in the first direction X in the second pad region 274. In this embodiment, assuming a center line cross sections the center portion of the first main surface 11 in the second direction Y, the fourth apparatus region 343 forms the band that cross sections the center line.

Thus, the fourth apparatus region 343 is opposite to the first apparatus region 21 and the second apparatus region 22 in the second direction Y. Further, the fourth apparatus region 343 is opposite to the third apparatus region 342 with the first apparatus region 21 and the second apparatus region 22 interposed in between. The fourth apparatus region 343 may also be formed as having a configuration (length) of being opposite to only any one of the first apparatus region 21 and the second apparatus region 22 in the second direction Y.

Assuming a center line cross sections the center portion of the semiconductor chip 10 in the first direction X, the fourth apparatus region 343 is formed preferably by a layout of being line symmetric to the third apparatus region 342 relative to the center line. Further, the fourth apparatus region 343 is formed preferably by a layout of being dot symmetric to the third apparatus region 342 relative to the center portion of the semiconductor chip 10.

In this embodiment, the region separation structure 23 includes a third region separation structure 23C separating the third apparatus region 342, and a fourth region separation structure 23D separating the fourth apparatus region 343. The third region separation structure 23C is shaped as a loop surrounding the third apparatus region 342 in top view. The third apparatus region 342 has a planar shape that is adjusted by the third region separation structure 23C. The fourth region separation structure 23D is shaped as a loop surrounding the fourth apparatus region 343 in top view. The fourth apparatus region 343 has a planar shape that is adjusted by the fourth region separation structure 23D.

The diode chip 341 includes a plurality of (two in this embodiment) first pin junction portions 31, one first pn junction portion 35, and a plurality of (three in this embodiment) first reverse pin junction portions 38 formed in the third apparatus region 342. The number of the first pin junction portions 31 and the number of the first reverse pin junction portions 38 formed in the third apparatus region 342 may be in any values as desired.

The layout of the plurality of first pin junction portion 31 and the layout of the plurality of first reverse pin junction portion 38 in the third apparatus region 342 may be any as desired. In this embodiment, the plurality of first pin junction portions 31 are formed on both two sides of the third apparatus region 342 in the first direction X, respectively. The plurality of first reverse pin junction portions 38 are formed in a region sandwiched by the plurality of first pin junction portions 31 in the third apparatus region 342, respectively. In this embodiment, the plurality of first reverse pin junction portions 38 are arranged in one column in the first direction X.

The plurality of first junction separation structures 45 surround a plurality of first pin junction portions 31 in the third apparatus region 342 in one-on-one correspondence. In FIG. 22, the first junction separation structures 45 in the third apparatus region 342 are represented by thick lines. Each of the first junction separation structures 45 has a double trench structure that surrounds the first pin junction portion 31 in a manner of sandwiching the boundary between the first pin junction portion 31 (the first P layer 34) and the first pn junction 35 (the first internal N layer 36) from both sides in the third apparatus region 342.

The diode chip 341 includes a plurality of (two in this embodiment) second pin junction portions 51, one second pn junction portion 55 and a plurality of (three in this embodiment) second reverse junction portions 58 formed in the fourth apparatus region 343. The number of second pin junction portions 51 and the number of second reverse pin junction portions 58 formed in the fourth apparatus region 343 may be in any values as desired.

The layout of the plurality of second pin junction portions 51 and the layout of the plurality of second reverse pin junction portions 58 may be any as desired. In this embodiment, the plurality of second pin junction portions 51 are formed in the first direction X on two sides of the fourth apparatus region 343, respectively. The plurality of second reverse pin junction portions 58 are formed in a region sandwiched by the plurality of second pin junction portions 51 in the fourth apparatus region 343, respectively. In this embodiment, the plurality of second reverse pin junction portions 58 are arranged in one column in the first direction X.

Assuming a center line cross sections the center portion of the semiconductor chip 10 in the first direction X, the second pin junction portions 51 in the fourth apparatus region 343 are formed preferably by a layout of being line symmetric to the first pin junction portions 51 in the third apparatus region 342 relative to the center line. Further, the plurality of second pin junction portions 51 in the fourth apparatus region 343 is preferably formed by a layout of being dot symmetric to the first pin junction portions 31 in the third apparatus region 342 relative to the center portion of the first main surface 11.

Assuming a center line cross sections the center portion of the semiconductor chip 10 in the first direction X, the second reverse pin junction portions 58 in the fourth apparatus region 343 are formed preferably by a layout of being line symmetric to the first reverse pin junction portions 38 in the third apparatus region 342 relative to the center line. Further, the second reverse pin junction portions 58 in the fourth apparatus region 343 are formed preferably by a layout of being dot symmetric to the first reverse pin junction portions 38 in the third apparatus region 342 relative to the center portion of the first main surface 11.

The plurality of second junction separation structures 65 surround the plurality of second pin junction portions 51 in the fourth apparatus region 343 in one-on-one correspondence. In FIG. 22, the second junction separation structures 65 in the fourth apparatus region 343 are represented by thick lines. Each of the second junction separation structures 65 has a double trench structure that surrounds the second pin junction portion 51 in a manner of sandwiching the boundary between the second pin junction portion 51 (the second P layer 54) and the second pn junction 55 (the second internal N layer 56) from both sides in the fourth apparatus region 343.

The first pad separation structure 275 is separated from the third apparatus region 342 and is formed on one side (the side of the first side surface 13A) of the first main surface 11. The second pad separation structure 276 is separated from the fourth apparatus region 343 and is formed one the other side (the side of the second side surface 13B) of the first main surface 11.

The inter-insulation layer 91 includes a plurality of first pin openings 92, a plurality of first reverse pin openings 93, a plurality of second pin openings 94, and a plurality of second reverse pin openings 95.

The plurality of first pin openings 92 expose the first pin junction 31 in the first apparatus region 21, and expose the plurality of first pin junctions 31 in the third apparatus region 342 in one-on-one correspondence. The plurality of first reverse pin openings 93 expose the first reverse pin junction portion 38 in the first apparatus region 21, and expose the plurality of first pin junctions 38 in the third apparatus region 342 in one-on-one correspondence.

The plurality of second pin openings 94 expose the second pin junction portion 51 in the second apparatus region 22, and expose the plurality of second pin junction portions 51 in the fourth apparatus region 343 in one-on-one correspondence. The plurality of second reverse openings 95 expose the second reverse pin junction portion 58 in the second apparatus region 22, and expose the plurality of second reverse pin junction portions 58 in the fourth apparatus region 343 in one-on-one correspondence.

The first electrode layer 101 penetrates the inter-insulation layer 91 and is hence electrically connected to the first pin junction portion 31 and the first diode pair 37 in the first apparatus region 21, and penetrates the inter-insulation layer 91 and is hence electrically connected to the plurality of first pin junction portions 31 and the first diode pair 37 in the third apparatus region 342. The first electrode layer 101 includes a first pad portion 101A and a first wiring portion 101B.

The first pad portion 101A covers, in addition to a region surrounded by the first pad separation structure 275, the third apparatus region 342. The first pad portion 101A enters the plurality of first pin openings 92 and the plurality of first reverse openings 93 from above the inter-insulation layer 91.

The first pad portion 101A is electrically connected to the corresponding first pin junction portion 31 in the corresponding first pin opening 92 in the third apparatus region 342. An ohmic contact is formed between the first pad portion 101A and the first pin junction 31 (specifically, the first N layer 32) in the third apparatus region 342.

The first pad portion 101A is electrically connected to the corresponding first reverse junction portion 38 in the corresponding first reverse pin opening 93 in the third apparatus region 342. An ohmic contact is formed between the first pad portion 101A and the first reverse pin junction portion 38 (specifically, the first reverse P layer 39) in the third apparatus region 342.

The second electrode 102 penetrates the inter-insulation layer 91 and is hence electrically connected to the second pin junction portion 51 and the second diode pair 57 in the second apparatus region 22, and penetrates the inter-insulation layer 91 and is hence electrically connected to the plurality of second pin junction portions 51 and the second diode pair 57 in the fourth apparatus region 343. The second electrode layer 102 includes a second pad portion 102A and a second wiring portion 102B.

The second pad portion 102A covers, in addition to a region surrounded by the second pad separation structure 276, the fourth apparatus region 343. The second pad portion 102A enters the plurality of second pin openings 94 and the plurality of second reverse openings 95 from above the inter-insulation layer 91.

The second pad portion 10A is electrically connected to the corresponding second pin junction portion 51 in the corresponding second pin opening 94 in the fourth apparatus region 343. An ohmic contact is formed between the second pad portion 102A and the second pin junction portion 51 (specifically, the second N layer 52) in the fourth apparatus region 343.

The second pad portion 102A is electrically connected to the corresponding second reverse pin junction portion 58 in the corresponding second reverse pin opening 95 in the fourth apparatus region 343. An ohmic contact is formed between the second pad portion 102A and the second reverse pin junction portion 58 (specifically, the second reverse P layer 59) in the fourth apparatus region 343.

In summary, the same effect as described for the diode chip 1 may also be achieved by the diode chip 341. The structure of the diode chip 341 may also be incorporated into the second and third embodiments.

Figure 23:
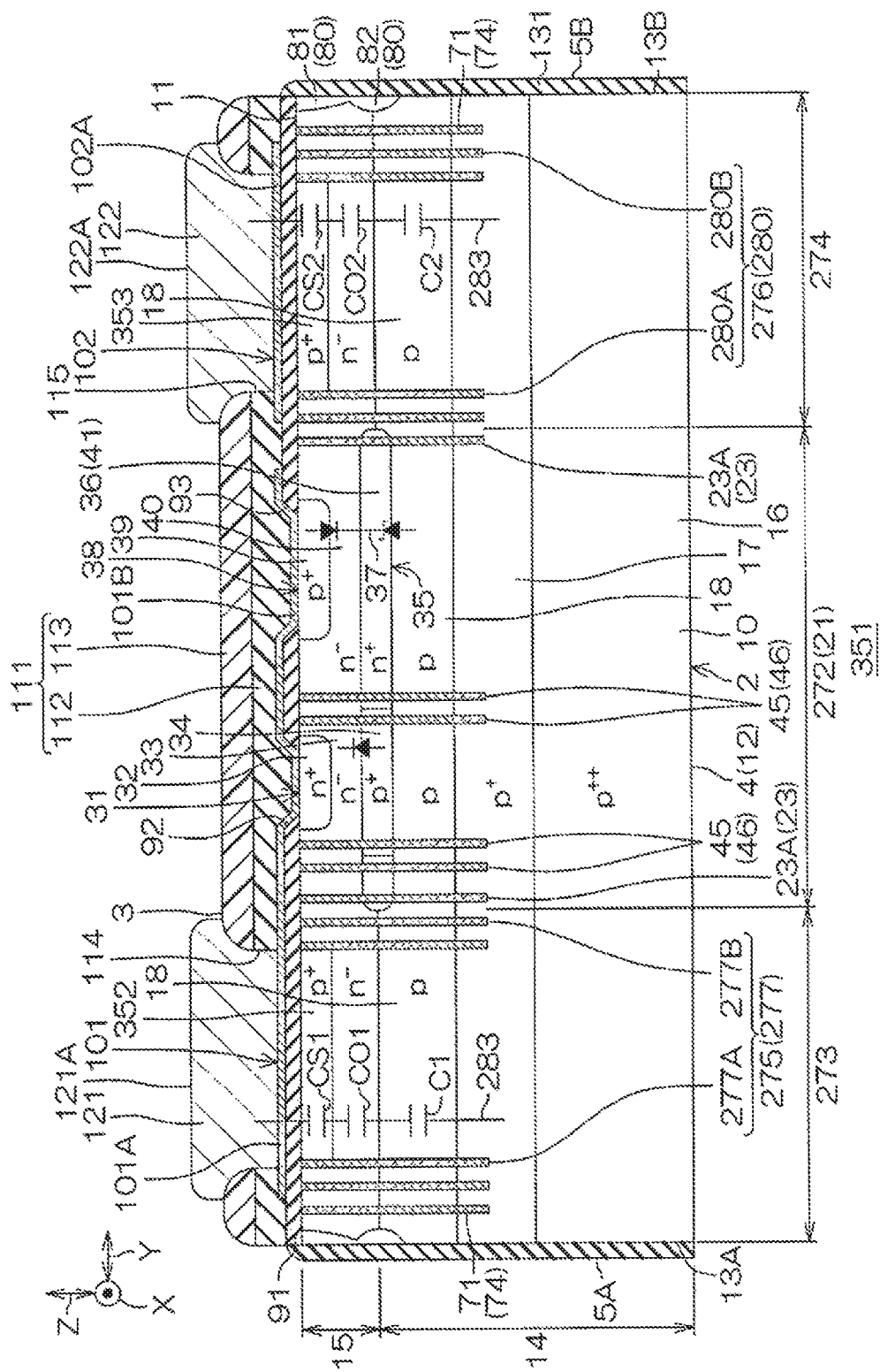
FIG. 23 is a corresponding diagram of FIG. 3, and is a cross-sectional diagram of a diode chip according to a fifth embodiment of the present invention.

FIG. 23 shows a corresponding diagram of FIG. 3, and is a cross-sectional diagram of a diode chip 351 according to a fifth embodiment of the present invention. In the description below, a structure corresponding to the structure described for the diode chip 1 is denoted by the same reference denotations and the associated description is omitted.

The diode chip 351 includes, in the first pad region 273, a p$^+$-type first capacitance layer 352 formed at a surface layer portion of a region surrounded by the first pad separation structure 275. More specifically, the first capacitance layer 352 is formed at the surface layer portion of the second semiconductor layer 15. The first capacitance layer 352 has a p-type impurity concentration more than the n-type impurity concentration of the second semiconductor layer 15. The p-type impurity concentration of the first capacitance layer 352 may have a peak of equal to or more than $1\times10^{18}$ cm$^{-3}$ and equal to or less than $1\times10^{21}$ cm$^{-3}$. The peak of the p-type impurity concentration of the first capacitance layer 352 is preferably equal to or more than $5\times10^{18}$ cm$^{-3}$ and equal to or less than $1\times10^{20}$ cm$^{-3}$.

The p-type impurity concentration of the first capacitance layer 352 may also be equal to the p-type impurity concentration of the first reverse P layer 39 of the first reverse pin junction portion 38 (the second reverse P layer 59 of the second reverse pin junction portion 58). Such first capacitance layer 352 may be formed simultaneously and obtained while forming the first reverse pin junction portion 38. A first surface layer parasitic capacitance CS1 is formed between the first capacitance layer 352 and the second semiconductor layer 15. The first surface layer parasitic capacitance CS1 is connected in series to the first internal parasitic capacitance C1.

The diode chip 351 includes, in the second pad region 274, a p$^+$-type second capacitance layer 353 formed at a surface layer portion of a region surrounded by the second pad separation structure 276. More specifically, the second capacitance layer 353 is formed at the surface layer portion of the second semiconductor layer 15. The second capacitance layer 353 has a p-type impurity concentration equal to or more than the n-type impurity concentration of the second semiconductor layer 15. The p-type impurity concentration of the second capacitance layer 353 may have a peak of equal to or more than $1\times10^{18}$ cm$^{-3}$ and equal to or less than $1\times10^{21}$ cm$^{-3}$. The peak of the p-type impurity concentration of the second capacitance layer 353 is preferably equal to or more than $5\times10^{18}$ cm$^{-3}$ and equal to or less than $1\times10^{20}$ cm$^{-3}$.

The p-type impurity concentration of the second capacitance layer 353 may also be equal to the p-type impurity concentration of the first reverse P layer 39 of the first reverse pin junction portion 38 (the second reverse P layer 59 of the second reverse pin junction portion 58). Such second capacitance layer 353 may be formed simultaneously and obtained while forming the first reverse pin junction portion 38. A second surface layer parasitic capacitance CS2 is formed between the second capacitance layer 353 and the second semiconductor layer 15. The second surface layer parasitic capacitance CS2 is connected in series to the second internal parasitic capacitance C2.

The second surface layer parasitic capacitance CS2 is preferably equal to the first surface layer parasitic capacitance CS1. That is to say, the following configuration is preferred: the first capacitance layer 352 is formed by a first layer area in top view, and the second capacitance layer 353 is formed by a second layer area equal to the first layer area in top view. Further, the second capacitance layer 353 has a p-type impurity concentration equal to the p-type impurity concentration of the first capacitance layer 352.

The first pad portion 101A of the first electrode layer 101 is opposite to the first capacitance layer 352 with the inter-insulation layer 91 interposed in between. The first external parasitic capacitance CO1 is formed between the first pad portion 101A and the second semiconductor layer 15 (the first capacitance layer 352). The first external parasitic capacitance CO1 is connected in series to the first surface layer parasitic capacitance CS1.

The second pad portion 102A of the second electrode layer 102 is opposite to the second capacitance layer 353 with the inter-insulation layer 91 interposed in between. The second external parasitic capacitance CO2 is formed between the second pad portion 102A and the second semiconductor layer 15 (the second capacitance layer 353). The second external parasitic capacitance CO2 is connected in series to the second surface layer parasitic capacitance CS2.

Figure 24:
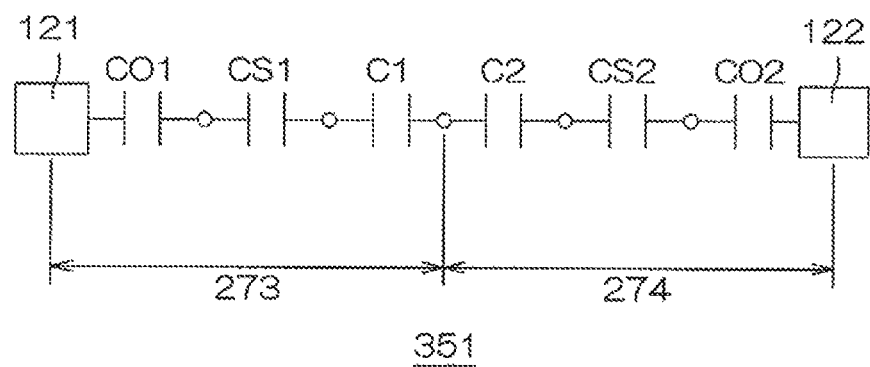
FIG. 24 is an electrical circuit diagram representing a parasitic capacitance of the diode chip in FIG. 26.

FIG. 24 shows an electrical circuit diagram of the diode chip 351 in FIG. 23. Referring to FIG. 24, the diode chip 351 includes the first terminal electrode 121, the second terminal electrode 122 and the parasitic capacitance circuit 283.

The parasitic capacitance circuit 283 includes a series circuit of the first external parasitic capacitance CO1, the first surface layer parasitic capacitance CS1, the first internal parasitic capacitance C1, the second external parasitic capacitance CO2, the second surface layer parasitic capacitance CS2, and the second internal parasitic capacitance C2, and is electrically connected to the second terminal electrode 122. The synthetic capacitance CP1 on the side of the first pad region 273 is represented by equation (5) below, and the synthetic capacitance CP2 on the side of the second pad region 274 is represented by equation (6) below.

[Equation 5]
$$CP1 = \frac{CS1 \times C1}{CS1 \times C1 + CO1 \times C1 + CO1 \times CS1} \times CO1 \quad (5)$$

[Equation 6]
$$CP2 = \frac{CS2 \times C2}{CS2 \times C2 + CO2 \times C2 + CO2 \times CS2} \times CO2 \quad (6)$$

Comparing equation (5) with equation (1), the synthetic capacitance CP1 of the diode chip 351 is less than the synthetic capacitance CP1 of the diode chip 1 of the first embodiment. Further, comparing equation (6) with equation (2), the synthetic capacitance CP2 of the diode chip 351 is less than the synthetic capacitance CP2 of the diode chip 1 of the first embodiment.

In summary, the same effect as described for the diode chip 1 may also be achieved by the diode chip 351. Further, according to the diode chip 351, the number of parasitic capacitances connected in series to the first external parasitic capacitance CO1 may be increased compared to the diode chip 1. Further, according to the diode chip 351, the number of parasitic capacitances connected in series to the second external parasitic capacitance CO2 may be increased. Thus, the inter-terminal capacitance CT may be further reduced. The structure of the diode chip 351 may also be incorporated into the second to fourth embodiments.

Figure 25:
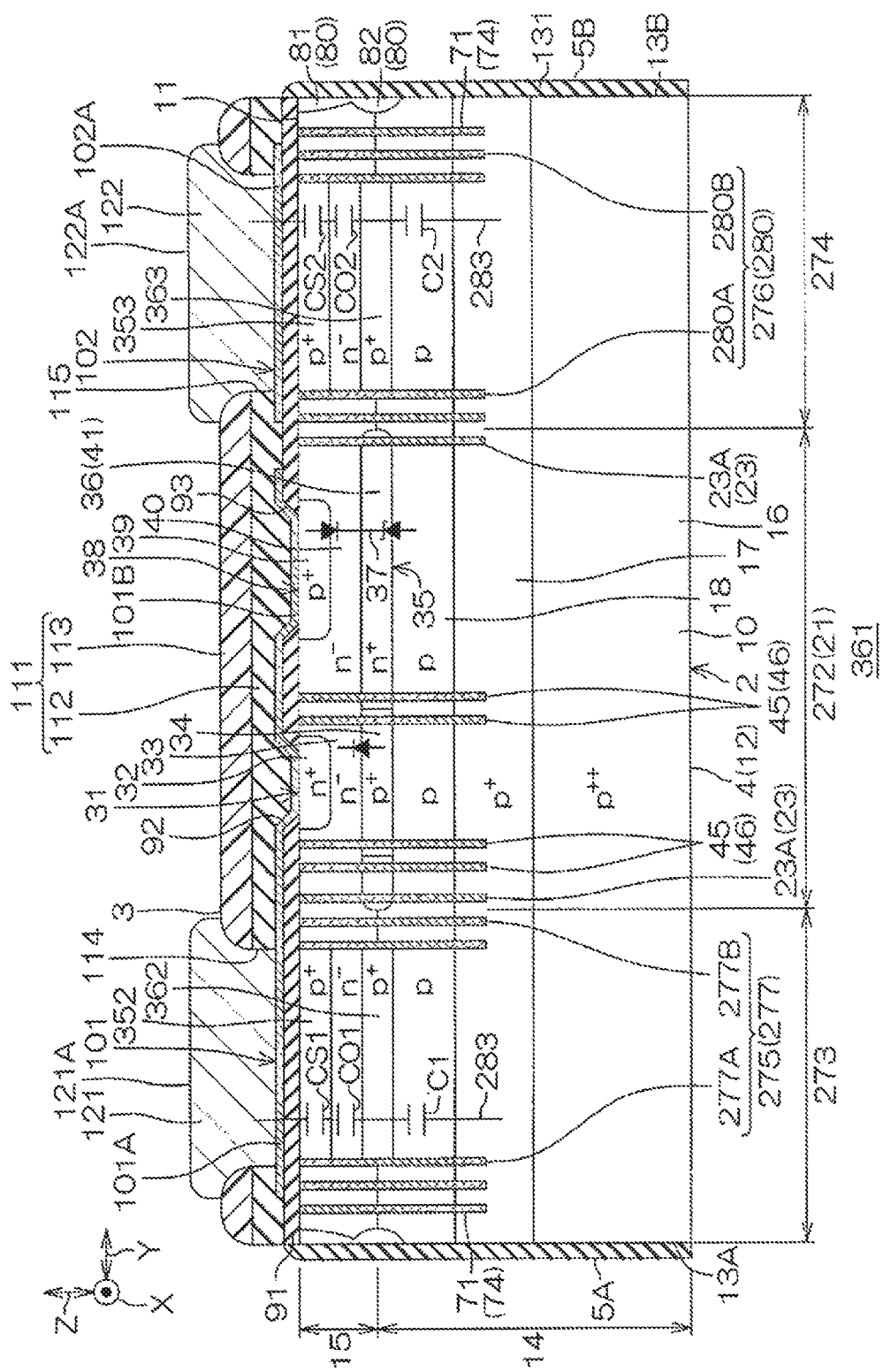
FIG. 25 is a corresponding diagram of FIG. 3, and is a cross-sectional diagram of a diode chip according to a sixth embodiment of the present invention.

FIG. 25 shows a corresponding diagram of FIG. 3, and is a cross-sectional diagram of a diode chip 361 according to a sixth embodiment of the present invention. The diode chip 361 has a configuration in which the structure of the diode chip 351 on the side of the first pad region 273 and the structure on the side of the second pad region 274 are changed. In the description below, a structure corresponding to the structure described for the diode chip 351 is denoted by the same reference denotations and the associated description is omitted.

Referring to FIG. 25, the diode chip 361 includes, in the first pad region 273, a p$^+$-type first internal capacitance layer 362 formed at the boundary of the first semiconductor layer 14 (specifically, the concentration keeping layer 18) and the second semiconductor layer 15. The first internal capacitance layer 362 is opposite to the concentration reducing layer 17 with a portion of the concentration keeping layer 18 interposed in between.

The first internal capacitance layer 362 has a p-type impurity concentration more than the n-type impurity concentration of the second semiconductor layer 15. Further, the first internal capacitance layer 362 has a p-type impurity concentration at least more than the p-type impurity concentration of the concentration keeping layer 18. The first internal capacitance layer 362 may also have a p-type impurity concentration more than the p-type impurity concentration of the high concentration layer 16.

The p-type impurity concentration of the first internal capacitance layer 362 may have a peak of equal to or more than $1 \times 10^{18}$ cm$^{-3}$ and equal to or less than $1 \times 10^{21}$ cm$^{-3}$. The peak of p-type impurity concentration of the first internal capacitance layer 362 is preferably 5×1018 cm$^{-3}$ and equal to or less than $1 \times 10^{20}$ cm$^{-3}$. The p-type impurity concentration of the first internal capacitance layer 362 is preferably equal to the p-type impurity concentration of the first P layer 34 of the first pin junction portion 31. Such first internal capacitance layer 362 may be formed simultaneously and obtained while forming the first P layer 34. The first internal parasitic capacitance C1 is formed between the first internal capacitance layer 362 and the second semiconductor layer 15.

The diode chip 361 includes, in the second pad region 274, a p$^+$-type second internal capacitance layer 363 formed at the boundary of the first semiconductor layer 14 (specifically, the concentration keeping layer 18) and the second semiconductor layer 15. The second internal capacitance layer 363 is opposite to the concentration reducing layer 17 with a portion of the concentration keeping layer 18 interposed in between.

The second internal capacitance layer 363 has a p-type impurity concentration more than the n-type impurity concentration of the second semiconductor layer 15. Further, the second internal capacitance layer 363 has a p-type impurity concentration at least more than the p-type impurity concentration of the concentration keeping layer 18. The second internal capacitance layer 363 may also have a p-type impurity concentration more than the p-type impurity concentration of the high concentration layer 16.

The p-type impurity concentration of the second internal capacitance layer 363 may have a peak of equal to or more than $1 \times 10^{18}$ cm$^{-3}$ and equal to or less than $1 \times 10^{21}$ cm$^{-3}$. The peak of p-type impurity concentration of the second internal capacitance layer 363 is preferably $5 \times 10^{18}$ cm$^{-3}$ and equal to or less than $1 \times 10^{20}$ cm$^{-3}$. The p-type impurity concentration of the second internal capacitance layer 363 is preferably equal to the p-type impurity concentration of the second P layer 54 of the second pin junction portion 51. Such second internal capacitance layer 363 may be formed simultaneously and obtained while forming the second P layer 54. A second internal parasitic capacitance C2 is formed between the second internal capacitance layer 363 and the second semiconductor layer 15.

In summary, the same effect as described for the diode chip 351 may also be achieved by the diode chip 361. The structure of the diode chip 361 may be incorporated into the first to fourth embodiments.

Figure 26:
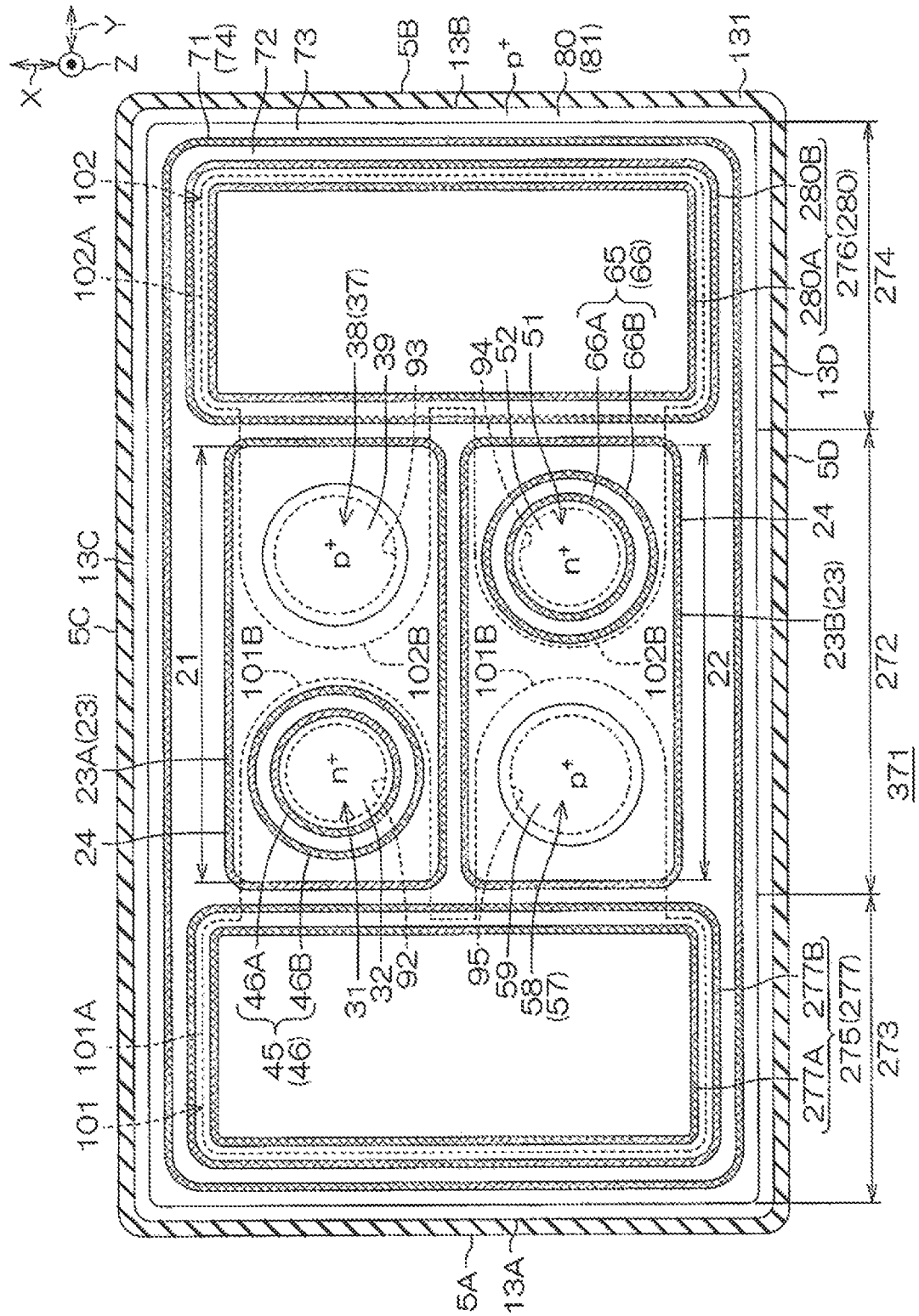
FIG. 26 is a corresponding diagram of FIG. 8, and is a top view of a diode chip according to a seventh embodiment of the present invention.

FIG. 26 shows a corresponding diagram of FIG. 8, and is a top view of a diode chip 371 according to a seventh embodiment of the present invention. In the first to sixth embodiments, the first parallel circuit 42 is formed between the first diode pair 37 and the first pin junction portion 31, and the second parallel circuit 62 is formed between the second diode pair 57 and the second pin junction portion 51.

In contrast to the above, in the diode chip 371, a first parallel circuit 192 is formed between the second pin junction portion 51 and the first diode pair 37, and a second parallel circuit 193 is formed between the second diode pair 57 and the first pin junction portion 31. In the description below, a structure corresponding to the structure described for the diode chip 1 is denoted by the same reference denotations and the associated description is omitted.

Referring to FIG. 26, the diode chip 371 includes one first pin junction portion 31, one first pn junction portion 35 and one first reverse pin junction portion 38 in the first apparatus region 21. The first pin junction portion 31, the first pn junction portion 35 and the first reverse junction portion 38 are formed by the same layout as in the first embodiment. The first diode pair 37 is formed between the first revers pin junction portion 38 and the first pn junction portion 35.

The diode chip 371 includes one second pin junction portion 51, one second pn junction portion 55 and one second reverse pin junction portion 58 in the second apparatus region 22. The second pin junction portion 51, the second pn junction portion 55 and the second reverse pin junction portion 58 are formed by the same layout as the first embodiment.

The first parallel circuit 192 is formed between the second pin junction portion 51 and the first diode pair 37 via the semiconductor chip 10 (the first semiconductor layer 14). The second diode pair 57 is formed between the second reverse pin junction portion 58 and the second pn junction portion 55. The second parallel circuit 193 is formed between the second diode pair 57 and the first pin junction portion 31 via the semiconductor chip 10 (the first semiconductor layer 14) A TVS circuit 194 is formed between the second parallel circuit 193 and the first parallel circuit 192.

The first electrode layer 101 penetrates the inter-insulation layer 91 and is hence electrically connected to the first pin junction 31 in the first apparatus region 21, and penetrates the inter-insulation layer 91 and is hence electrically connected to the second diode pair 57 in the second apparatus region 22. The first electrode layer 101 includes the first pad portion 101A and a plurality of first wiring portions 101B.

The first electrode layer 101 is separated from the first apparatus region 21 and the second apparatus region 22 and is formed on the first pad region 273 in top view. In this embodiment, the first pad portion 101A is formed in a region non-overlapping with the first apparatus region 21 and the second apparatus region 22 in top view. The first pad portion 101A may also be formed as overlapping a portion of the first apparatus region 21 and a portion of the second apparatus region 22 in top view.

The first pad portion 101A is opposite to a region surrounded by the first pad separation structure 275 (specifically, the second semiconductor layer 15) with the inter-insulation layer 91 interposed in between. The first pad portion 101A may also cover the first pad separation structure 275 with the inter-insulation layer 91 interposed in between. In this case, the first pad portion 101A may cover a global range of the region surrounded by the first pad separation structure 275.

The plurality of first wiring portions 101B are respectively led out as band shapes from the first pad portion 101A toward the first apparatus region 21 and the second apparatus region 22. The plurality of first wiring portions 101B are respectively led out in one-on-one correspondence relative to the first apparatus region 21 (the first pin junction portion 31) and the second apparatus region 22 (the second reverse pin junction portion 58). Thus, the plurality of first wiring portions 101B are shaped as a comb in top view. The width of the first wiring portion 101B in the first direction X may be any value as desired.

The first wiring portion 101B on the side of the first apparatus region 21 enters the first pin opening 92 from above the inter-insulation layer 91. The first wiring portion 101B on the side of the first apparatus region 21 is electrically connected to the first pin junction portion 31 in the first pin opening 92. An ohmic contact is formed between the first wiring portion 101B on the side of the first apparatus region 21 and the first pin junction 31 (specifically, the first N layer 32).

The first wiring portion 101B on the side of the second apparatus region 22 enters the second reverse pin opening 95 from above the inter-insulation layer 91. The first wiring portion 101B on the side of the second apparatus region 22 is electrically connected to the second reverse pin junction portion 58 in the second reverse pin opening 95. An ohmic contact is formed between the first wiring portion 101B on the side of the second apparatus region 22 and the second reverse pin junction portion 58 (specifically, the second reverse P layer 59). As such, the first electrode layer 101 connects the first pin junction portion 31 and the second diode pair 57 in parallel.

The second electrode layer 102 penetrates the inter-insulation layer 91 and is hence electrically connected to the first diode pair 37 in the first apparatus region 21, and penetrates the inter-insulation layer 91 and is hence electrically connected to the second pin junction portion 51 in the second apparatus region 22. The second electrode layer 102 includes the second pad portion 102A and a plurality of second wiring portions 102B.

The second portion 102A is separated from the first apparatus region 21 and the second apparatus region 22 and is formed in the second pad region 274. In this embodiment, the second pad portion 102A is formed in a region non-overlapping with the first apparatus region 21 and the second apparatus region 22 in top view. The second portion 102A may also overlap a portion of the first apparatus region 21 and a portion of the second apparatus region 22 in top view.

The second pad portion 102A is opposite to a region surrounded by the second pad separation structure 276 (specifically, the second semiconductor layer 15) with the inter-insulation layer 91 interposed in between. The second pad portion 102A may also cover the second pad separation structure 276 with the inter-insulation layer 91 interposed in between. In this case, the second pad portion 102A may cover a global range of the region surrounded by the second pad separation structure 276.

The plurality of second wiring portions 102B are respectively led out as band shapes from the second pad portion 102A toward the first apparatus region 21 and the second apparatus region 22. The plurality of second wiring portions 102B are respectively led out in one-on-one correspondence relative to the first apparatus region 21 (the first reverse pin junction portion 38) and the second apparatus region 22 (the second pin junction portion 51). Thus, the plurality of second wiring portions 102B are shaped as a comb in top view.

The plurality of second wiring portions 102B are opposite to the first plurality of first wiring portions 101B in the second direction Y. The width of the second wiring portion 102B in the first direction X may be any value as desired. The width of the second wiring portion 102B in the first direction X is preferably equal to the width of the first wiring portion 101B in the first direction X. The length of the second wiring portion 102B in the second direction Y may be any value as desired. The length of the second wiring portion 102B in the second direction Y is preferably equal to the length of the first wiring portion 101B in the second direction Y.

The second wiring portion 102B on the side of the first apparatus region 21 enters the first reverse pin opening 93 from above the inter-insulation layer 91. The second wiring portion 102B on the side of the first apparatus region 21 is electrically connected to the first reverse pin junction portion 38 in the first reverse pin opening 93. An ohmic contact is formed between the second wiring portion 102B on the side of the first apparatus region 21 and the first reverse pin junction portion 38 (specifically, the first reverse P layer 39).

The second wiring portion 102B on the side of the second apparatus region 22 enters the second opening 94 from above the inter-insulation layer 91. The second wiring portion 102B on the side of the second apparatus region 22 is electrically connected to the second pin junction portion 51 in the second pin opening 94. An ohmic contact is formed between the second wiring portion 102B on the side of the second apparatus region 22 and the second pin junction portion 51 (specifically, the second N layer 52). As such, the second electrode layer 102 connects the first diode pair 37 and the second pin junction portion 51 in parallel.

Figure 27:
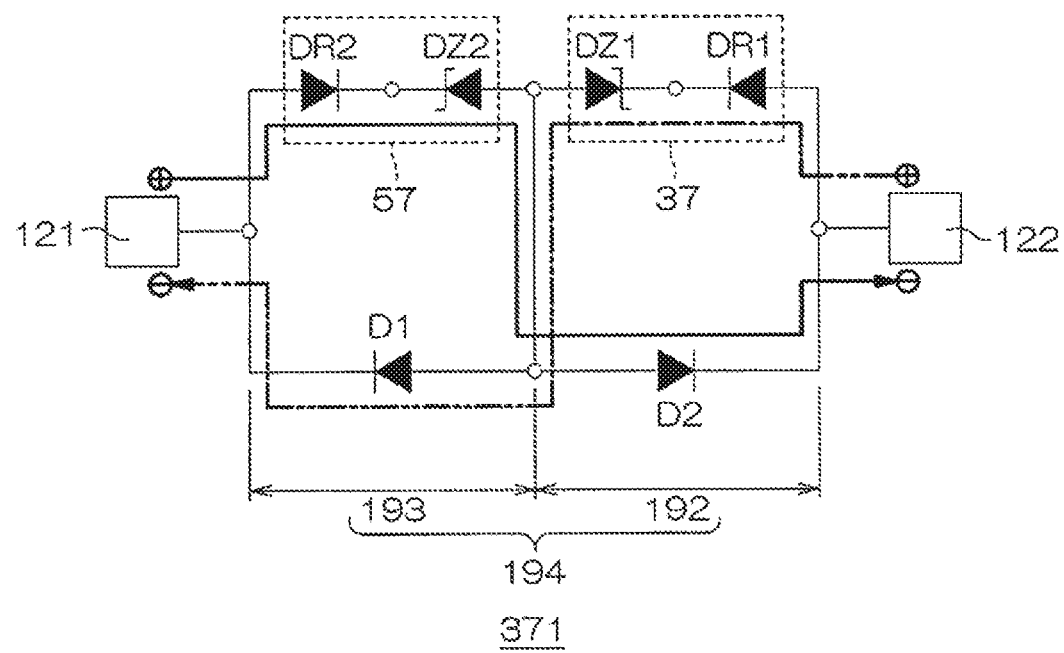
FIG. 27 is an electrical circuit diagram of the diode chip in FIG. 26.

FIG. 27 shows an electrical circuit diagram of the diode chip 371 in FIG. 26. Referring to FIG. 27, the diode chip 371 includes the first terminal electrode 121, the second terminal electrode 122 and the TVS circuit 194. The TVS circuit 194 includes a series circuit including the first series circuit 192 and the second series circuit 193 connected in series, and is electrically connected to the first terminal electrode 121 and the second terminal electrode 122.

The first parallel circuit 192 includes the second pin diode D2 and the first diode pair 37. The first diode pair 37 includes the first reverse pin diode DR1 and the first Zener diode DZ1. The cathode of the second diode D2 is electrically connected to the second terminal electrode 122.

The first diode pair 37 includes a reverse series circuit, in which the cathode of the first reverse pin diode DR1 is reverse bias connected to the cathode of the first Zener diode DZ1. The anode of the first reverse pin diode DR1 is electrically connected to the second terminal electrode 122. The anode of the first Zener diode DZ1 is reverse bias connected to the anode of the second pin diode D2.

The second parallel circuit 193 includes the first pin diode D1 and the second diode pair 57. The second diode pair 57 includes the second reverse pin diode DR2 and the second Zener diode DZ2. The cathode of the first pin diode D1 is electrically connected to the first terminal electrode 121. The anode of the first pin diode D1 is reverse bias connected to the anode of the second pin diode D2 and the anode of the first Zener diode DZ1.

The second diode pair 57 includes a reverse series circuit, in which the cathode of the second reverse pin diode DR2 is reverse bias connected to the cathode of the second Zener diode DZ2. The anode of the second reverse pin diode DR2 is electrically connected to the first terminal electrode 121. The anode of the second Zener diode DZ2 is reverse bias connected to the anode of the first pin diode D1, the anode of the first Zener diode DZ1 and the anode of the second pin diode D2.

The diode chip 371 is a bi-directional device in which a current is capable of flowing in two directions toward the first terminal electrode 121 and the second terminal electrode 122. That is to say, if a voltage equal to or more than a specified threshold voltage with the first terminal electrode 121 as positive is applied between the first terminal electrode 121 and the second terminal electrode 122, the current flows from the first terminal electrode 121 through the second diode pair 57 and the second pin diode D2 toward the second terminal electrode 122.

On the other hand, if a voltage equal to or more than a specified threshold voltage with the second terminal electrode 122 as positive is applied between the first terminal electrode 121 and the second terminal electrode 122, the current flows from the second terminal electrode 122 through the first diode pair 37 and the first pin diode D1 toward the first terminal electrode 121.

By increasing symmetry of the layout of the second pin junction portion 51, the second pn junction portion 55 and the second reverse pin junction portion 58 relative to the layout of the first pin junction portion 31, the first pn junction portion 35 and the first reverse pin junction portion 38, electrical characteristics of the bi-directional device may be enhanced. That is to say, electrical characteristics when a current flows from the first terminal electrode 121 toward the second terminal electrode 122 are equal to electrical characteristics when a current flows from the second terminal electrode 122 toward the first terminal electrode 121.

In summary, the same effect as described for the diode chip 1 may also be achieved by the diode chip 371. Further, according to the diode chip 1, from the perspective of electrical connection configuration, electrical characteristics may also be enhanced.

That is to say, in the diode chip 371, the first parallel circuit 192 is formed between the second pin junction portion 51 and the first diode pair 37, and the second parallel circuit 193 is formed between the second diode pair 57 and the first pin junction portion 31. In the diode chip 371, the first electrode layer 101 is electrically connected to the first pin junction portion 31 and the second diode pair 57, and the second electrode layer 102 is electrically connected to the first diode pair 37 and the second pin junction portion 51.

According to such structure, a current is enabled to flow through the first diode pair 37 into the first pin junction portion 31 in the first apparatus region 21. Further, a current is enabled to flow through the second diode pair 57 into the second pin junction portion 51. Thus, a current path may be shortened, thereby lowering the influences caused by resistance components of the semiconductor chip 10 (the first semiconductor layer 14). As a result, the maximum current capability IPP is increased and the clamping voltage VCL is reduced according to the decrease in the resistance components. The structure of the diode chip 371 may also be incorporated into the second to sixth embodiments.

Figure 28A:
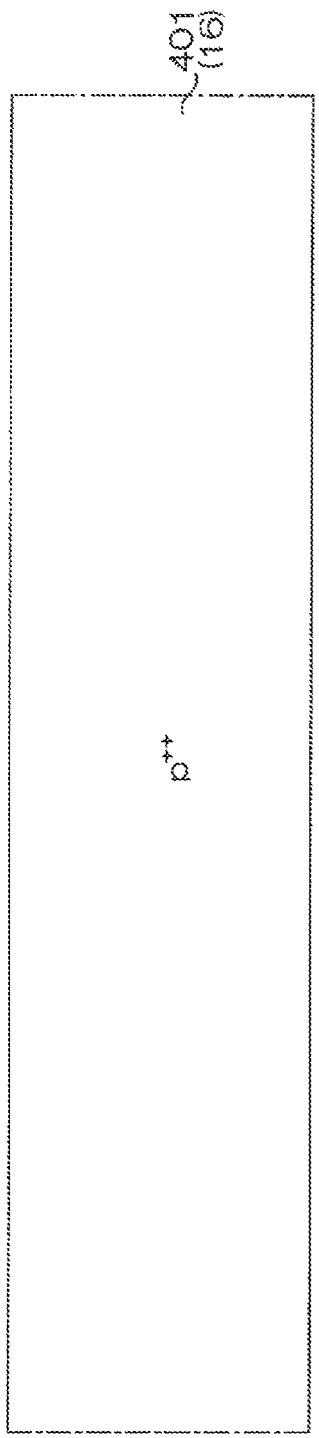
FIG. 28A is a cross-sectional diagram for illustrating an example of a manufacturing method applied to the diode chips of the first to seventh embodiments.
Figure 28B:
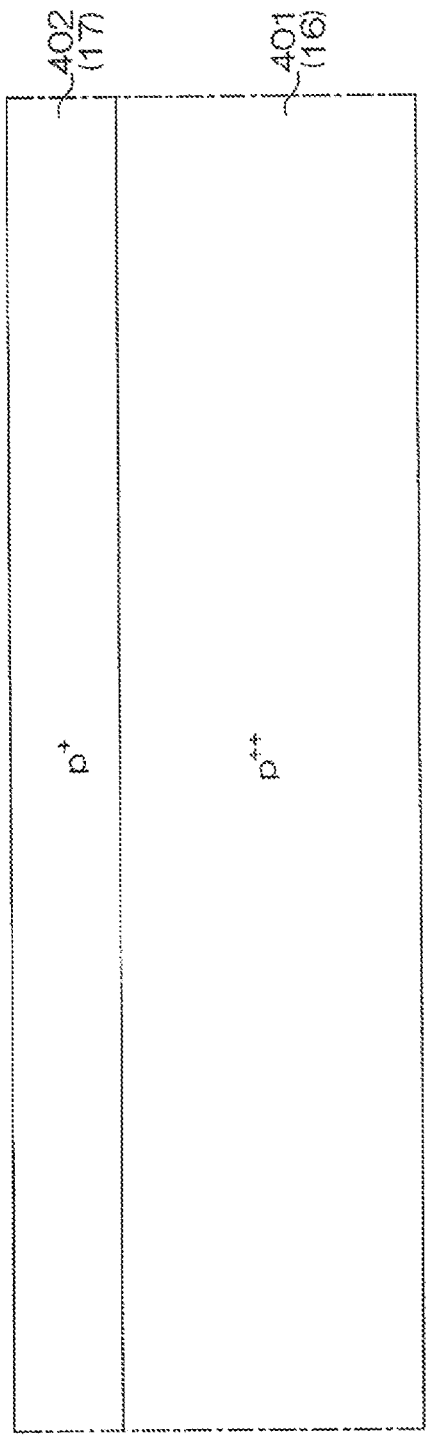
FIG. 28B is a cross-sectional diagram of a step after FIG. 28A.
Figure 28C:
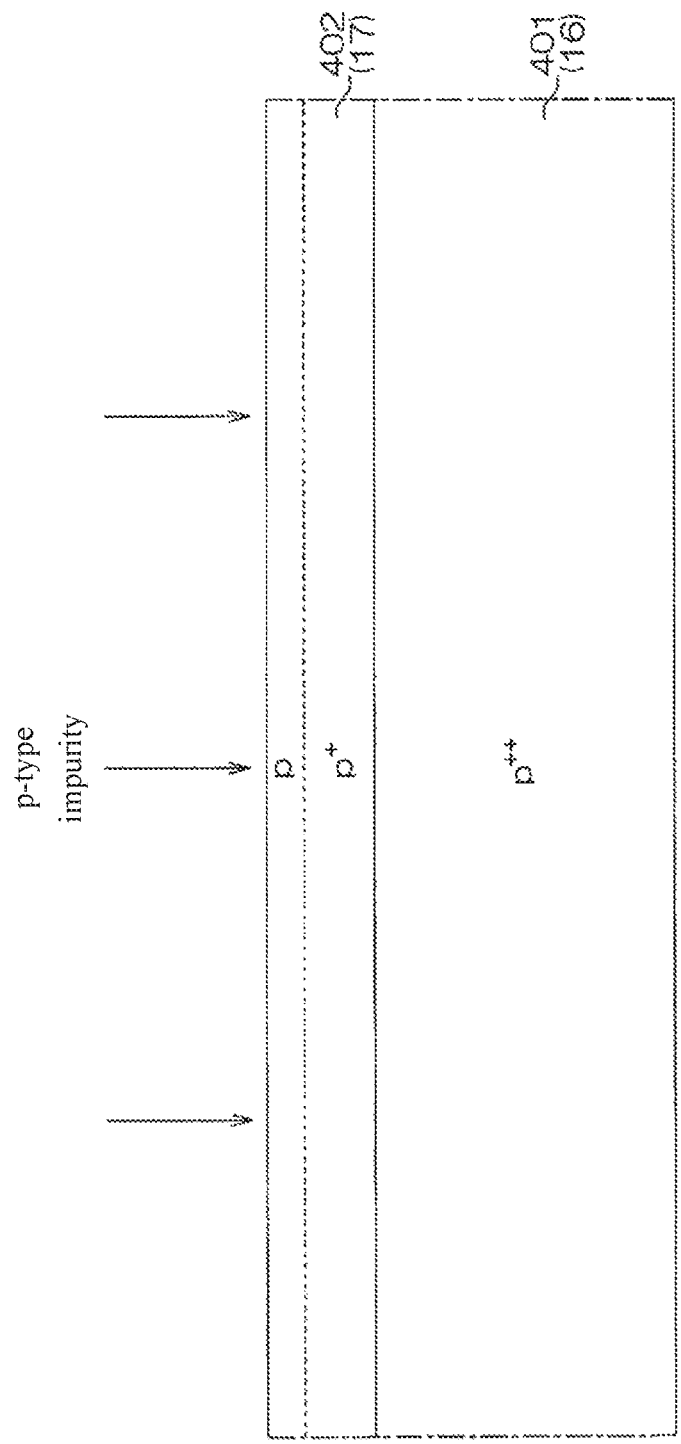
FIG. 28C is a cross-sectional diagram of a step after FIG. 28B.
Figure 28D:
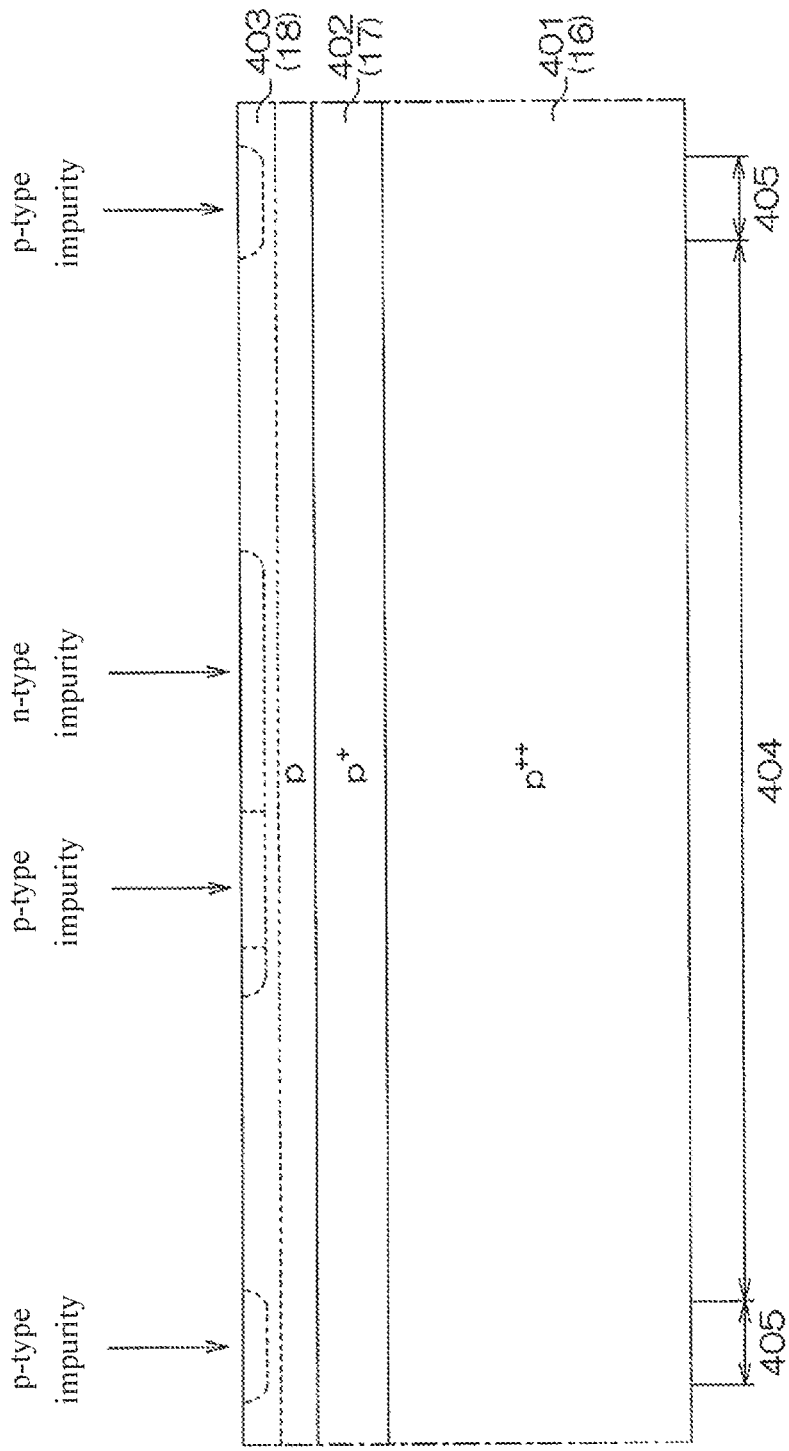
FIG. 28D is a cross-sectional diagram of a step after FIG. 28C.
Figure 28E:
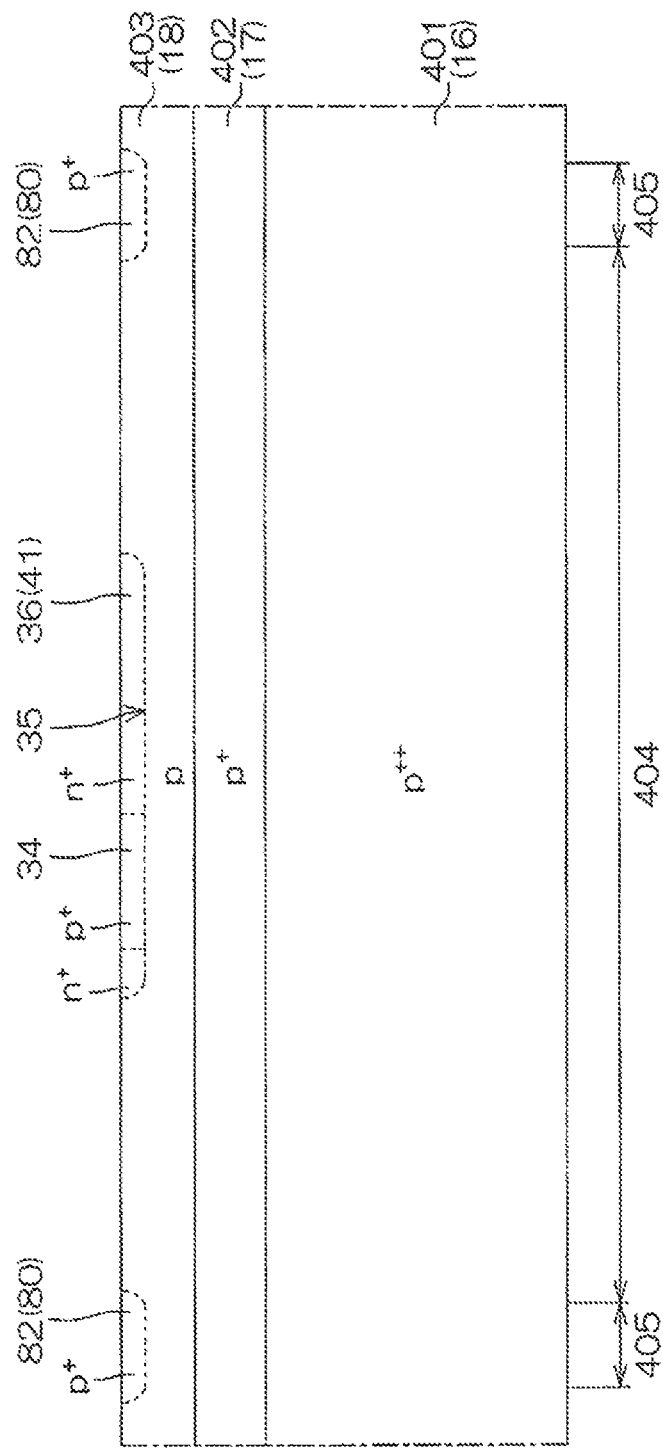
FIG. 28E is a cross-sectional diagram of a step after FIG. 28D.
Figure 28F:
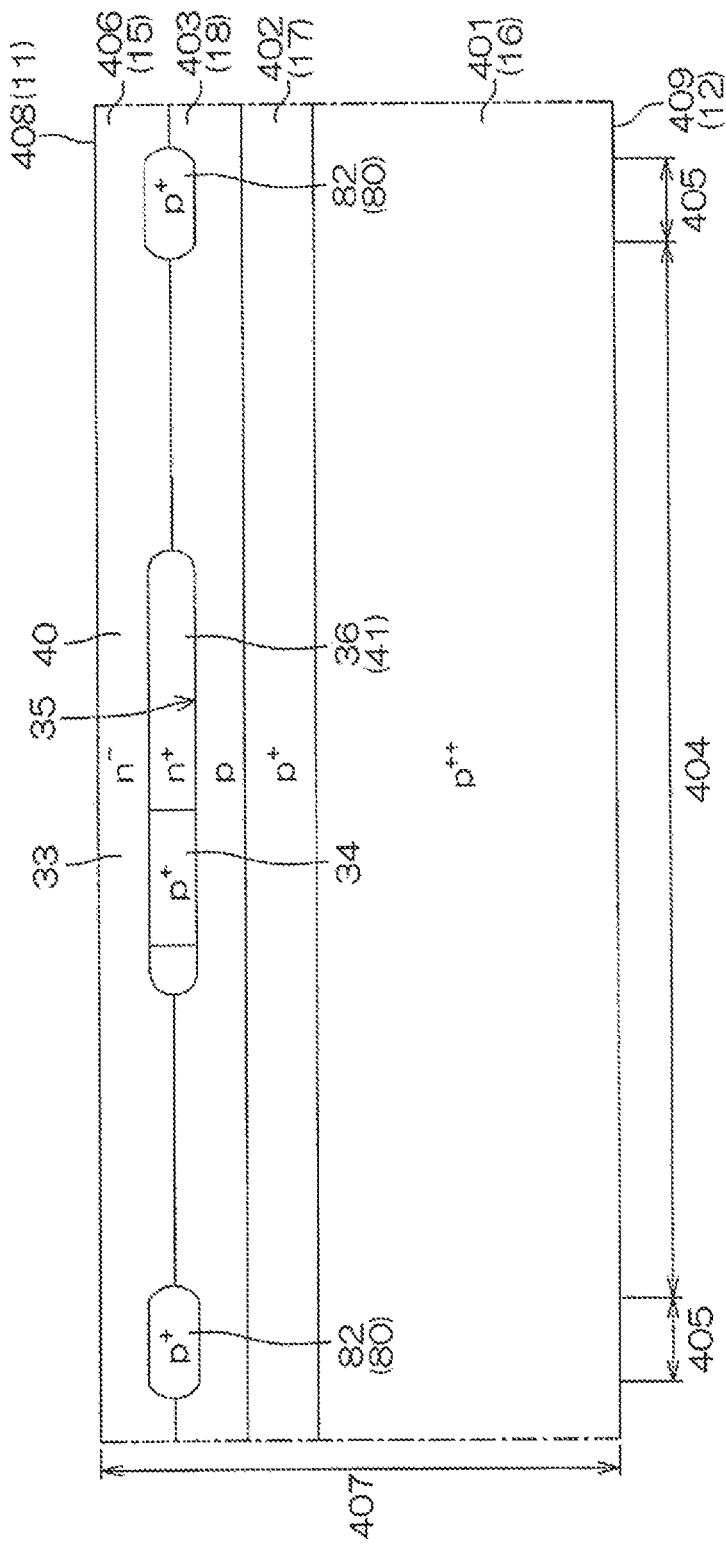
FIG. 28F is a cross-sectional diagram of a step after FIG. 28E.
Figure 28G:
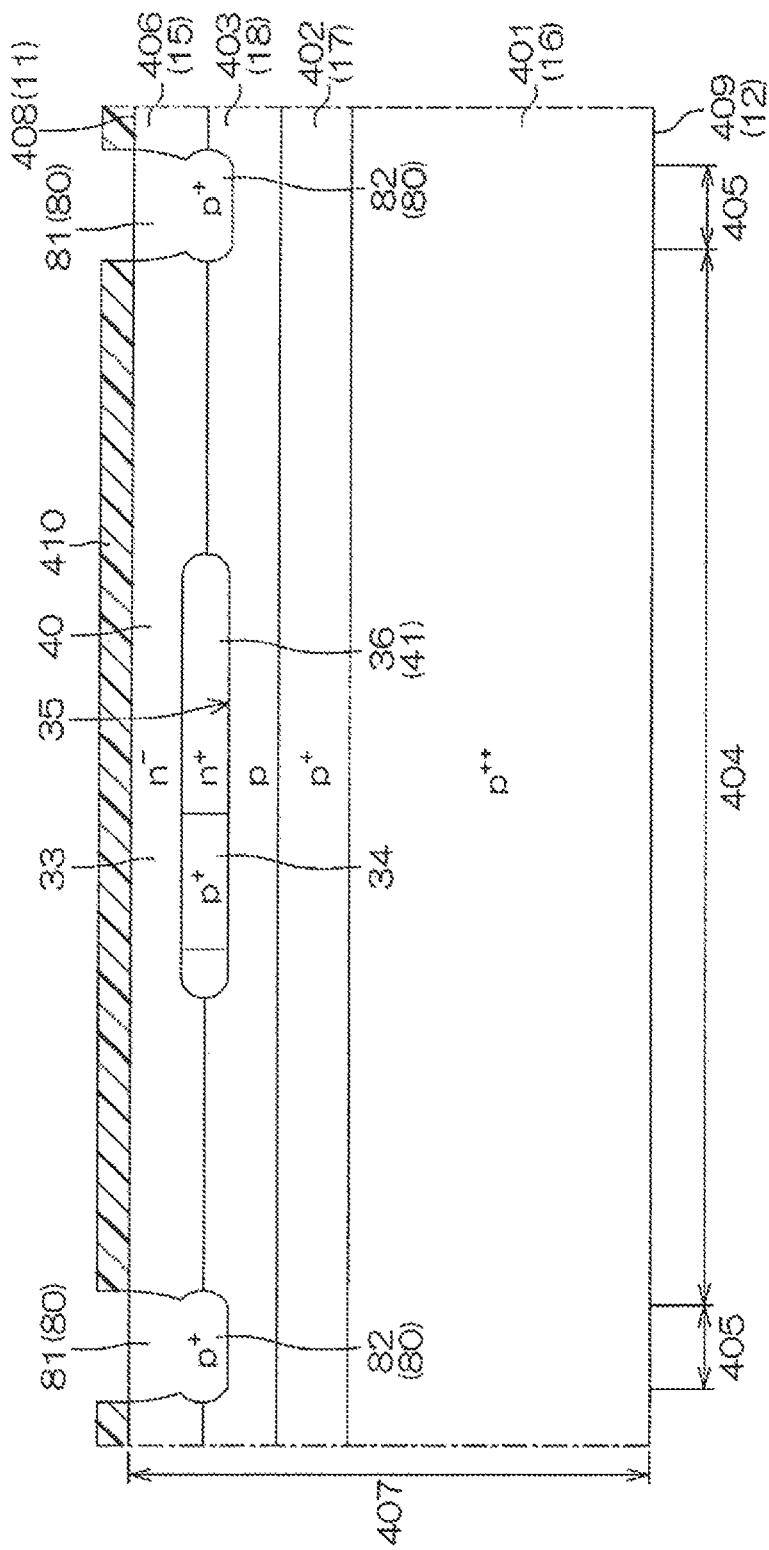
FIG. 28G is a cross-sectional diagram of a step after FIG. 28F.
Figure 28H:
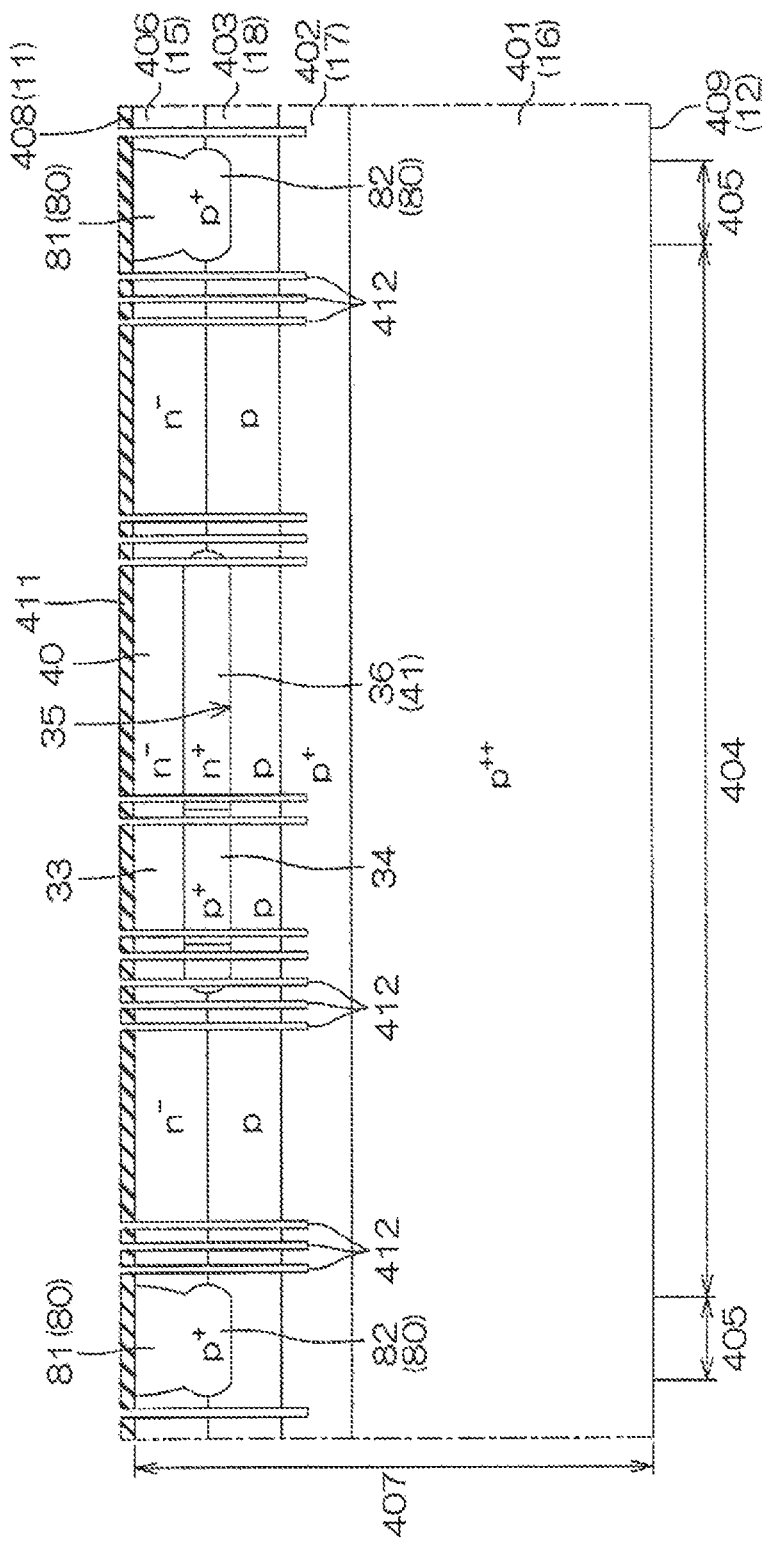
FIG. 28H is a cross-sectional diagram of a step after FIG. 28G.
Figure 28I:
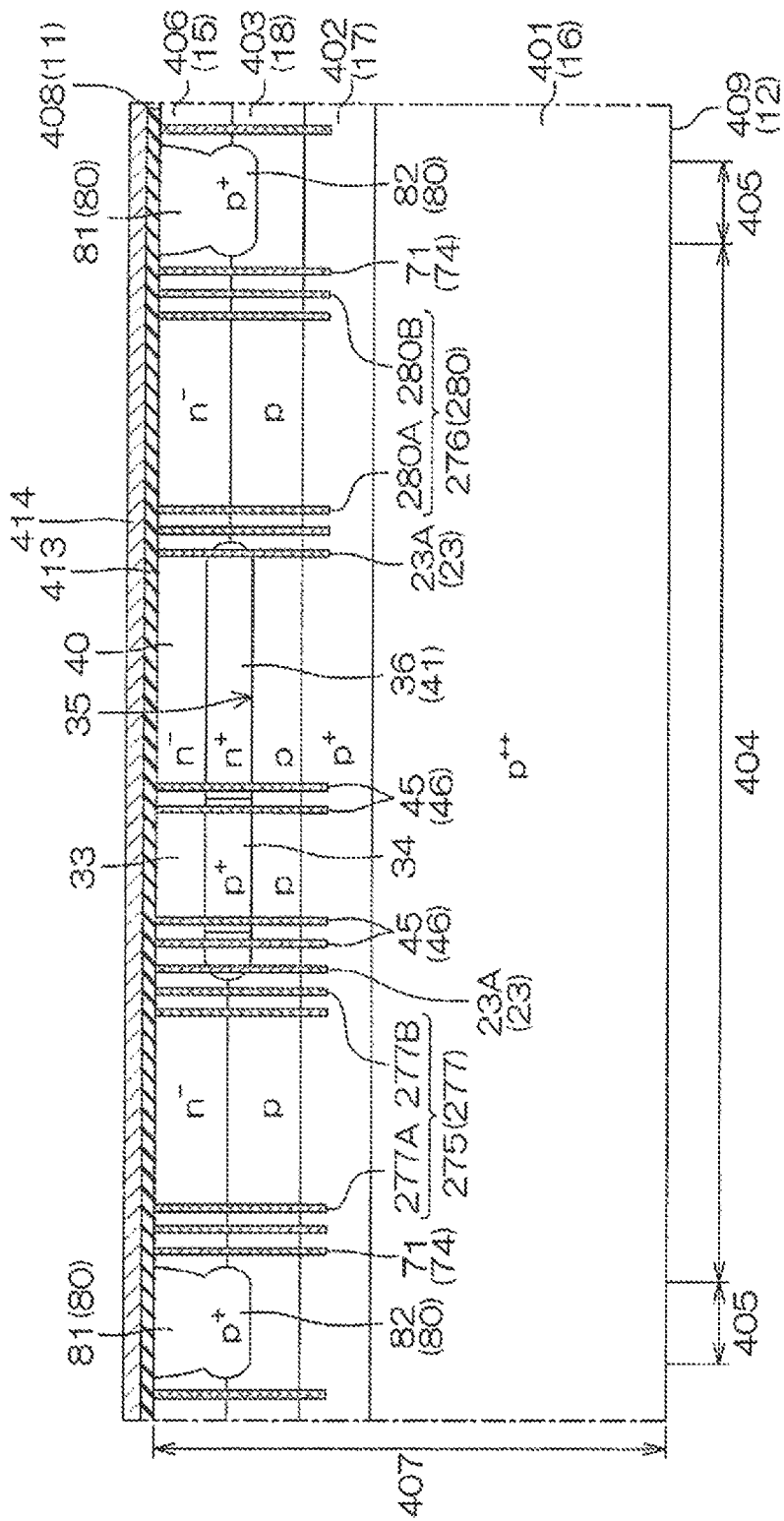
FIG. 28I is a cross-sectional diagram of a step after FIG. 28H.
Figure 28J:
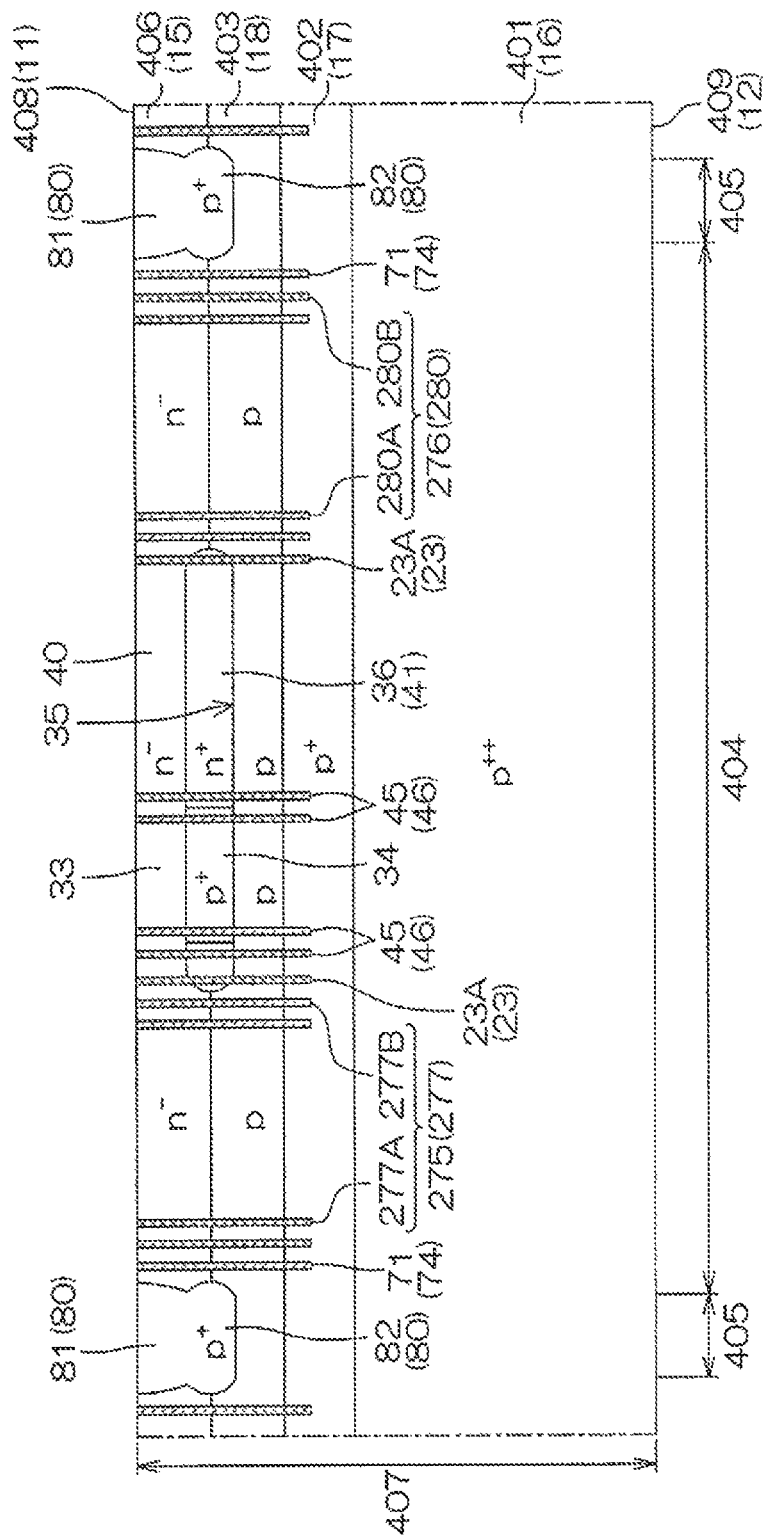
FIG. 28J is a cross-sectional diagram of a step after FIG. 28I.
Figure 28K:
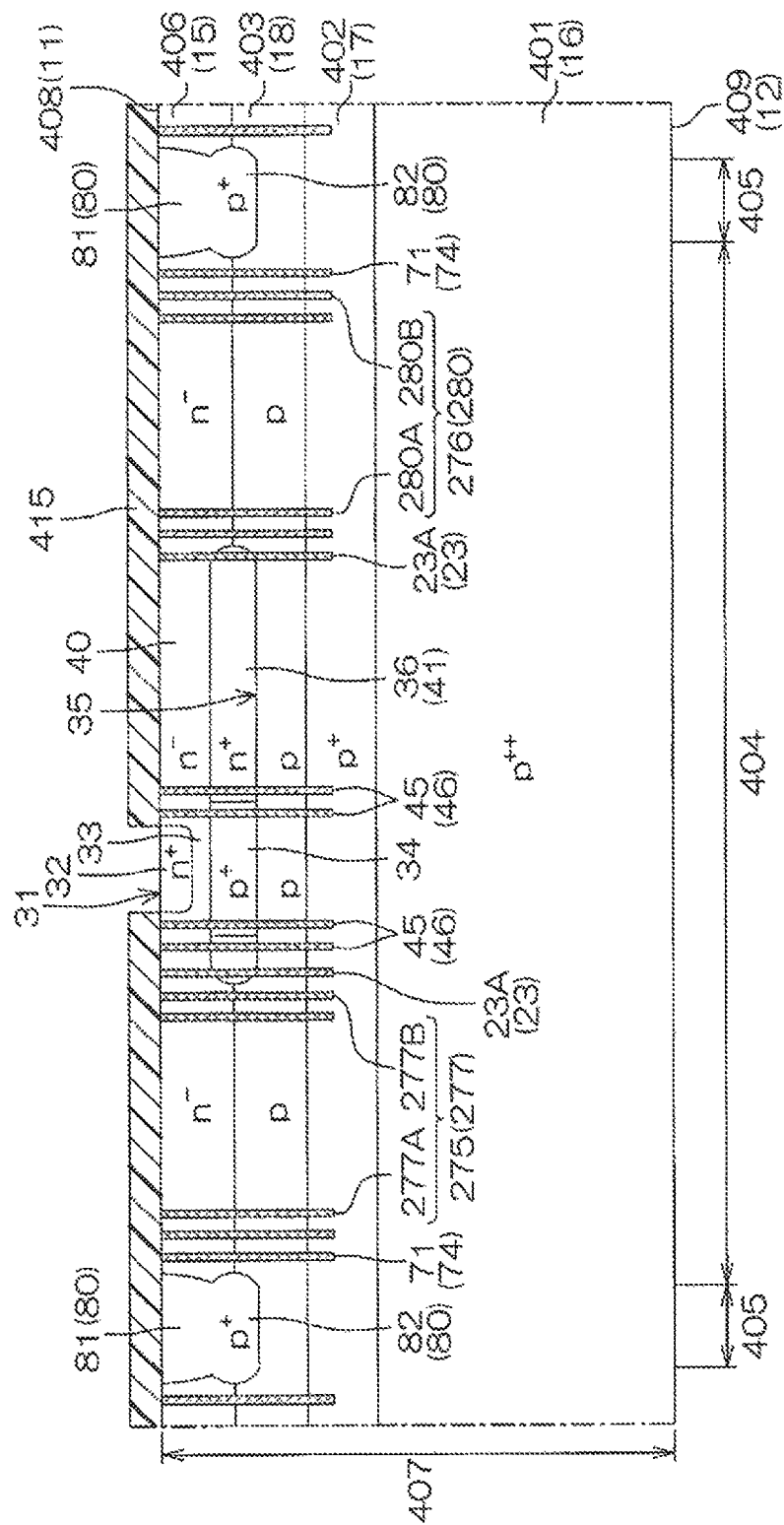
FIG. 28K is a cross-sectional diagram of a step after FIG. 28J.
Figure 28L:
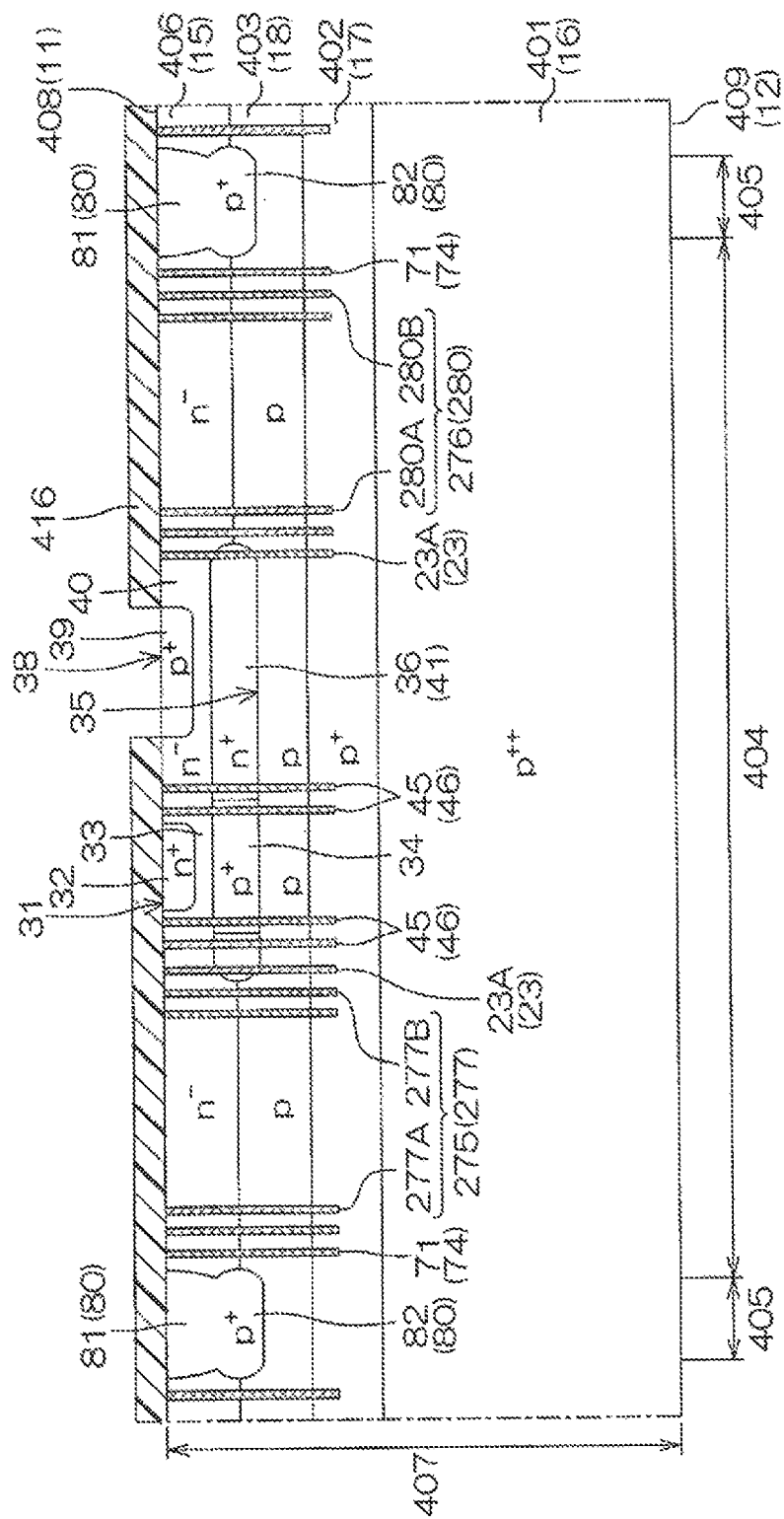
FIG. 28L is a cross-sectional diagram of a step after FIG. 28K.
Figure 28M:
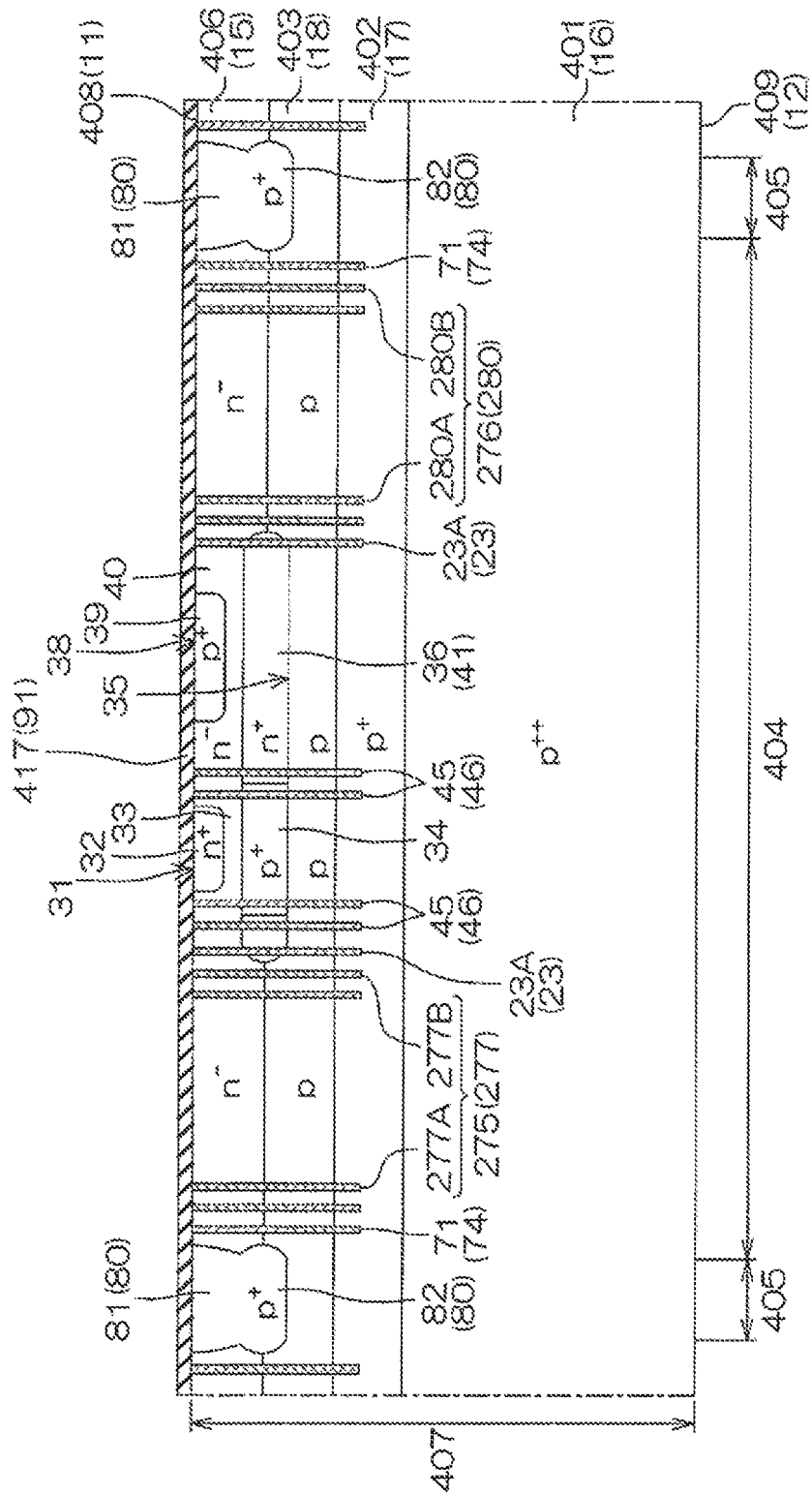
FIG. 28M is a cross-sectional diagram of a step after FIG. 28L.
Figure 28N:
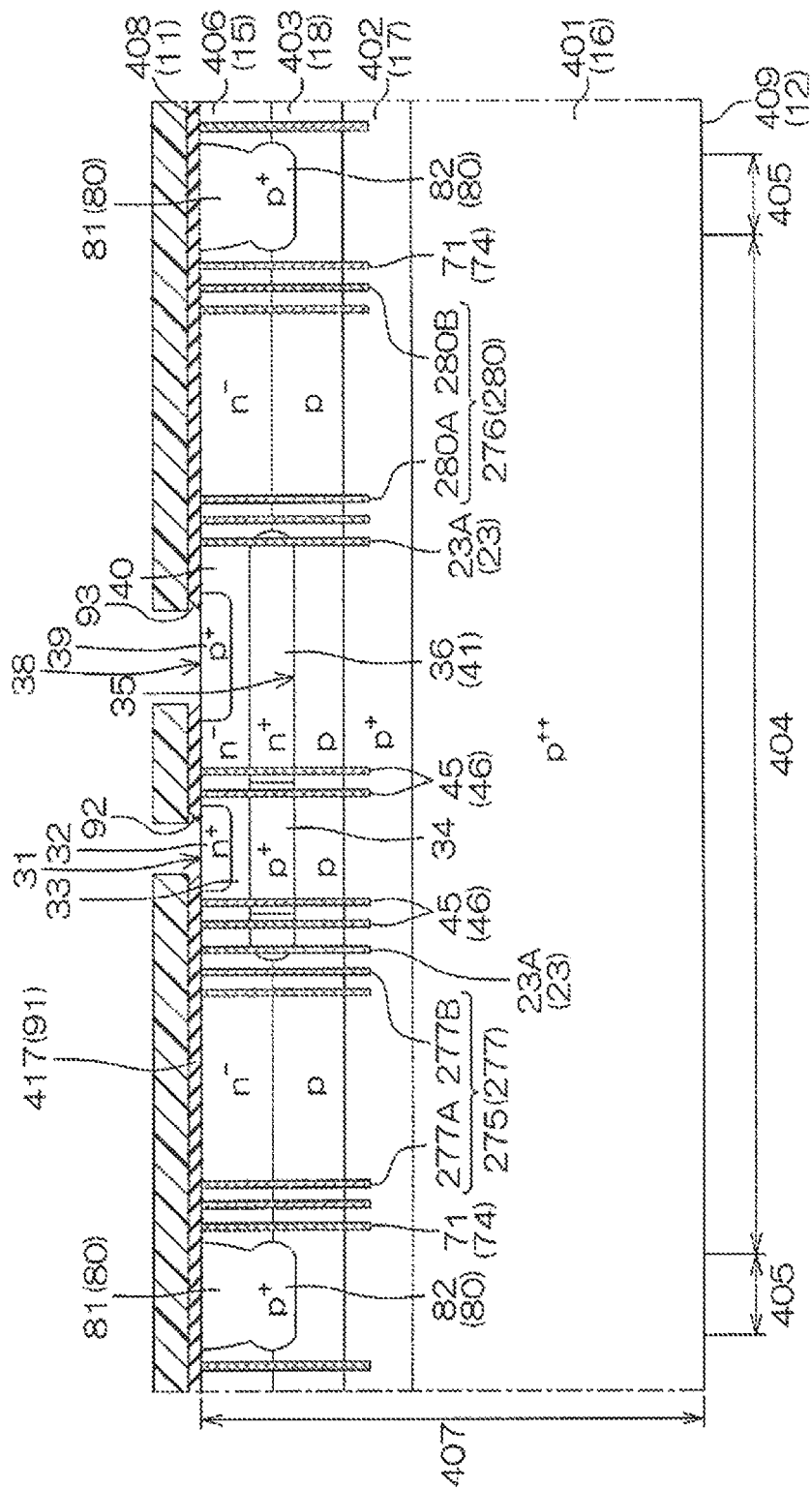
FIG. 28N is a cross-sectional diagram of a step after FIG. 28M.
Figure 280:
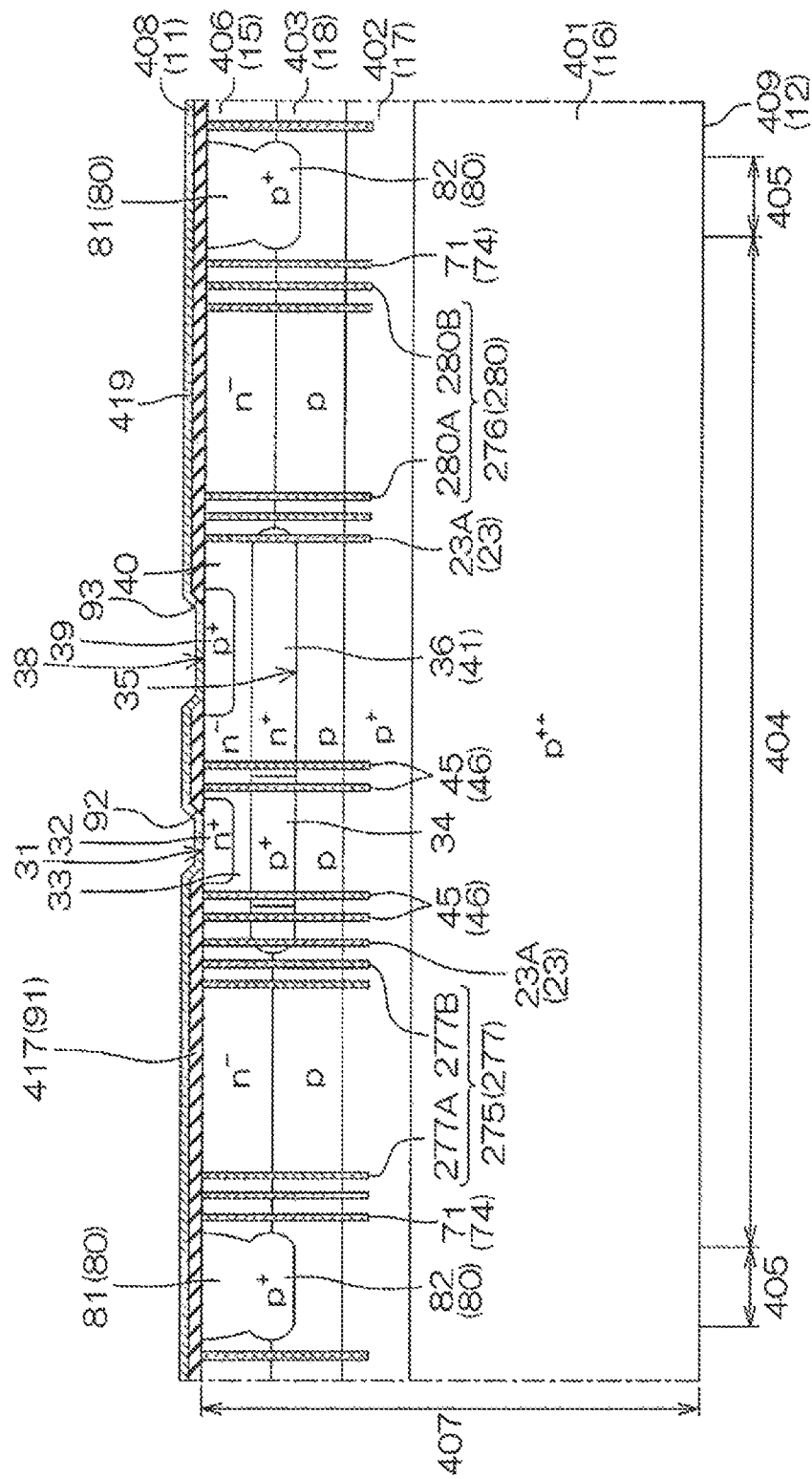
Figure 28P:
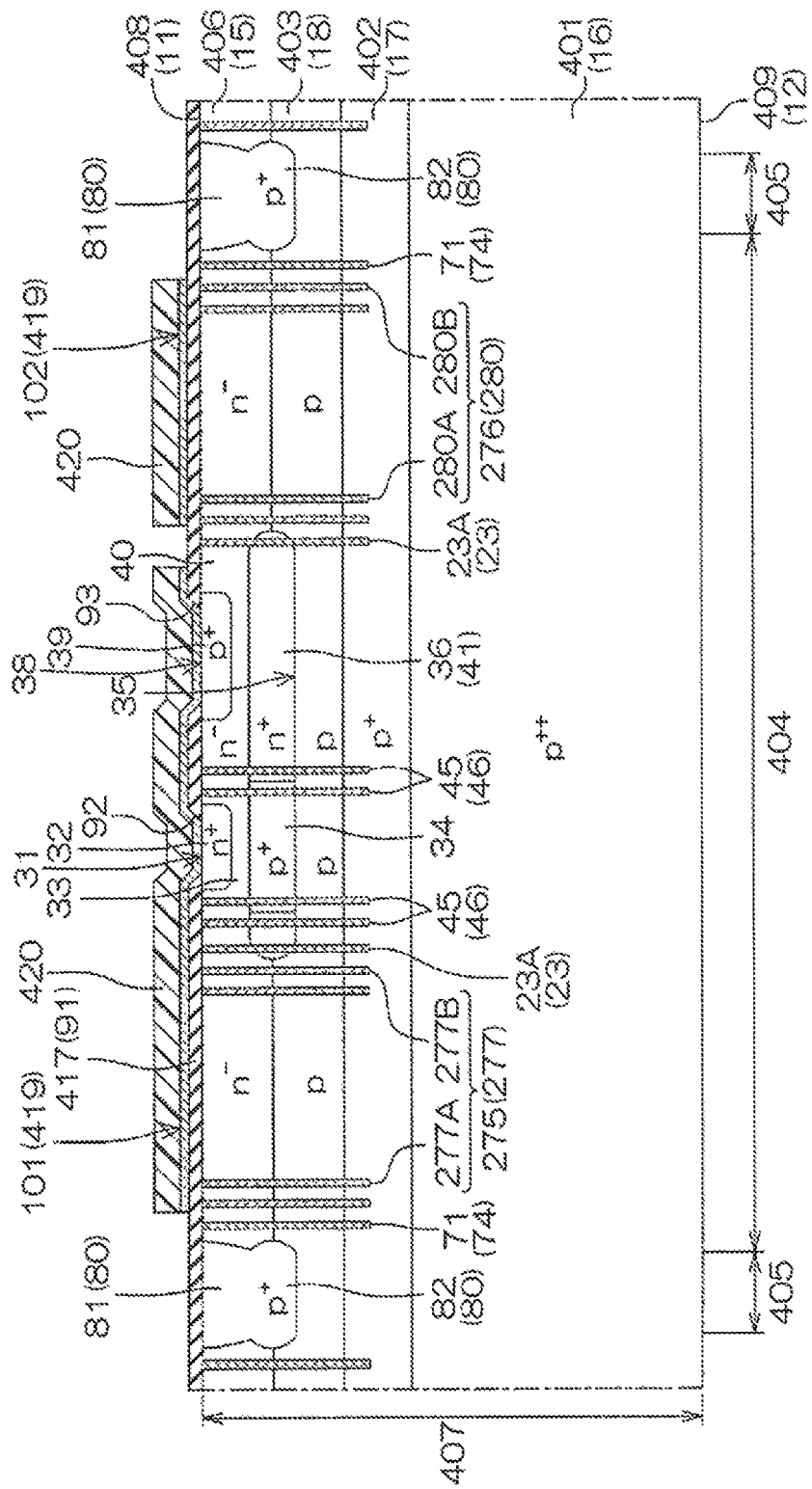
FIG. 28P is a cross-sectional diagram of a step after FIG. 28O.
Figure 28Q:
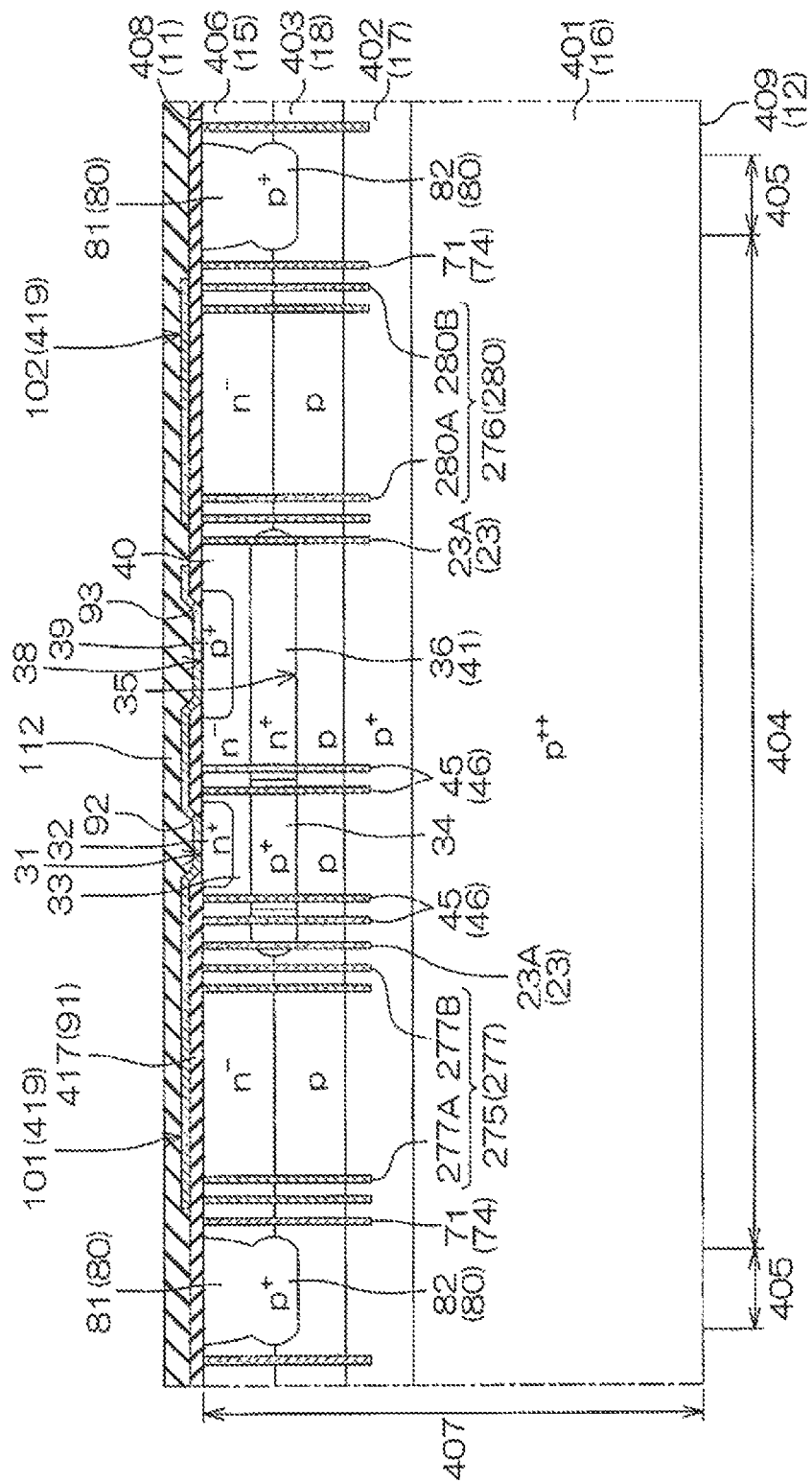
FIG. 28Q is a cross-sectional diagram of a step after FIG. 28P.
Figure 28R:
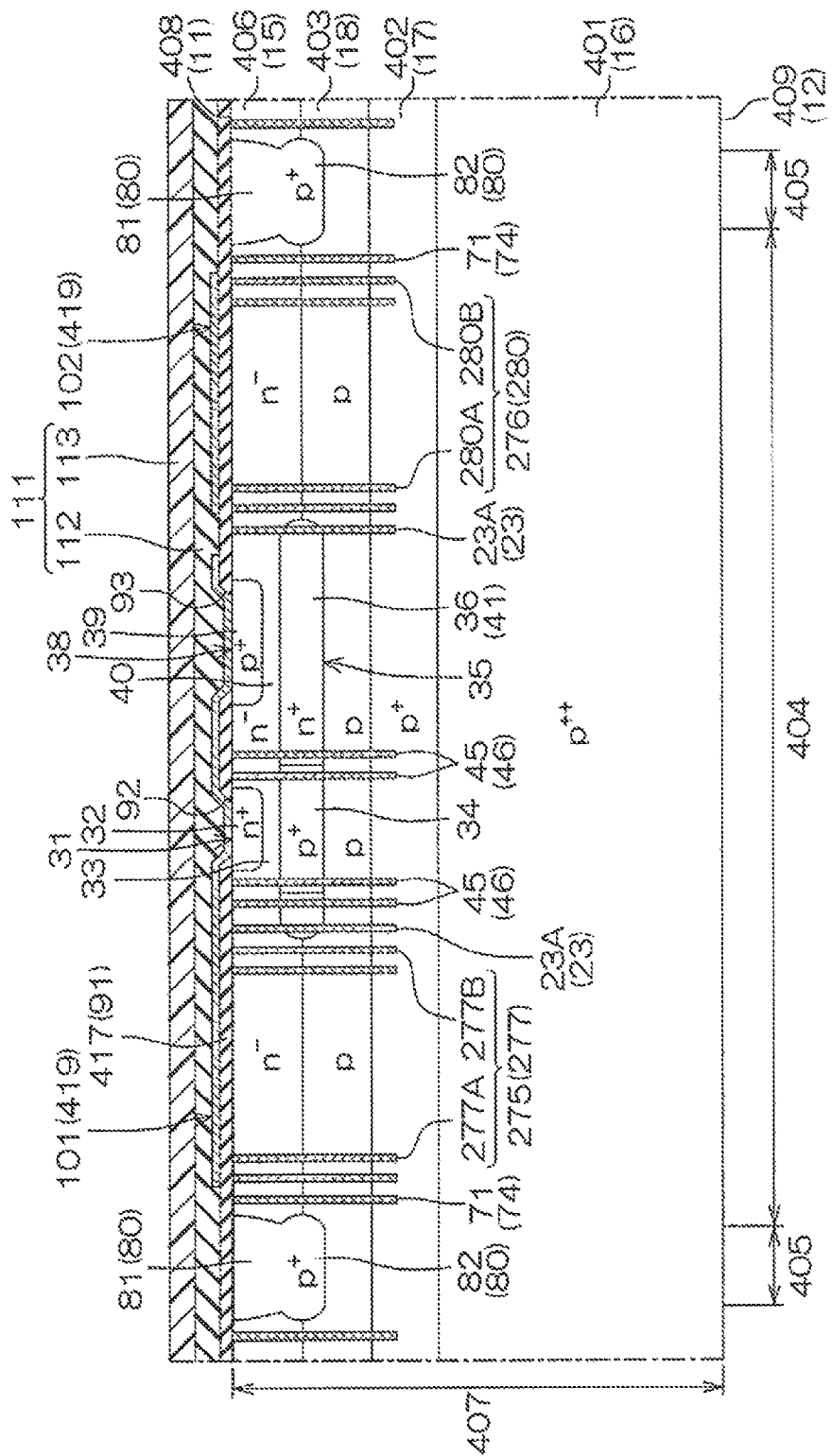
FIG. 28R is a cross-sectional diagram of a step after FIG. 28Q.
Figure 28S:
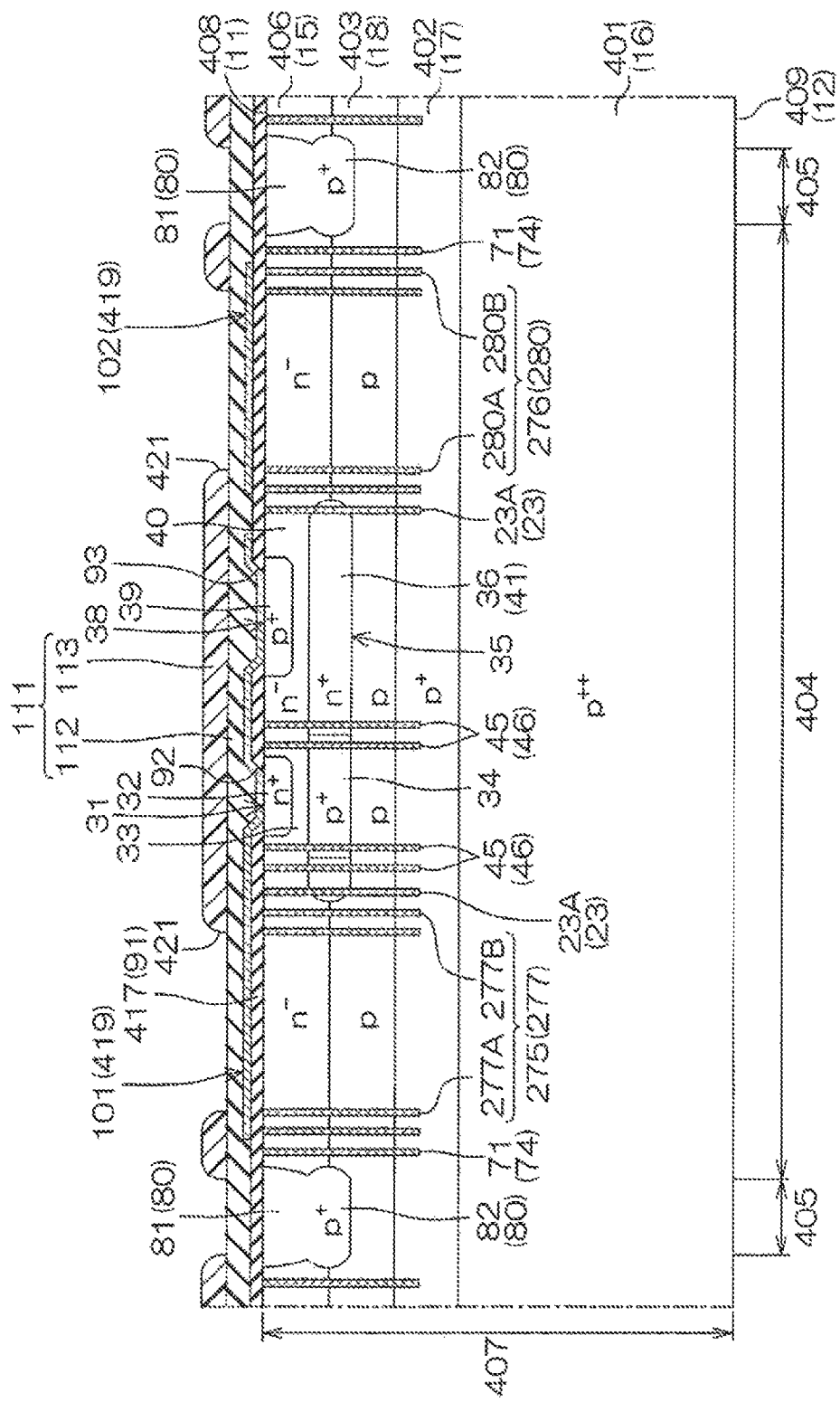
FIG. 28S is a cross-sectional diagram of a step after FIG. 28R.
Figure 28T:
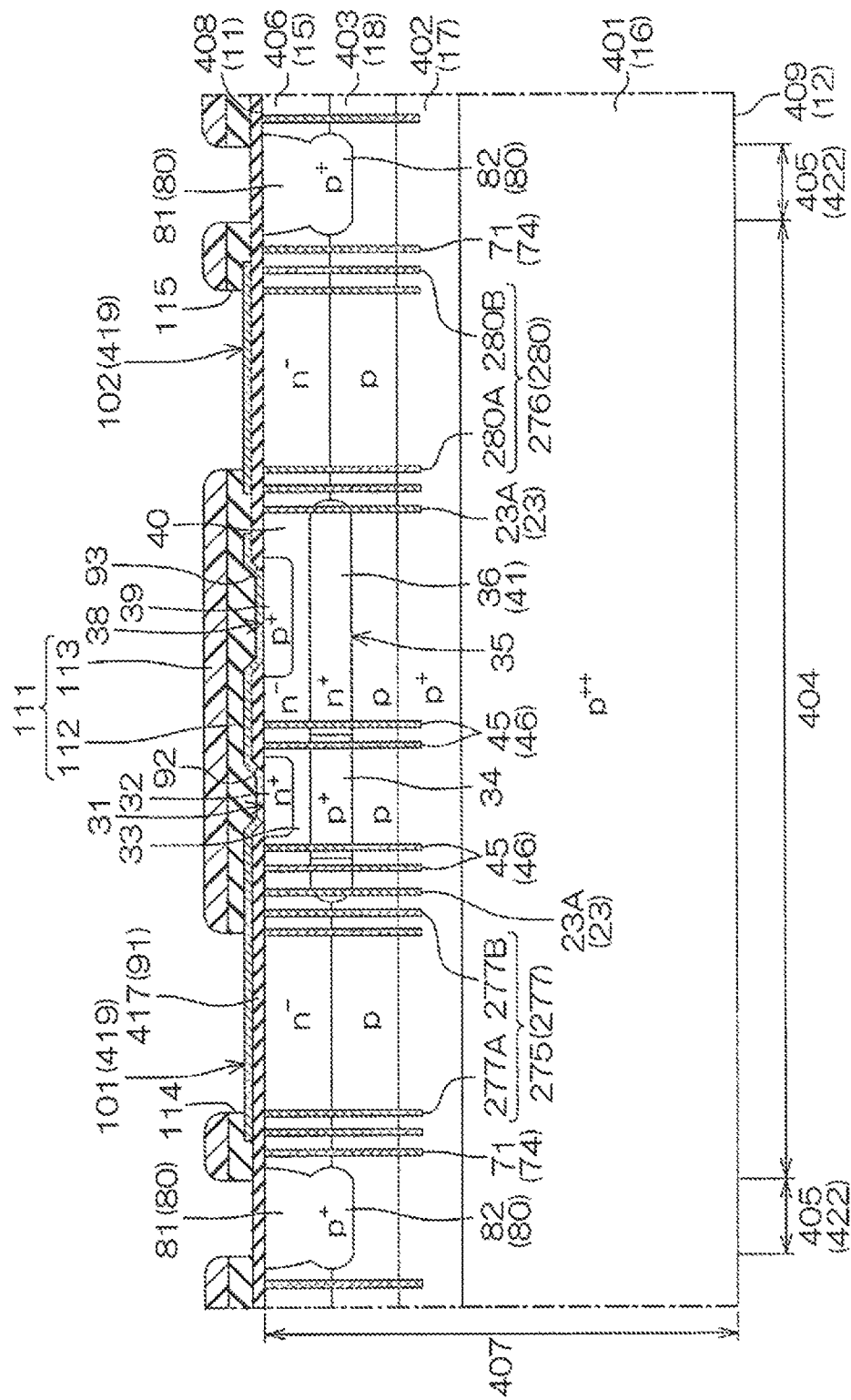
FIG. 28T is a cross-sectional diagram of a step after FIG. 28S.
Figure 28U:
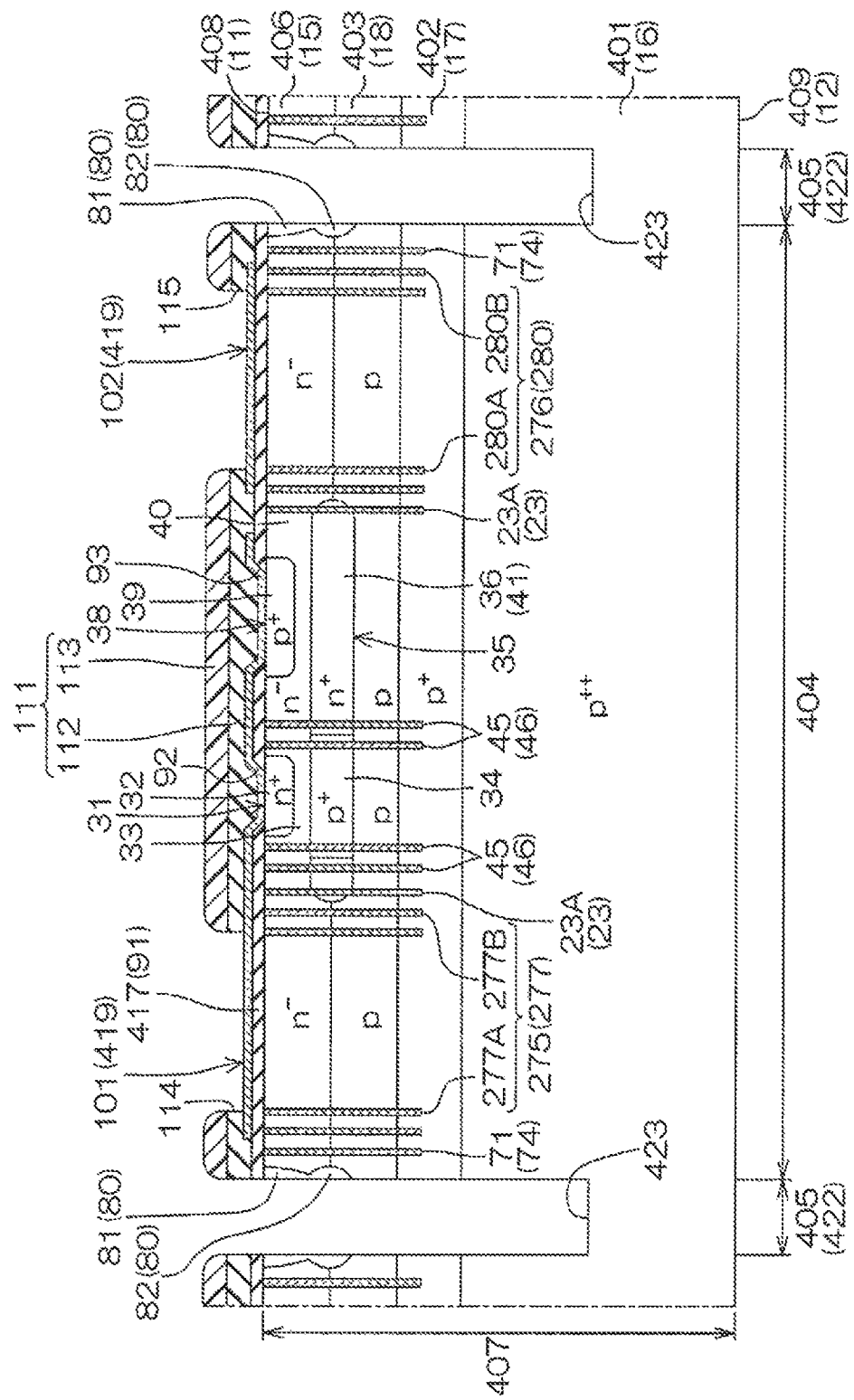
FIG. 28U is a cross-sectional diagram of a step after FIG. 28T.
Figure 28V:
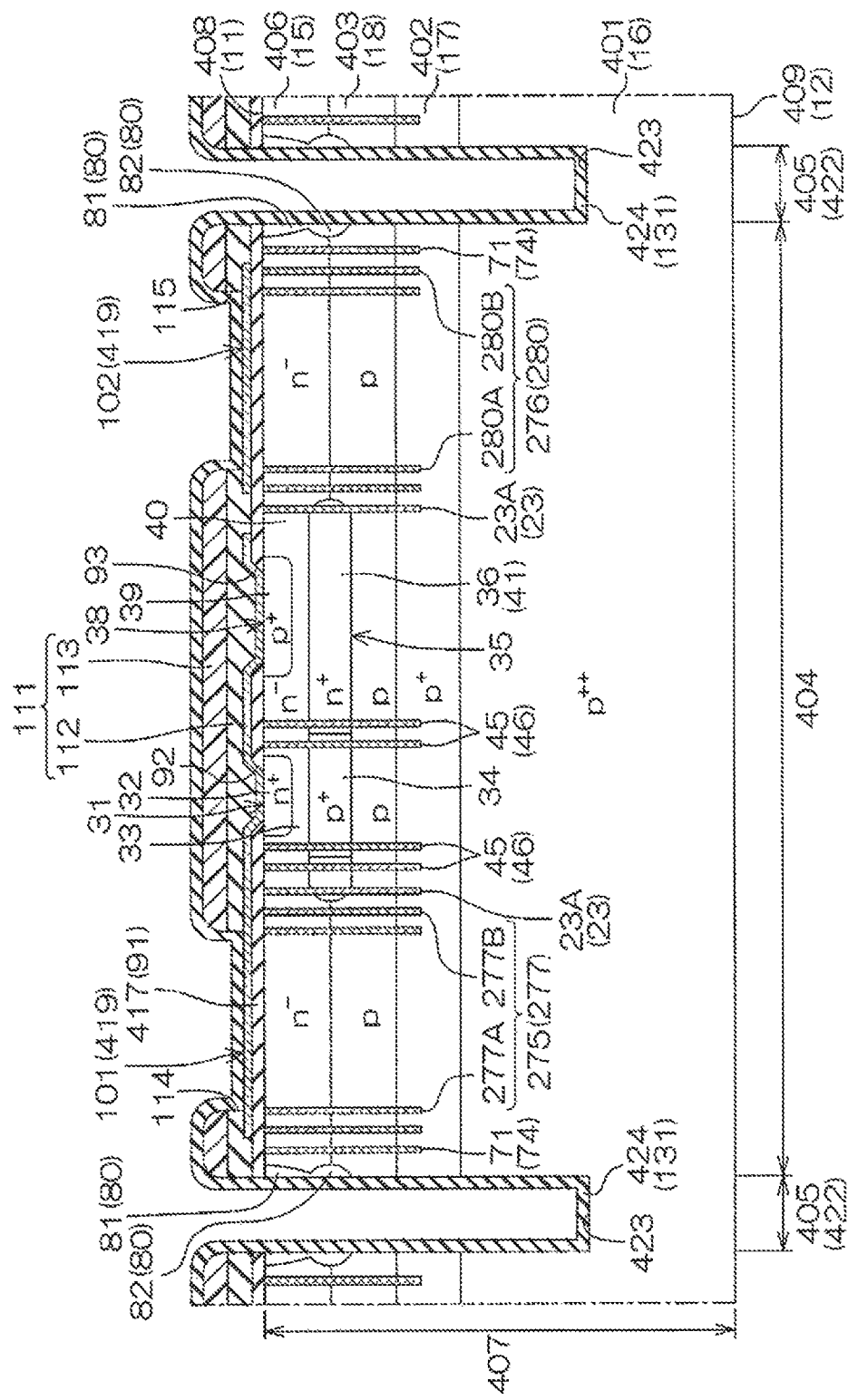
FIG. 28V is a cross-sectional diagram of a step after FIG. 28U.
Figure 28W:
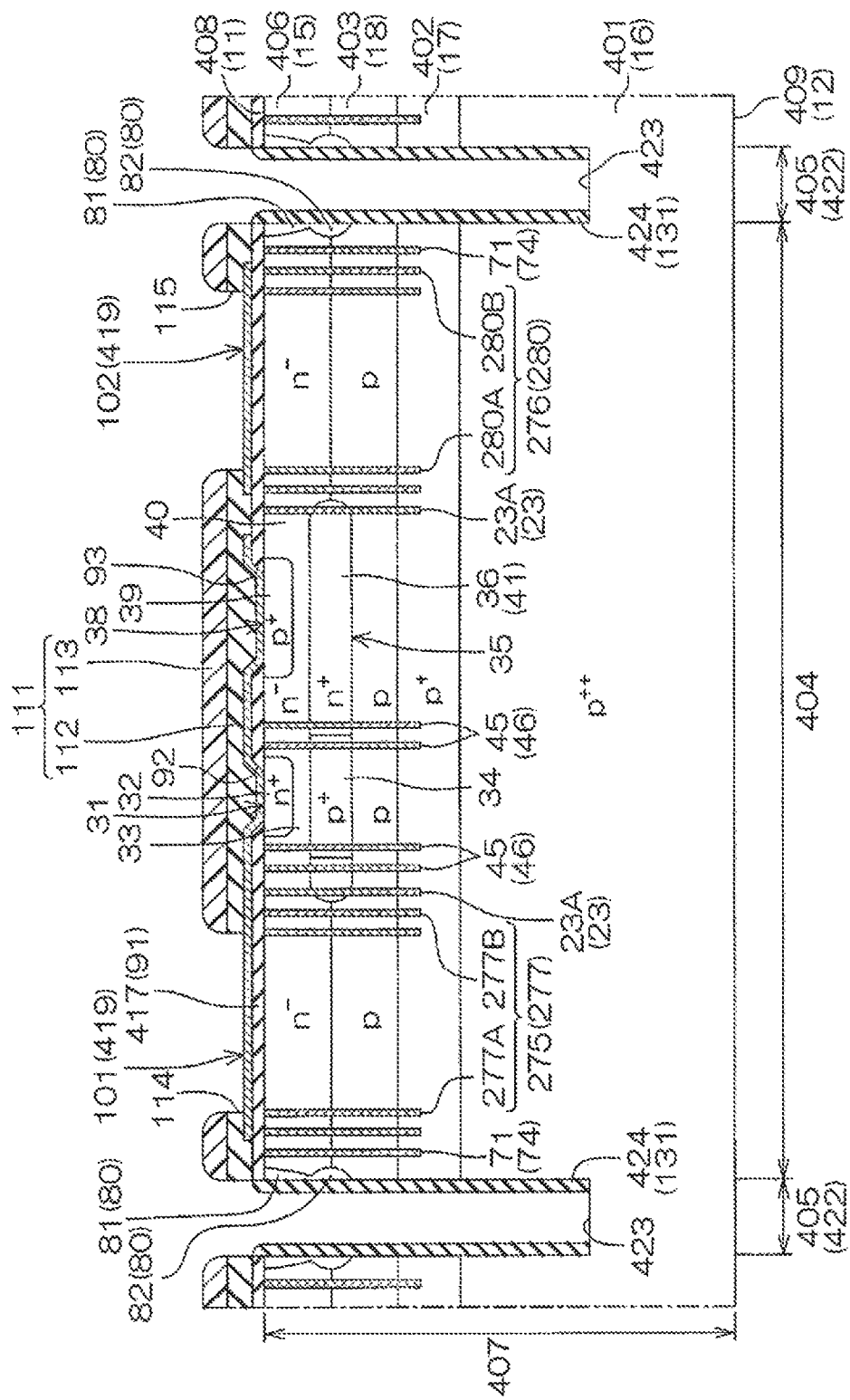
FIG. 28W is a cross-sectional diagram of a step after FIG. 28V.
Figure 28X:
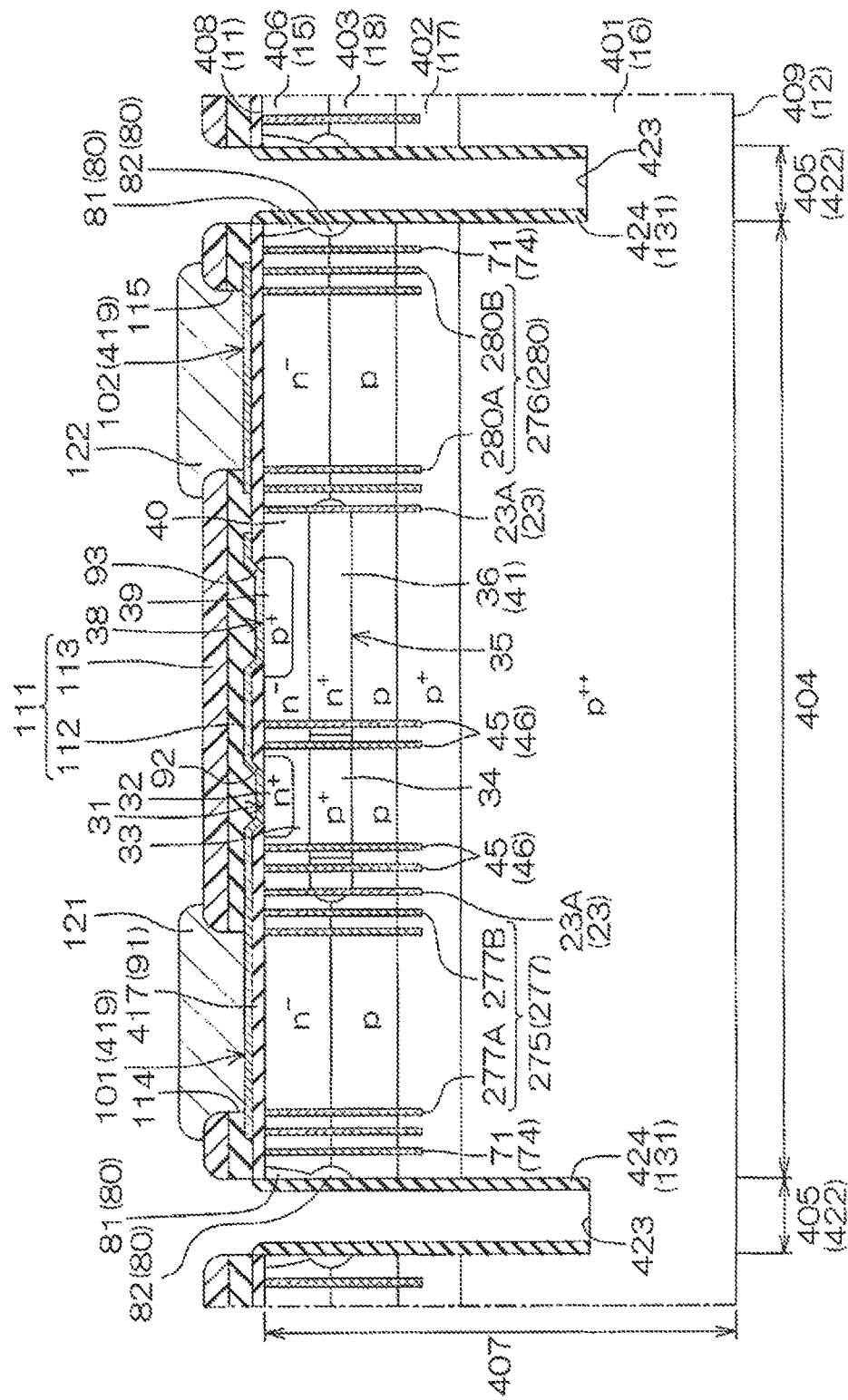
FIG. 28X is a cross-sectional diagram of a step after FIG. 28W.
Figure 28Y:
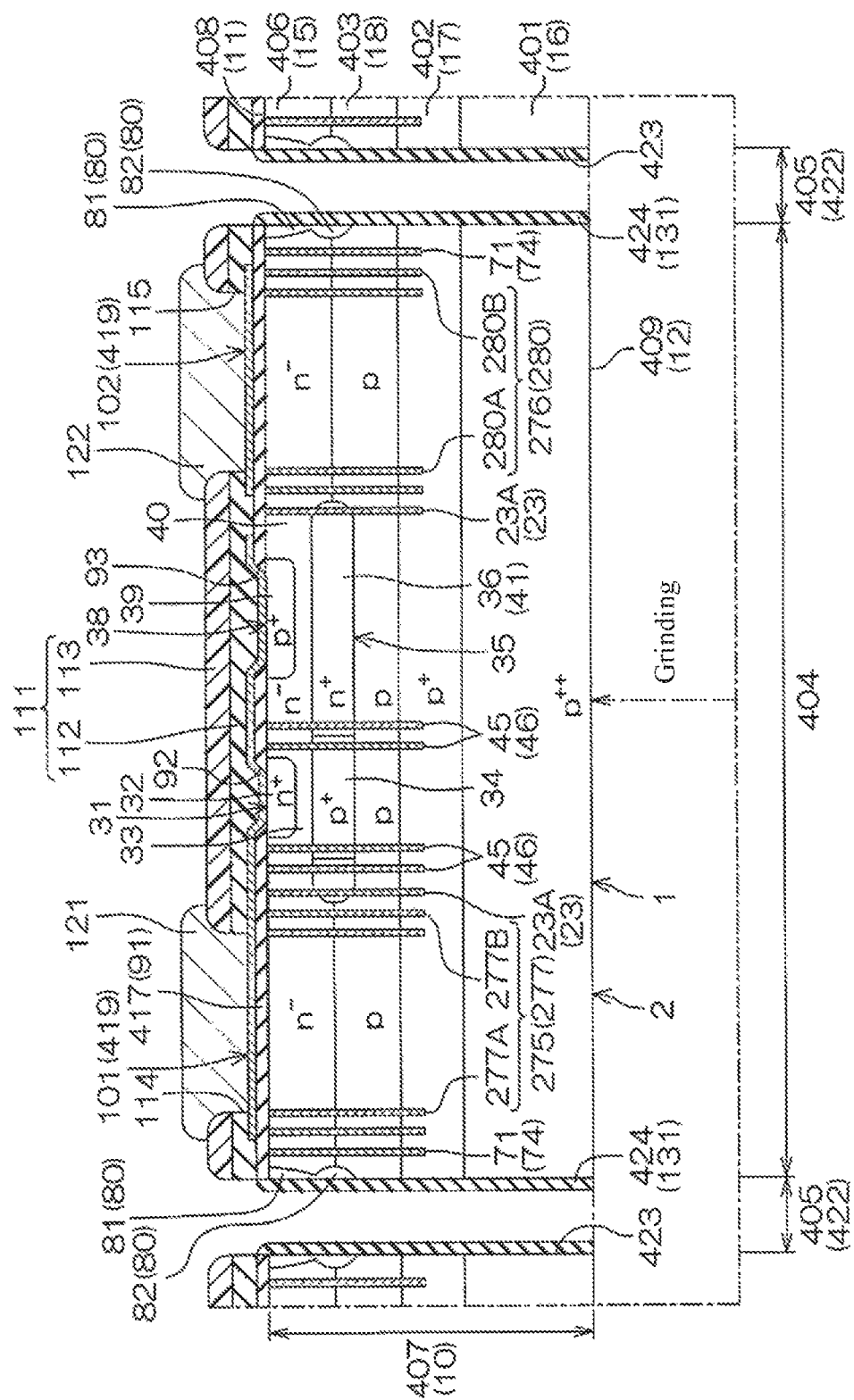
FIG. 28Y is a cross-sectional diagram of a step after FIG. 28X.

FIG. 28A to FIG. 28Y are cross-sectional diagrams for illustrating an example of a manufacturing method applied to the diode chips (with the denoting numerals omitted) of the first to seventh embodiments. In the description below, an example for manufacturing the diode chip 1 of the first embodiment is described.

First of all, referring to FIG. 28A, a $p^{++}$-type silicon semiconductor wafer 401 serving as the base of the semiconductor chip 10 (specifically, the high concentration layer 16) is prepared. The p-type impurity of the semiconductor wafer 401 may be boron.

Next, referring to FIG. 28B, silicon is crystallized and grown by epitaxial growth on the main surface of the semiconductor wafer 401. In this step, the p-type impurity diffuses from the semiconductor wafer 401 toward the silicon currently crystallizing and growing. Thus, a $p^+$-type first epitaxial layer 402 serving as the base of the concentration reducing layer 17 is formed on the semiconductor wafer 401.

Next, referring to FIG. 28C, the p-type impurity (for example, boron) is introduced into a surface layer portion of the first epitaxial layer 402. The p-type impurity may also be introduced to the surface layer portion of the first epitaxial layer 402 by ion implantation. Thus, the p-type impurity concentration at the surface layer portion of the first epitaxial layer 402 is increased.

Then, referring to FIG. 28D, silicon is crystallized and grown from the first epitaxial layer 402 by epitaxial growth. Thus, a second epitaxial layer 403 serving as the base of the concentration keeping layer 18 is formed on the first epitaxial layer 402. The conductivity type of the second epitaxial layer 403 may be n type or may be p type.

Next, a plurality of chip regions 404 individually corresponding to the diode chip 1, and a cutoff predetermined regions 40 for separating the plurality of chip regions 404 are set. In FIG. 28D, one chip region 404 is depicted (same for below). The plurality of chip regions 404 are set at intervals in the first direction X and the second direction Y, and are arranged in a matrix. The cutoff predetermined region 405 is shaped as a grid extending along the first direction X and the second direction Y, and is for separating the plurality of chip regions 404.

Next, an n-type impurity (for example, arsenic and/or phosphor) is selectively introduced into regions in the surface layer portion of the second epitaxial layer 403 of the chip regions 404, wherein these regions are for the first internal N layer 36 of the first pn junction portion 35 (the first reverse N layer 41 of the first reverse pin junction portion 38) and the second internal N layer 56 of the second pn junction portion 55 (the second reverse N layer 61 of the second reverse pin junction portion 58) to be formed therein. The n-type impurity may also be introduced into the surface layer portion of the second epitaxial layer 403 by ion implantation through an ion implantation mask (not shown).

Further, a p-type impurity (for example, boron) is selectively introduced to regions in the surface layer portions of the second epitaxial layer 403 of the chip regions 404, wherein these regions are for the first P layer 34 of the first pin junction portion 31 and the second P layer 54 of the second pin junction portion 51 to be formed therein. Further, the p-type impurity is selectively introduced to regions in the surface layer portions of the second epitaxial layer 403 of the chip regions 404, wherein these regions are for the lower region 82 of the outer impurity layer 80 to be formed therein. The p-type impurity used in the outer impurity layer 80 is introduced into the peripheral portion of each chip region 404 by crossing the cutoff predetermined region 404. The p-type impurity may also be introduced into the surface layer portion of the second epitaxial layer 403 by ion implantation through an ion implantation mask (not shown).

Next, referring to FIG. 28E, using driver-in processing, the p-type impurity introduced into the surface layer portion of the first epitaxial layer 402 as well as the p-type impurity and the n-type impurity introduced into the surface layer portion of the second epitaxial layer 403 are diffused. Thus, the p-type impurity introduced into the surface layer portion of the first epitaxial layer 402 is diffused into the second epitaxial layer 403, so as to form the concentration keeping layer 18.

The p-type impurity and n-type impurity introduced into the surface layer portion of the second epitaxial layer 403 become the base of the first P layer 34, the first internal N layer 36 (the first reverse N layer 41), the second P layer 54, the second internal N layer 56 (the second reverse N layer 61), and the lower region 82. The semiconductor wafer 401, the first epitaxial layer 402 and the second epitaxial layer 403 become the base of the first semiconductor layer 14. The second epitaxial layer 403 having a relatively high concentration may be formed directly by an epitaxial growth method accompanied with the introduction of a p-type impurity, and such is used in substitution for ion implantation and impurity diffusion to similarly obtain the concentration keeping layer 18.

Next, referring to FIG. 28F, silicon is crystallized and grown from the second epitaxial layer 403 by an epitaxial growth method accompanied with the introduction of an n-type impurity. In this step, the p-type impurity and n-type impurity diffuse from the second epitaxial layer 402 toward the silicon currently crystallizing and growing. Thus, a third epitaxial layer 406 serving as the base of the second semiconductor layer 15 is formed on the second epitaxial layer 403.

Further, the first internal N layer 35 (the first reverse N layer 41), the second internal N layer 56 (the second reverse N layer 61), the first P layer 34, the second P layer 54, and the lower region 82 are formed at the boundary between the second epitaxial layer 403 and the third epitaxial layer 406. Further, the first pn junction portion 35 and the second pn junction portion 55 are formed at the boundary between the second epitaxial layer 403 and the third epitaxial layer 406.

After the steps in FIG. 28A to FIG. 28F, a semiconductor wafer structure 407 including the semiconductor wafer 401, the first epitaxial layer 402, the second epitaxial layer 403 and the third epitaxial layer 406 is formed. The semiconductor wafer structure 407 has a first wafer main surface 408 on one side and a second wafer main surface 409 on the other side. The first wafer main surface 408 and the second wafer main surface 409 respectively correspond to the first main surface 11 and the second main surface 12 of the semiconductor chip 10.

Next, referring to FIG. 28G, an ion implantation mask 410 having a predetermined pattern is formed on the first wafer main surface 408. The ion implantation mask 410 exposes, in the chip regions 404 and the cutoff predetermined region 405, regions in which the upper region 81 of the outer impurity layer 80 is to be formed, and covers regions other than these regions.

Next, a p-type impurity (for example, boron) is introduced into a surface layer portion of the first wafer main surface 408 (the third epitaxial layer 406) through the ion implantation mask 410. Thus, the upper region 81 of the outer impurity layer 80 is formed at the surface layer portion of the first wafer main surface 408 in the chip regions 404 and the cutoff predetermined region 405.

Next, referring to FIG. 28H, a hard mask 411 having a predetermined pattern 411 is formed on the first wafer main surface 408. The hard mask 411 exposes, in the chip regions 404, regions in which a plurality of trenches 412 are to be formed, and covers regions other than these regions. The plurality of trenches 412 include the region separation trench 24, the first junction separation trench 46, the second junction separation trench 66, the shielding trench 74, the first pad separation trench 277 and the second pad separation trench 280.

The hard mask 410 may be formed by chemical vapor deposition (CVD) or oxidation processing (for example, thermal oxidation processing). Patterning corresponding to the hard mask 411 may be performed by etching through an etching mask. The etching may be wet etching and/or dry etching.

Next, useless parts of the first wafer surface 408 are removed by etching through the hard mask 411. The etching may be wet etching and/or dry etching. The etching is preferably reactive ion etching (RIE), as an example of dry etching. Thus, the plurality of trenches 412 are formed on the first wafer main surface 408. Then, the hard mask 111 is removed.

Next, referring to FIG. 28, a first base insulation layer 413 is formed on the first wafer main surface 408. The first base insulation layer 413 becomes the base of the region separation insulation layer 25, the first junction separation insulation layer 47, the second junction separation insulation layer 67, the shielding insulation layer 75, the first pad separation insulation layer 278 and the second pad separation insulation layer 281.

The first base insulation layer 413 is shaped as a film along the first wafer main surface 408 and the inner walls of the plurality of trenches 412. The first base insulation layer 413 may be formed by CVD or oxidation processing (for example, thermal oxidation processing). In this embodiment, the first base insulation layer 413 is formed by thermal oxidation processing.

Next, a polysilicon layer 414 is formed on the first base insulation layer 413. The polysilicon 414 becomes the base of the polysilicon 26 of the region separation structure 23, the polysilicon 48 of the first junction separation structure 45, the polysilicon 68 of the second junction separation structure 65, the polysilicon 76 of the shielding structure 71, the polysilicon 279 of the first pad separation structure 275, and the polysilicon 282 of the second pad separation structure 276. The polysilicon layer 414 fills the plurality of trenches 412 with the first base insulation layer 413 interposed in between, and covers the first wafer main surface 408. The polysilicon layer 414 may be formed by CVD.

Next, referring to FIG. 28J, useless parts of the polysilicon layer 414 are removed by etching. The etching may be wet etching and/or dry etching. The polysilicon layer 414 is removed till the first base insulation layer 413 is exposed.

Next, useless parts of the first base insulation layer 413 are removed by etching. The etching may be wet etching and/or dry etching. The first base insulation layer 413 is removed till the first wafer main surface 408 is exposed. Portions of the first base insulation layer 413 covering the first wafer main surface 408 may also be used as a portion of the inter-insulation layer 91 and are thus preserved. Thus, the region separation structure 23, the first junction separation structure 45, the second junction separation structure 65, the shielding structure 71, the first pad separation structure 275 and the second pad separation structure 276 are formed in each of the chip regions 404.

Then, referring to FIG. 28K, an ion implantation mask 415 having a predetermined pattern is formed on the first wafer main surface 408. The ion implantation mask 415 exposes, in the chip regions 404, regions in which the first N layer 32 of the first pin junction portion 31 and the second N layer 52 of the second pin junction portion 51 are to be formed, and covers regions other than these regions.

Next, an n-type impurity (for example, boron) is introduced into the surface layer portion of the first wafer main surface 408 (the third epitaxial layer 406) through the ion implantation mask 415. Thus, the first N layer 32 and the second N layer 52 form the surface layer portion of the first wafer main surface 408 in the chip regions 404. Further, in the chip regions 404, the first pin junction portion 31 including the first N layer 32, the first I layer 33 and the first P layer 34, and the second pin junction portion 51 including the second N layer 52, the second I layer 53 and the second P layer 54 are formed at the surface layer portion of the first wafer main surface 408 (the third epitaxial layer 406). Then, the ion implantation mask 415 is removed.

Next, referring to FIG. 28L, an ion implantation mask 416 having a predetermined mask is formed on the first wafer main surface 408. The ion implantation mask 416 exposes, in the chip regions 404, regions in which the first reverse P layer 39 of the first reverse pin junction portion 38 and the second reverse P layer 59 of the second reverse pin junction 58 are to be formed, and covers regions other than these regions.

Next, a p-type impurity (for example, boron) is introduced into a surface layer portion of the first wafer main surface 408 (the third epitaxial layer 406) through the ion implantation mask 416. Thus, in the chip regions 404, the first reverse P layer 39 and the second reverse P layer 59 are formed at the surface layer portion of the first wafer main surface 408. Further, in the chip regions 404, the first reverse pin junction portion 38 including the first reverse P layer 39, the first reverse I layer 40 and the first reverse N layer 41, and the second reverse pin junction portion 58 including the second reverse P layer 59, the second reverse I layer 60 and the second reverse N layer 61 are formed at the surface layer portion of the first wafer main surface 408 (the third epitaxial layer 406). Then, the ion implantation mask 416 is removed. The step of FIG. 28L may also be performed before the step of FIG. 28K.

Next, referring to FIG. 28M, a second base insulation layer 417 serving as the base of the inter-insulation layer 91 is formed on the first wafer main surface 408. In this embodiment, the second base insulation layer 417 has an ONO laminated structure including a first silicon oxide layer, a silicon nitride layer and a second silicon oxide layer sequentially laminated from the side of the first wafer main surface 408. The first silicon oxide layer may be formed by CVD or oxidation processing (for example, thermal oxidation processing). The silicon nitride layer and the second silicon oxide layer may be individually formed by CVD.

Next, referring to FIG. 28N, a resist mask 418 having a predetermined pattern is formed on the second base insulation layer 417. The resist mask 418 exposes, in the second base insulation layer 417 in the chip regions 404, regions in which first pin opening 92, the first reverse pin opening 93, the second pin opening 94 and the second reverse pin opening 95 are to be formed, and covers regions other than these regions.

Next, useless parts of the second base insulation layer 417 are removed by etching through the resist mask 418. The etching may be wet etching and/or dry etching. Thus, the first pin opening 92, the first reverse pin opening 93, the second pin opening 94 and the second reverse pin opening 95 are formed at the second base insulation layer 417 in the chip regions 404. Then, the resist mask 418 is removed.

Next, referring to FIG. 28O, a base electrode layer 419 serving as the base of the first electrode layer 101 and the second electrode layer 102 is formed on the second base insulation layer 417. The base electrode layer 419 may include at least one of a pure copper layer (a copper layer having a purity of equal to or more than 99%), a pure aluminum layer (an aluminum layer having a purity of equal to or more than 99%), an aluminum silicon alloy layer, an aluminum copper alloy layer, and an aluminum silicon copper alloy layer. The base electrode layer 419 may be formed by sputtering and/or evaporation.

Next, referring to FIG. 28P, a resist mask 420 having a predetermined pattern is formed on the substrate electrode layer 419. The resist mask 420 exposes, in the substrate electrode layer 419 in the chip regions 404, regions in which the first electrode 101 and the second electrode 102 are to be formed, and covers regions other than these regions.

Next, by etching through the resist mask 420, useless parts of the base electrode layer 419 are removed. The etching may be wet etching and/or dry etching. Thus, the first electrode layer 101 and the second electrode layer 102 are formed in the chip regions 404. Then, the resist mask 420 is removed.

Next, referring to FIG. 28Q, the passivation layer 112 is formed on the second base insulation layer 417. The passivation layer 112 covers the first electrode layer 101 and the second electrode layer 102 on the second base insulation layer 417. In this embodiment, the passivation layer 112 includes silicon nitride. The passivation layer 112 may be formed by CVD.

Next, referring to FIG. 28R, the resin layer 113 is formed on the passivation layer 112. The resin layer 113 is formed by applying a photosensitive resin (polyimide in this embodiment) on the passivation layer 112. Thus, the uppermost insulation layer 111 including the passivation layer 112 and the resin layer 113 is formed.

Next, referring to FIG. 28S, in the resin layer 113, patterns corresponding to the first pad opening 114, the second pad opening 115 and the cutoff predetermined region 405 are exposed and developed. Thus, a plurality of openings 421 having patterns corresponding to the first pad opening 114, the second pad opening 115 and the cutoff predetermined region 405 are formed on the resin layer 113.

Next, referring to FIG. 28T, parts of the passivation layer 112 exposed from the openings 421 of the resin layer 113 are removed by etching using the resin layer 113 as a mask. The etching may be wet etching and/or dry etching. Thus, the first pad opening 114, the second pad opening 115 and cutting channels 422 are formed at the uppermost insulation layer 111. The cutting channels 422 are shaped as a grid along the cutoff predetermined region 405.

Next, referring to FIG. 28U, parts of the second base insulation layer 417 exposed from the cutting channels 422 are removed by etching. The etching may be wet etching and/or dry etching. Thus, parts of the second base insulation layer 417 covering the chip regions 404 are used as the inter-insulation layer 91 and are cut.

Next, parts of the first wafer main surface 408 exposed from the cutting channels 422 are removed by etching. The etching may be wet etching and/or dry etching. The etching is preferably RIE, as an example of dry etching. The etching is more preferably a Bosch process. Thus, cutting trenches 423 separating the plurality of chip regions 404 are formed on the first wafer main surface 408.

The cutting trenches 423 penetrate the third epitaxial layer 406, the second epitaxial layer 403 and the first epitaxial layer 402 till reaching a halfway portion the semiconductor wafer 401 (specifically, the high concentration layer 16) in the thickness direction. Thus, the first epitaxial layer 402 becomes the concentration reducing layer 17, the second epitaxial layer 403 becomes the concentration keeping layer 18, and the third epitaxial layer 406 becomes the second semiconductor layer 15.

Next, referring to FIG. 28V, a third base insulation layer 424 serving as the base of the side surface insulation layer 131 is formed on the first wafer main surface 408. The third base insulation layer 424 is shaped as a film along the inner walls of the cutting trenches 423, and altogether covers structural objects on the side of the first wafer main surface 408. In this embodiment, the third base insulation layer 424 includes silicon oxide. The third base insulation layer 424 may be formed by CVD.

Next, referring to FIG. 28W, useless parts of the third base insulation layer 424 are removed by etching. The etching may be wet etching and/or dry etching. The etching is preferably RIE, as an example of dry etching. Thus, portions of the third base insulation layer 424, other than the portions covering the side surfaces of the cutting trenches 423, are removed.

Next, referring to FIG. 28X, the first terminal electrode 121 and the second terminal electrode 122 are formed in each of the chip regions 404. In this embodiment, each of the first terminal electrode 121 and the second terminal electrode 122 has a laminated structure including a nickel layer, a palladium layer and a gold layer sequentially laminated from the side of the first wafer main surface 408. The nickel layer, the palladium layer and the gold layer may be individually formed by electrolytic plating and/or electroless plating.

Next, referring to FIG. 28Y, the second wafer main surface 409 is ground till being in communication with the cutting trenches 423. Thus, the semiconductor wafer structure 407 becomes the semiconductor chip 10, and a plurality of diode chips 1 may be cut from one piece of semiconductor wafer structure 407. The step of grinding the second wafer main surface 409 may also be performed continuously after the second wafer main surface 409 has become in communication with the cutting trenches 423. That is to say, the step of grinding the second wafer main surface 409 may also include a step of thinning the semiconductor chip 10 (the high concentration layer 16). The diode chip 1 is manufactured by the steps described above.

Other implementation methods may also be performed on the basis of the embodiments of the present invention.

In the implementation methods, the configurations of the first pin junction portion 31 and the first reverse pin junction portion 38 may be swapped, and the configurations of the second pin junction portion 51 and the second reverse pin junction portion 58 may be swapped.

In the implementation methods, a structure in which the conductivity types of semiconductor portions are reversed may also be used. That is to say, a p-type portion may be formed as an n-type portion, and an n-type portion may be formed as a p-type portion. In this case, the polarity directions of the first pin diode D1, the first Zener diode DZ1, the first reverse pin diode DR1, the second pin diode D2, the second Zener diode DZ2 and the second reverse pin diode DR2 become opposite directions.

In the implementation methods, a structure without the shielding structure 71 may be used. Further, in the implementation methods, a structure without the outer impurity layer 80 may be used. Further, in the implementation methods, a structure without the side surface insulation layer 131 may be used. In this case, the side surfaces 13A to 13D of the semiconductor chip 10 respectively form portions of the chip side surfaces 5A to 5D of the chip body 2.

In the implementation methods, the first semiconductor layer 14 (the semiconductor chip 10) without the concentration keeping layer 18 may be formed, and the first internal N layer 36 (the second internal N layer 56) forming a pn junction between the first semiconductor layer 14 and the concentration reducing layer 17 may be used. In this case, it should be particularly noted that, it is possible that the actual withstand voltage (specifically, the breakdown voltage VB) starts to change from the target withstand voltage.

The description of the present application is not limited to any combination configuration of the features shown by the first to eleventh embodiments. The first to eleventh embodiments may be combined into any configuration and any implementation form. That is to say, a diode chip in any configuration and any implementation form combining the features shown in the first to eleventh embodiments may be used.

Details of the embodiments of the present invention are described as above. However, these embodiments are specific examples for better understand the technical contents of the present invention, and are not to be interpreted as limitations to the present invention. The scope of the present invention is to be defined by the appended claims.

What is claimed is:

1. A semiconductor apparatus, comprising:
    a semiconductor chip, comprising a first conductive-type first semiconductor layer, and a second conductive-type second semiconductor layer formed on the first semiconductor layer;
    a separation trench, formed on the semiconductor chip in a manner of penetrating the second semiconductor layer till reaching the first semiconductor layer, and forming an internal parasitic capacitance between the first semiconductor layer and the second semiconductor layer by separating a portion of the semiconductor chip from other regions;
    an inter-insulation layer, covering the second semiconductor layer;
    an electrode, being opposite to a region separated by the separation trench with the inter-insulation layer interposed in between, and forming, between the electrode and the semiconductor chip, an external parasitic capacitance connected in series to the internal parasitic capacitance; and
    an internal capacitance layer, formed at a boundary between the first semiconductor layer and the second semiconductor layer and in the region separated by the separation trench, and comprising a first-conductive type impurity concentration more than a second conductive-type impurity concentration of the second semiconductor layer to form the internal parasitic capacitance.

2. The semiconductor apparatus according to claim 1, wherein the separation trench surrounds a portion of the semiconductor chip in top view.

3. The semiconductor apparatus according to claim 1, wherein the region of the semiconductor chip separated by the separation trench is exclusive to a series circuit comprising the internal parasitic capacitance and the external parasitic capacitance.

4. The semiconductor apparatus according to claim 1, further comprising a separation insulation layer formed in the separation trench.

5. The semiconductor apparatus according to claim 4, further comprising:
a polysilicon, embedded in the separation trench with the separation insulation layer interposed in between.

6. The semiconductor apparatus according to claim 1, further comprising:
a first conductive-type capacitance layer, formed at a surface layer portion of the second semiconductor layer and in the region separated by the separation trench, and forming, between the first conductive-type capacitance layer and the second semiconductor layer, a surface layer parasitic capacitance connected in series to the internal parasitic capacitance;
wherein the external parasitic capacitance is connected in series to the surface layer parasitic capacitance.

7. The semiconductor apparatus according to claim 1, wherein the internal capacitance layer comprises, at the boundary between the first semiconductor layer and the second semiconductor layer, the first conductive-type impurity concentration more than a first conductive-type impurity concentration of a surface layer portion of the first semiconductor layer.

8. The semiconductor apparatus according to claim 1, wherein the semiconductor chip comprises an apparatus region and a pad region outside the apparatus region, and the separation trench separates a portion of the pad region from other regions.

9. The semiconductor apparatus according to claim 8, wherein the electrode comprises:
a pad portion, being opposite to the region separated by the separation trench with the inter-insulation layer interposed in between, and forming the external parasitic capacitance; and
a wiring portion, led out from the pad portion toward the apparatus region, and electrically connected to the apparatus region.

10. The semiconductor apparatus according to claim 8, further comprising:
a region separation structure, separating the apparatus region from other regions.

11. The semiconductor apparatus according to claim 10, wherein the region separation structure comprises:
a region separation trench, formed on the semiconductor chip in a manner of penetrating the second semiconductor layer till reaching the first semiconductor layer.

12. The semiconductor apparatus according to claim 11, wherein the region separation trench is formed by having a depth equal to that of the separation trench.

13. The semiconductor apparatus according to claim 11, further comprising:
a region separation insulation layer, formed in the region separation trench.

14. The semiconductor apparatus according to claim 13, further comprising:
a region separation polysilicon embedded in the region separation trench with the region separation insulation layer interposed in between.

15. The semiconductor apparatus according to claim 8, further comprising:
a diode, formed in the apparatus region.

16. The semiconductor apparatus according to claim 1, wherein the inter-insulation layer comprises:

an ONO structure, comprising a silicon oxide layer, a silicon nitride layer and a silicon oxide layer sequentially laminated from a side of the semiconductor chip.

17. A semiconductor apparatus, comprising:
a semiconductor chip, comprising a first conductive-type first semiconductor layer, and a second conductive-type second semiconductor layer formed on the first semiconductor layer, and comprising a first pad region and a second pad region separated from each other;
a first pad separation trench, formed in the first pad region in a manner of penetrating the second semiconductor layer till reaching the first semiconductor layer, and forming a first internal parasitic capacitance between the first semiconductor layer and the second semiconductor layer by separating a portion of the first pad region from other regions;
a second pad separation trench, formed in the second pad region in a manner of penetrating the second semiconductor layer till reaching the first semiconductor layer, and forming a second internal parasitic capacitance between the first semiconductor layer and the second semiconductor layer by separating a portion of the second pad region from other regions;
an inter-insulation layer, covering the second semiconductor layer;
a first electrode, comprising a first pad portion, the first pad portion being opposite to a region separated by the first pad separation trench with the inter-insulation layer interposed in between, and the first pad portion forming, between the first pad portion and the semiconductor chip, a first external parasitic capacitance connected in series to the first internal parasitic capacitance;
a second electrode, comprising a second pad portion, the second pad portion being opposite to the region separated by the second pad separation trench with the inter-insulation layer interposed in between, and the second pad portion forming, between the second pad portion and the semiconductor chip, a second external parasitic capacitance connected in series to the second internal parasitic capacitance;
a first terminal electrode, electrically connected to the first pad portion;
a second terminal electrode, electrically connected to the second pad portion; and
an uppermost insulation layer covering the inter-insulation layer, wherein the first terminal electrode penetrates the uppermost insulation layer to connect to the first pad portion, and the second terminal electrode penetrates the uppermost insulation layer to connect to the second pad portion.

18. The semiconductor apparatus according to claim 17, wherein the second internal parasitic capacitance is connected in series to the first internal parasitic capacitance via the first semiconductor layer.

19. The semiconductor apparatus according to claim 17, wherein the semiconductor chip comprises an apparatus region between the first pad region and the second pad region.

20. The semiconductor apparatus according to claim 19, wherein the first electrode comprises:
a first wiring portion, led out from the first pad portion toward the apparatus region, and electrically connected to the apparatus region;
the second electrode comprises:

a second wiring portion, led out from the second pad portion toward the apparatus region, and electrically connected to the apparatus region.

21. The semiconductor apparatus according to claim 20, wherein the second wiring portion extends in an extension direction of the first wiring portion in top view, and is opposite to the first wiring portion in a direction orthogonal to the extension direction of the first wiring portion.

22. The semiconductor apparatus according to claim 1, comprising a chip scale package.

* * * * *